(12) United States Patent
Choi et al.

(10) Patent No.: US 12,538,703 B2
(45) Date of Patent: Jan. 27, 2026

(54) ORGANIC ELECTROLUMINESCENCE DEVICE AND ELECTRONIC APPARATUS INCLUDING THE SAME

(71) Applicant: Samsung Display Co., Ltd., Yongin-si (KR)

(72) Inventors: Hyewon Choi, Suwon-si (KR); Sungwook Kim, Hwaseong-si (KR); SeulOng Kim, Hwaseong-si (KR); Tsuyoshi Naijo, Suwon-si (KR); Hyein Jeong, Suwon-si (KR); JungMin Kang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 660 days.

(21) Appl. No.: 16/738,886

(22) Filed: Jan. 9, 2020

(65) Prior Publication Data
US 2020/0251663 A1    Aug. 6, 2020

(30) Foreign Application Priority Data

Feb. 1, 2019   (KR) .......................... 10-2019-0013316

(51) Int. Cl.
*H10K 85/60*   (2023.01)
*H10K 50/11*   (2023.01)
(Continued)

(52) U.S. Cl.
CPC ....... *H10K 85/6565* (2023.02); *H10K 85/322* (2023.02); *H10K 85/40* (2023.02);
(Continued)

(58) Field of Classification Search
None
See application file for complete search history.

(56) References Cited

U.S. PATENT DOCUMENTS

2007/0252522 A1*  11/2007  Kondakov ..................... 313/506
2010/0295026 A1*  11/2010  Tsuji ............................... 257/40
(Continued)

FOREIGN PATENT DOCUMENTS

JP       2016-185914 A      10/2016
KR  10-2016-0006629 A      1/2016
(Continued)

OTHER PUBLICATIONS

Masaki Numata et al. "High efficiency pure blue thermally activated delayed fluorescence molecules having 10H-phenoxaborin and acridan units", Chem. Commun. 2015, vo. 51, p. 9443-9446 (Year: 2015).*
(Continued)

*Primary Examiner* — Seokmin Jeon
(74) *Attorney, Agent, or Firm* — Womble Bond Dickinson (US) LLP

(57) ABSTRACT

Provided is an organic electroluminescence device including an emission layer between a first electrode and a second electrode, wherein the emission layer includes a first host represented by Formula 1, a second host which is different from the first host, a first dopant which is a thermally activated delayed fluorescence material having an electron donor and an electron acceptor, and a second dopant represented by Formula 2.

(Continued)

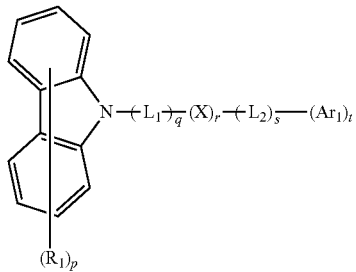

Formula 1

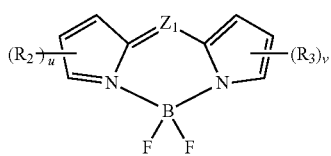

Formula 2

4 Claims, 4 Drawing Sheets

(51) Int. Cl.
| H10K 50/12 | (2023.01) |
| H10K 85/30 | (2023.01) |
| H10K 85/40 | (2023.01) |
| H10K 101/00 | (2023.01) |
| H10K 101/20 | (2023.01) |

(52) U.S. Cl.
CPC ......... *H10K 85/622* (2023.02); *H10K 85/626* (2023.02); *H10K 85/654* (2023.02); *H10K 85/656* (2023.02); *H10K 85/6572* (2023.02); *H10K 85/6574* (2023.02); *H10K 85/6576* (2023.02); *H10K 50/11* (2023.02); *H10K 50/12* (2023.02); *H10K 50/121* (2023.02); *H10K 2101/20* (2023.02); *H10K 2101/90* (2023.02)

(56) References Cited

U.S. PATENT DOCUMENTS

| 2016/0072078 A1* | 3/2016 | Lee | H01L 51/0072 |
| 2016/0087224 A1* | 3/2016 | Kim | H01L 51/0072 |
| 2016/0087227 A1* | 3/2016 | Kim | H01L 51/0094 |
| 2016/0190469 A1† | 6/2016 | Ogiwara | |
| 2016/0190478 A1 | 6/2016 | Nakanotani et al. | |
| 2017/0117486 A1* | 4/2017 | Cho | H01L 51/0072 |
| 2018/0053901 A1 | 2/2018 | Yoshida et al. | |
| 2018/0248127 A1 | 8/2018 | Lee et al. | |
| 2020/0083460 A1* | 3/2020 | Duan | H01L 51/0072 |
| 2021/0135142 A1* | 5/2021 | Li | H01L 51/5012 |
| 2021/0151683 A1* | 5/2021 | Sakaino | H01L 51/008 |

FOREIGN PATENT DOCUMENTS

| KR | 10-2016-0034527 A | 3/2016 |
| KR | 10-2016-0044522 A | 4/2016 |
| KR | 10-2016-0070395 A | 6/2016 |
| KR | 10-2017-0085434 A | 7/2017 |
| KR | 10-2018-0061146 A | 6/2018 |
| KR | 10-1886773 B1 | 8/2018 |
| KR | 10-2018-0098809 A | 9/2018 |
| WO | WO 2016-158540 A1 | 10/2016 |
| WO | 2019013063 A1 † | 1/2019 |

OTHER PUBLICATIONS

Ayataka Endo et al. "Efficient up-conversion of triplet excitons into a singlet state and its application for organic light emitting diodes", Appl. Phys. Letts. 2011, vol. 98, pp. 083302-1 through 083302-3 (Year: 2011).*

Hiroyuki Tanaka et al. "Efficient up-conversion of triplet excitons into a singlet state and its application for organic light emitting diodes", Chem. Commun. 2012, vol. 48, p. 11392-11394 (Year: 2012).*

Hiroki Uoyama et al. "Highly efficient organic light-emitting diodes from delayed fluorescence", Nature 2012, vol. 492, p. 234-238 (Year: 2012).*

Sangyeob Lee et al. "The Role of Charge Balance and Excited State Levels on Device Performance of Exciplex-based Phosphorescent Organic Light Emitting Diodes", Scientific Report 2017, vol. 7, p. 11995-1 to -9 (Year: 2017).*

\* cited by examiner
† cited by third party

ORGANIC ELECTROLUMINESCENCE DEVICE AND ELECTRONIC APPARATUS INCLUDING THE SAME

CROSS-REFERENCE TO RELATED APPLICATION

This application claims priority to and the benefit of Korean Patent Application No. 10-2019-0013316, filed on Feb. 1, 2019, the entire content of which is incorporated herein by reference.

BACKGROUND

1. Field

Embodiments of the present disclosure relate to an organic electroluminescence device and a display device including the same.

2. Description of the Related Art

The development of an organic electroluminescence device as an image display device is actively being conducted. Organic electroluminescence devices are different from a liquid crystal display device and are self-luminescent display devices that display images via the recombination of holes and electrons injected from a first electrode and a second electrode in an emission layer and via light emission from a luminescent material including an organic compound included in the emission layer.

In the application of an organic electroluminescence device in a display device, an increase of efficiency and life of the organic electroluminescence device is beneficial and development of a material for an organic electroluminescence device stably accomplishing this feature is consistently sought.

SUMMARY

Embodiments of the present disclosure provide an organic electroluminescence device having long life and high color purity, and a display device including the same.

Embodiments of the present disclosure also provide an organic electroluminescence device which may be manufactured by way of a low-cost process, and a display device including the same.

An organic electroluminescence device according to an embodiment of the present disclosure may include a first electrode, a second electrode, and an emission layer. The second electrode may be on the first electrode. The emission layer may be between the first electrode and the second electrode. The emission layer may include a first host, a second host, a first dopant, and a second dopant. The first host may be represented by the following Formula 1. The second host may be different from the first host. The first dopant may be a thermally activated delayed fluorescence material having an electron donor and an electron acceptor. The second dopant may be represented by the following Formula 2:

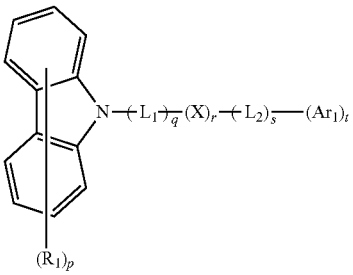

Formula 1

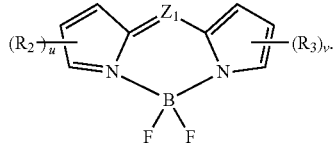

Formula 2

In Formula 1, $R_1$ may be a hydrogen atom, a deuterium atom, a halogen atom, a cyano group, a substituted or unsubstituted silyl group, a substituted or unsubstituted phosphonyl group, a substituted or unsubstituted alkyl group of 1 to 20 carbon atoms, a substituted or unsubstituted cycloalkyl group of 3 to 30 carbon atoms, a substituted or unsubstituted aryl group of 6 to 30 carbon atoms for forming a ring, or a substituted or unsubstituted heteroaryl group of 2 to 30 carbon atoms for forming a ring, or may be combined with an adjacent group to form a ring.

$L_1$ and $L_2$ may each independently be a direct linkage, a substituted or unsubstituted arylene group of 6 to 30 carbon atoms for forming a ring, or a substituted or unsubstituted heteroarylene group of 2 to 30 carbon atoms for forming a ring.

X may be a direct linkage, a substituted or unsubstituted divalent silyl group, or a substituted or unsubstituted divalent thioxanthene group.

$Ar_1$ may be a substituted or unsubstituted aryl group of 6 to 30 carbon atoms for forming a ring, or a substituted or unsubstituted heteroaryl group of 2 to 30 carbon atoms for forming a ring.

"p" may be an integer of 0 to 8. "q" and "s" may each independently be an integer of 0 to 3. At least one of "q" or "s" may be 1 or more. "r" may be 0 or 1. "t" may be an integer of 0 to 3.

In Formula 2, $Z_1$ may be $CR_4$ or N. $R_2$ and $R_3$ may each independently be a hydrogen atom, a deuterium atom, a halogen atom, a cyano group, a substituted or unsubstituted silyl group, a substituted or unsubstituted alkyl group of 1 to 20 carbon atoms, a substituted or unsubstituted cycloalkyl group of 3 to 30 carbon atoms, a substituted or unsubstituted aryl group of 6 to 30 carbon atoms for forming a ring, or a substituted or unsubstituted heteroaryl group of 2 to 30 carbon atoms for forming a ring, or may be combined with an adjacent group to form a ring.

$R_4$ may be a substituted or unsubstituted aryl group of 6 to 60 carbon atoms for forming a ring, or a substituted or unsubstituted heteroaryl group of 2 to 60 carbon atoms for forming a ring. "u" and "v" may each independently be an integer of 0 to 3.

In an embodiment, $L_1$ and $L_2$ may each independently be a direct linkage, a substituted or unsubstituted phenylene group, a substituted or unsubstituted divalent biphenyl group, a substituted or unsubstituted divalent triphenyl group, a substituted or unsubstituted divalent naphthyl group, a substituted or unsubstituted divalent pyridinyl group, or a substituted or unsubstituted divalent phenanthrolinyl group.

In an embodiment, L₁ and L₂ may each independently be substituted with hydrogen atom, a deuterium atom, a halogen atom, a cyano group, a substituted or unsubstituted boron group, a substituted or unsubstituted sulfonyl group, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring.

In an embodiment, Formula 1 may be represented by the following Formula 1-1:

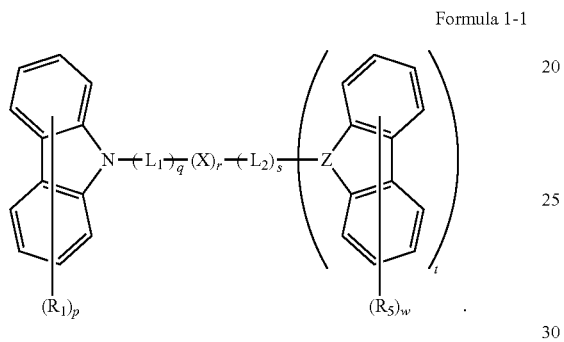

Formula 1-1

In Formula 1-1, $Z_2$ may be N or P=O. $R_5$ may be a hydrogen atom, a deuterium atom, a halogen atom, a cyano group, a substituted or unsubstituted silyl group, a substituted or unsubstituted phosphonyl group, a substituted or unsubstituted alkyl group of 1 to 20 carbon atoms, a substituted or unsubstituted cycloalkyl group of 3 to 30 carbon atoms, a substituted or unsubstituted aryl group of 6 to 30 carbon atoms for forming a ring, or a substituted or unsubstituted heteroaryl group of 2 to 30 carbon atoms for forming a ring, or may be combined with an adjacent group to form a ring.

"w" may be an integer of 0 to 8. $R_1$, $L_1$, $L_2$, X, "p", "q", "r", "s", and "t" may be the same as defined with respect to Formula 1.

In an embodiment, the first host may include at least one selected from compounds represented in the following Compound Group 1:

Compound Group 1

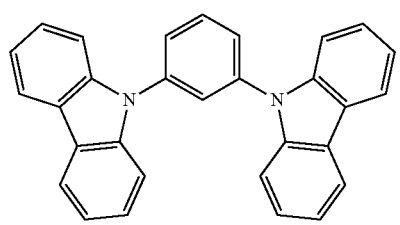

H1-1

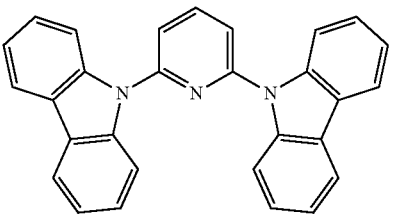

H1-2

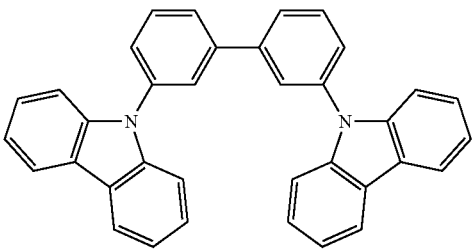

H1-3

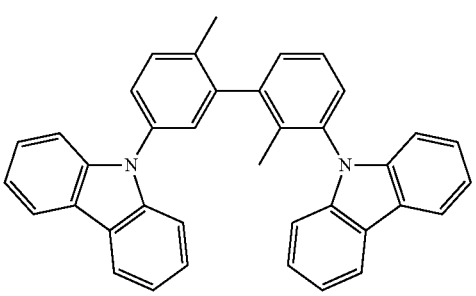

H1-4

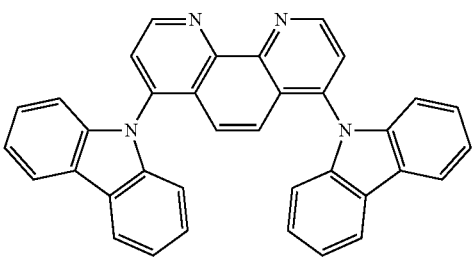

H1-5

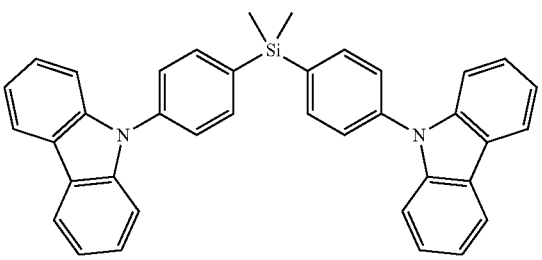

H1-6

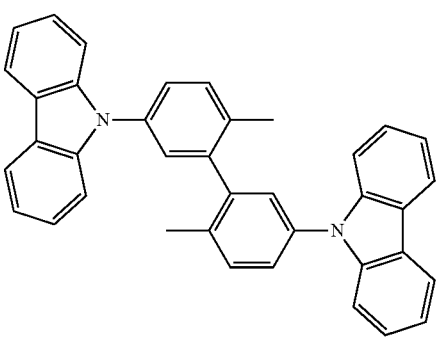

H1-7

H1-8
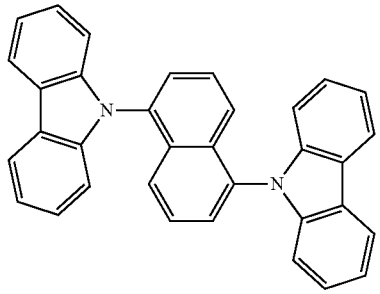
H1-9
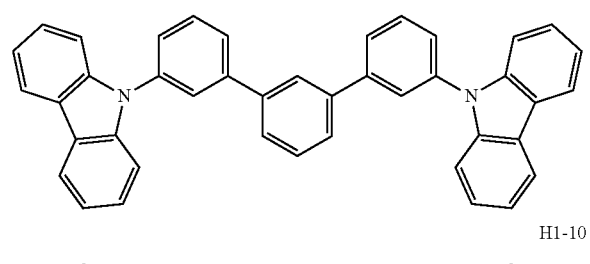
H1-10
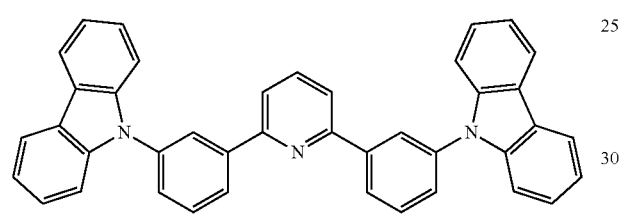
H1-11
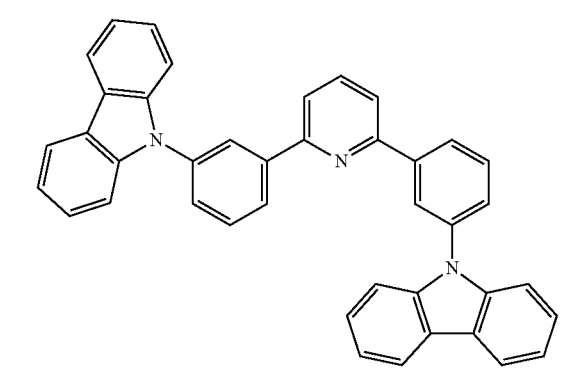
H1-12
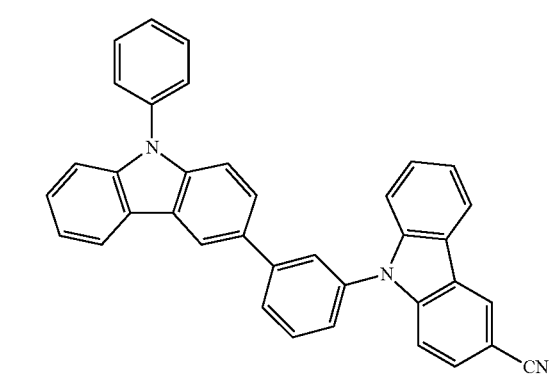
H1-13
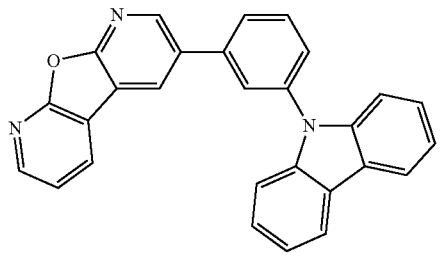
H1-14
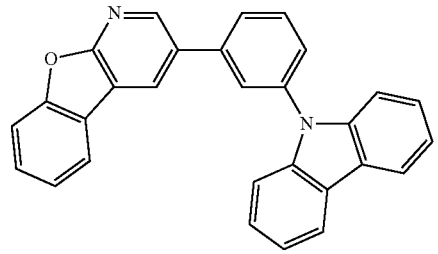
H1-15
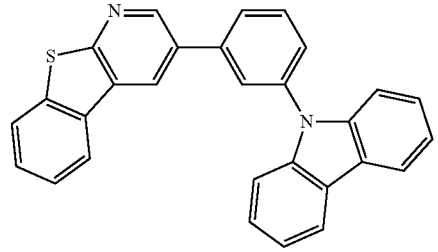
H1-16
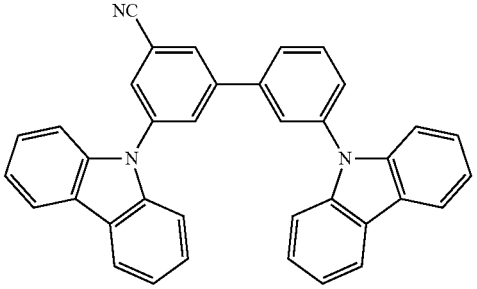
H1-17
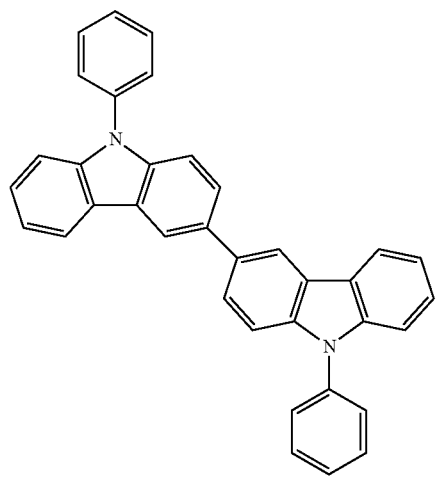

H1-18
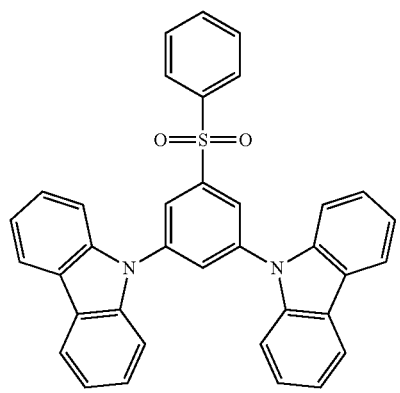

H1-19

H1-20

H1-21
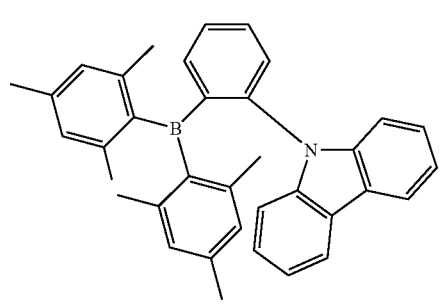

H1-22
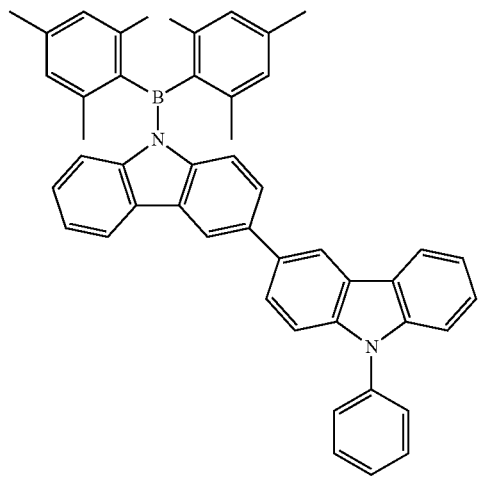

H1-23
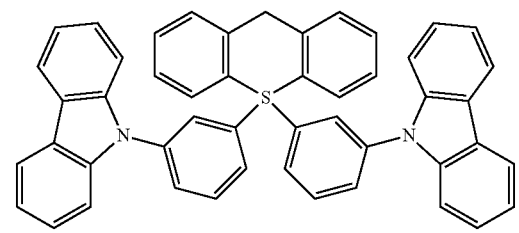

H1-24
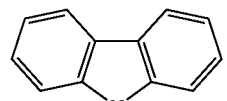

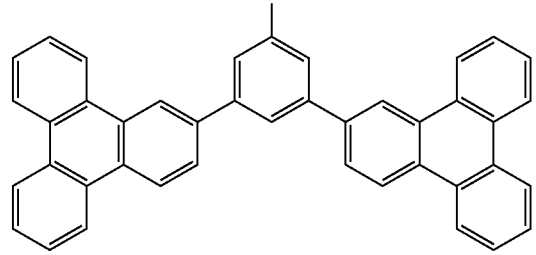

In an embodiment, the second host may include a substituted or unsubstituted aryl group of 10 to 80 carbon atoms for forming a ring, or a substituted or unsubstituted heteroaryl group of 10 to 80 carbon atoms for forming a ring, where the heteroaryl group includes N, O or S as a heteroatom.

In an embodiment, the second host may include at least one selected from compounds represented in the following Compound Group 2:

Compound Group 2
H2-1
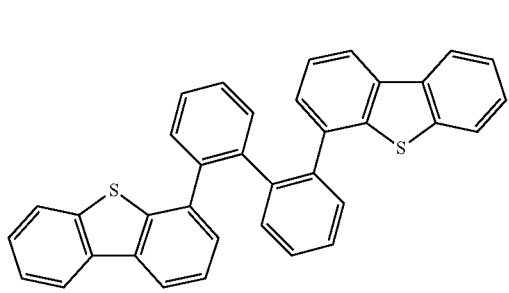
H2-6
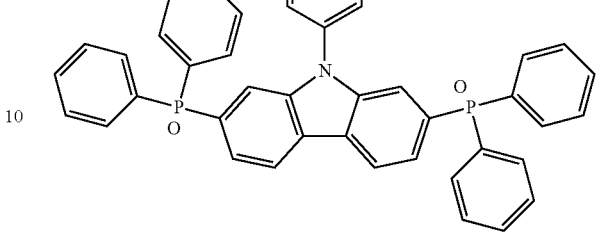
H2-2
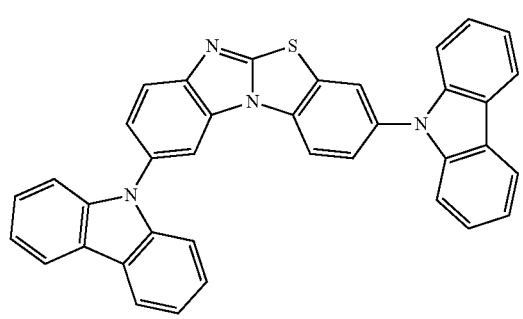
H2-7
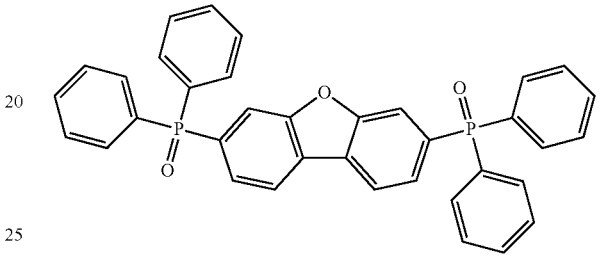
H2-3
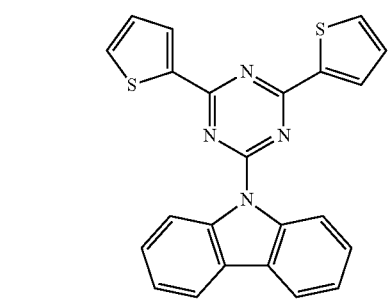
H2-8
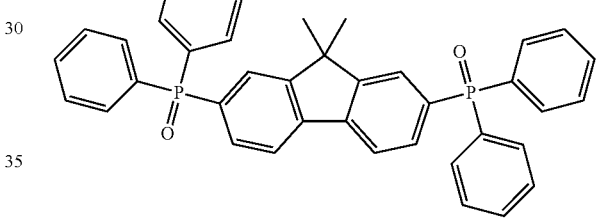
H2-4
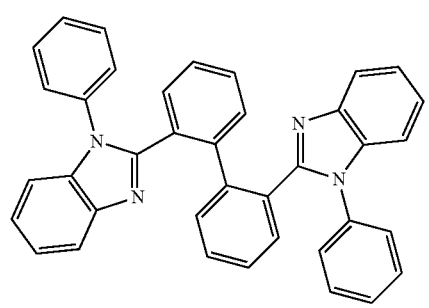
H2-9
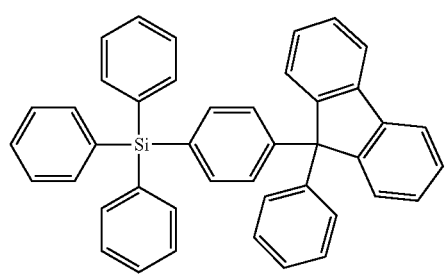
H2-5
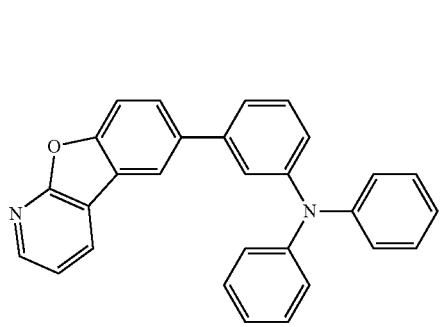
H2-10
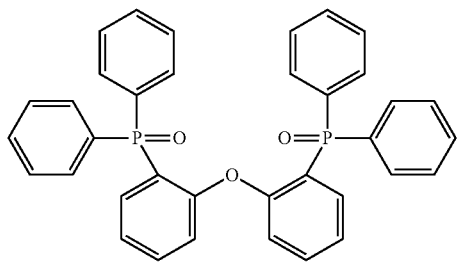

H2-11
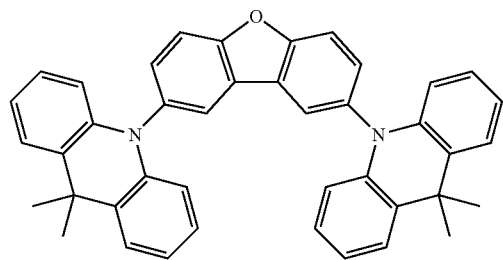
H2-12
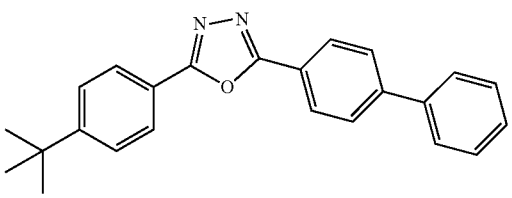
H2-13
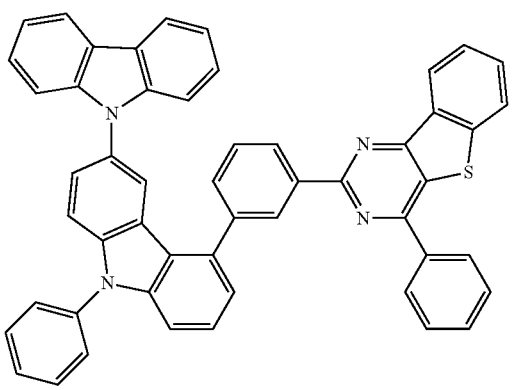
H2-14
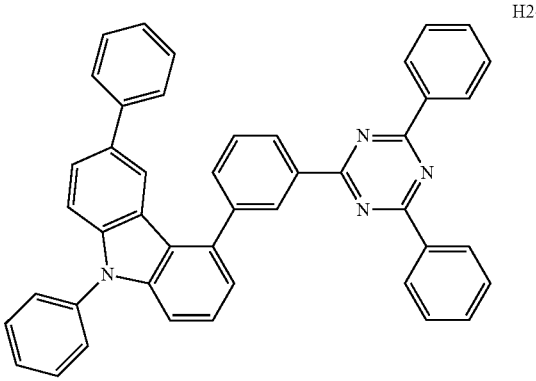
H2-15
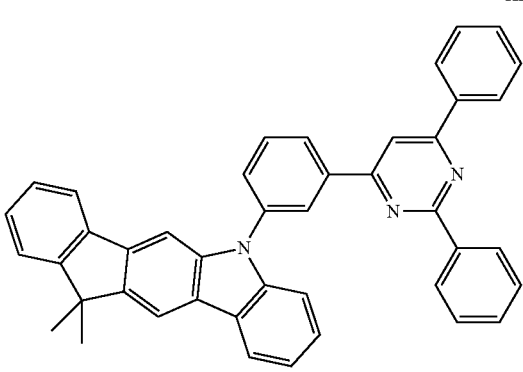
H2-16
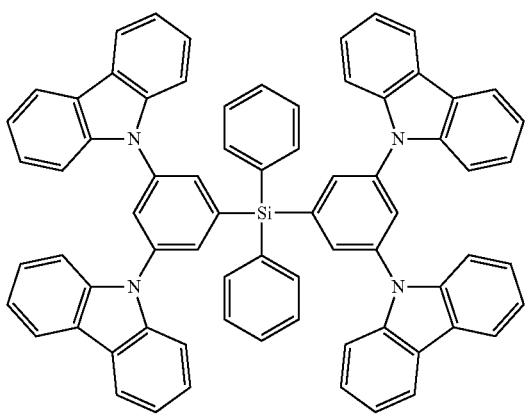
H2-17
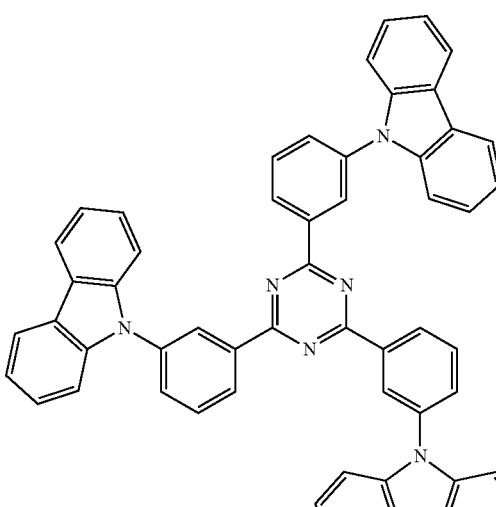
H2-18
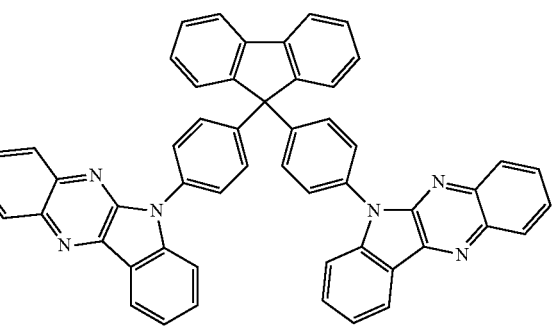
H2-19
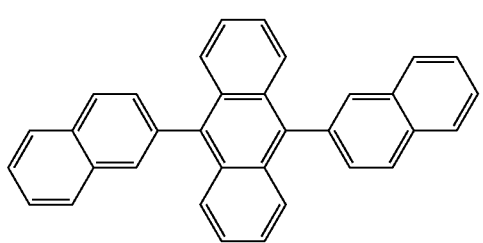

H2-20
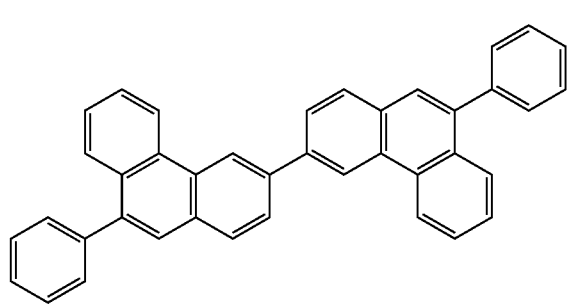

H2-21
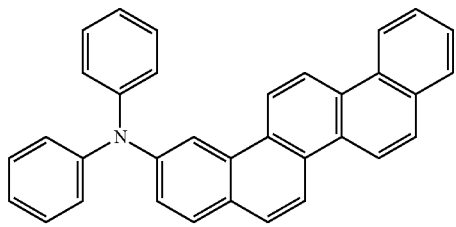

H2-22
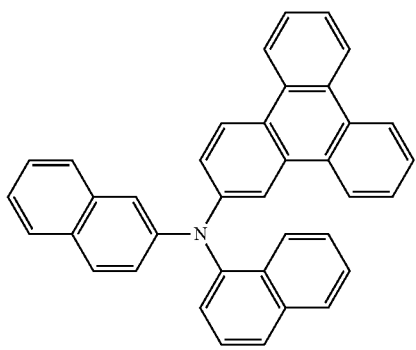

H2-23
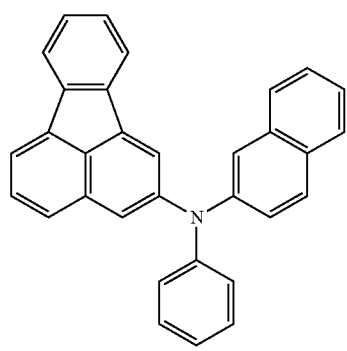

H2-24
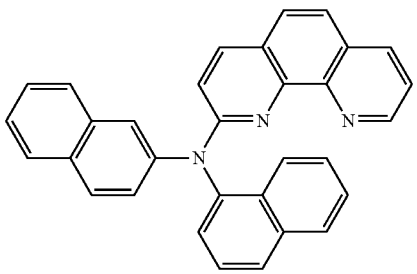

In an embodiment, a difference between the lowest singlet energy level and the lowest triplet energy level of the first dopant may be about 0.3 eV or less. The electron donor of the first dopant may have a negative (−) Hammett substituent constant (σ), and the electron acceptor of the first dopant may have a positive (+) Hammett substituent constant (σ).

In an embodiment, the electron donor of the first dopant may include a substituted or unsubstituted carbazole group, a substituted or unsubstituted indole group, a substituted or unsubstituted acridine group, a substituted or unsubstituted phenoxazine group, a substituted or unsubstituted phenothiazine group, or a substituted or unsubstituted aryl amine group of 6 to 30 carbon atoms for forming a ring.

In an embodiment, the electron acceptor of the first dopant may include a substituted or unsubstituted boron group, a substituted or unsubstituted azole group, a substituted or unsubstituted carbonyl group of 1 to 20 carbon atoms, a substituted or unsubstituted azine group, a substituted or unsubstituted sulfonyl group, an aryl group of 6 to 30 carbon atoms for forming a ring, where the aryl group is substituted with a cyano group or trihalomethyl, or a heteroaryl group of 2 to 30 carbon atoms for forming a ring, where the heteroaryl group is substituted with a cyano group or trihalomethyl.

In an embodiment, the first dopant may include at least one selected from compounds represented in the following Compound Group 3:

Compound Group 3
D1-1
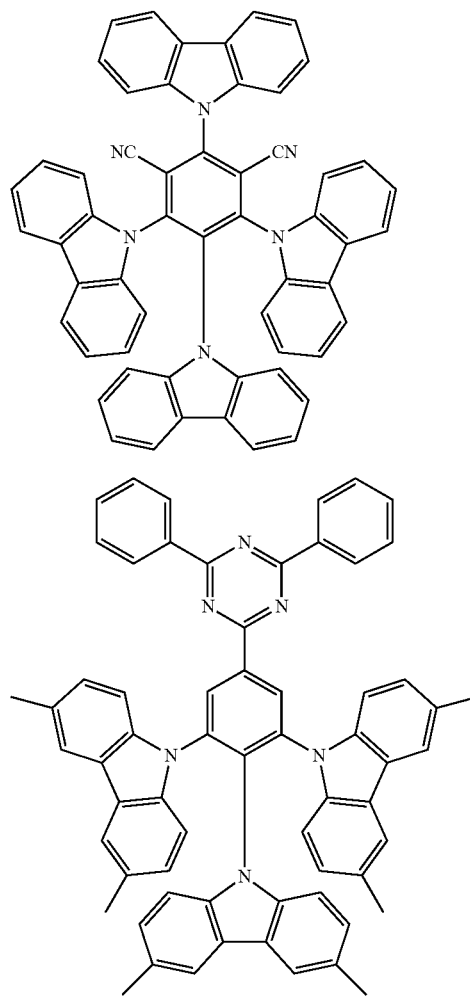
D1-2
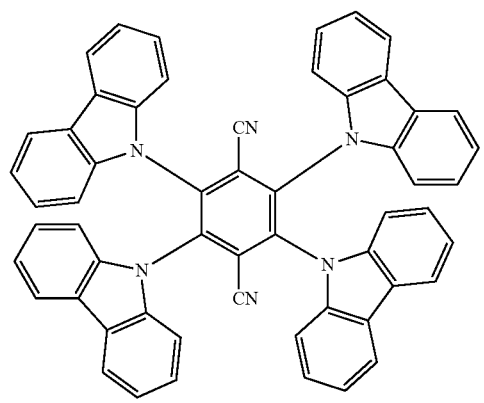
D1-3
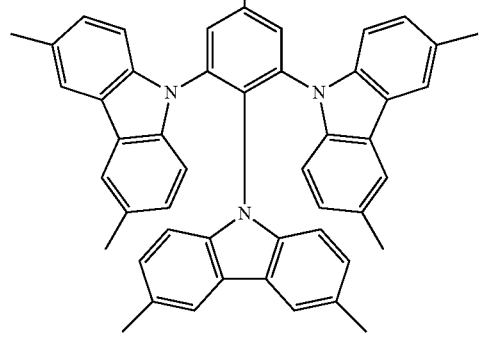
D1-4
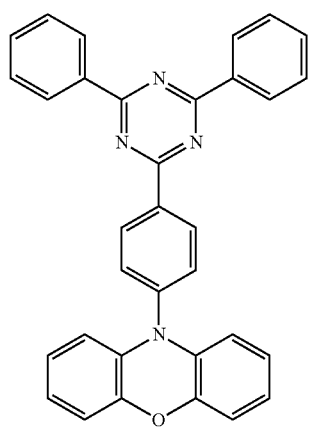
D1-5
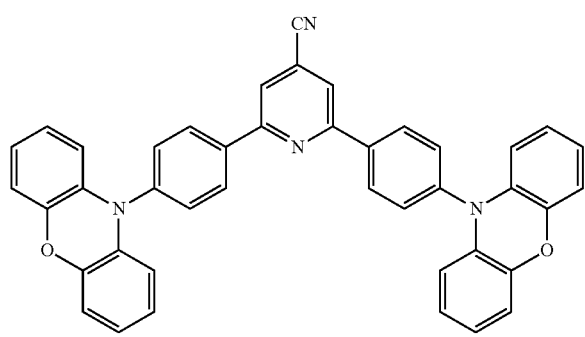
D1-6
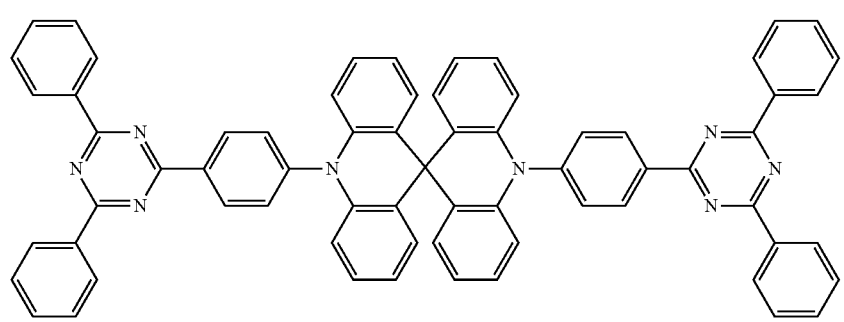

-continued
D1-7
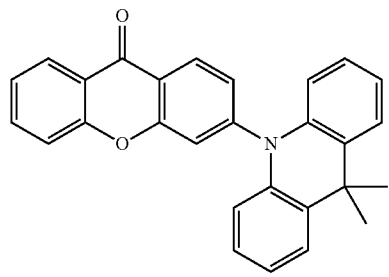
D1-8
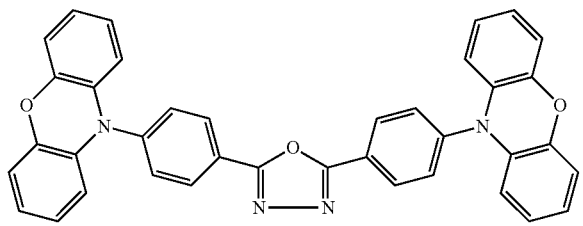
D1-9
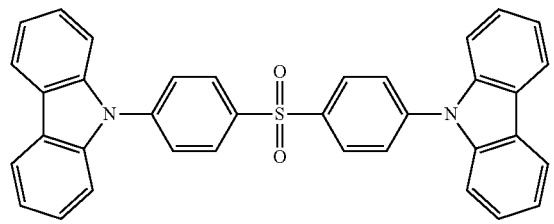
D1-10
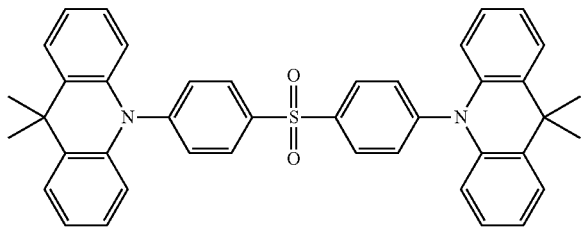
D1-11
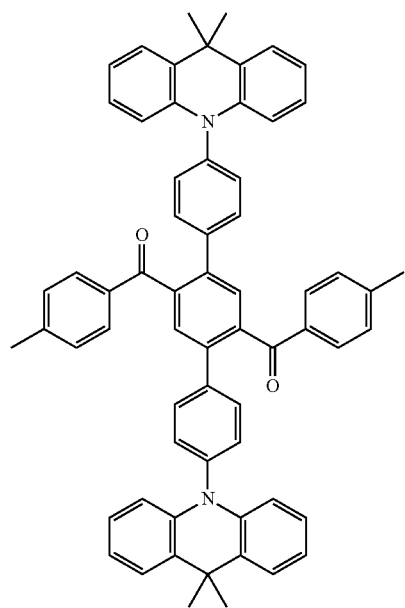
D1-12
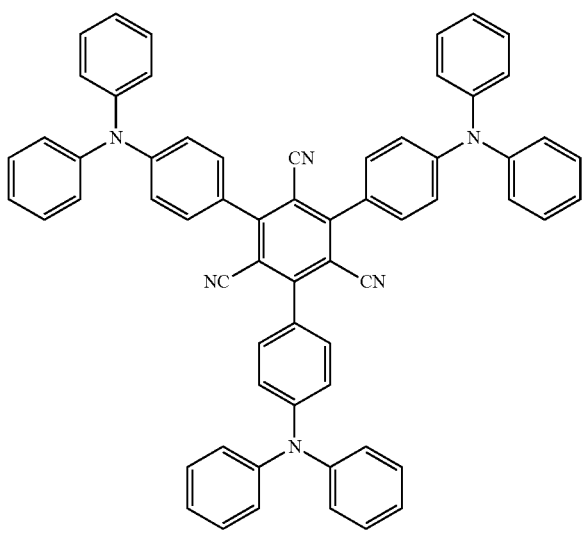

-continued
D1-13
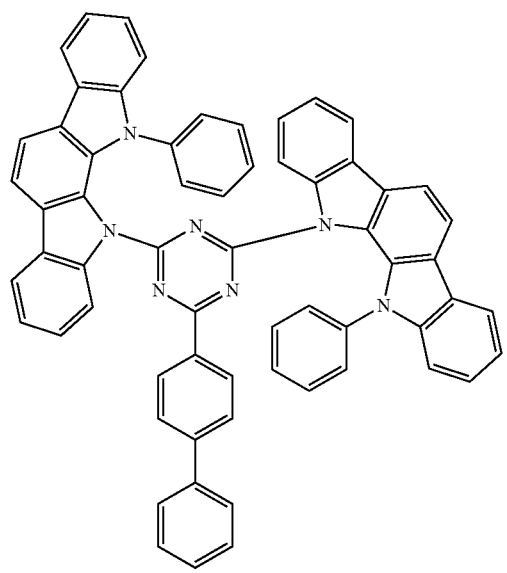
D1-14
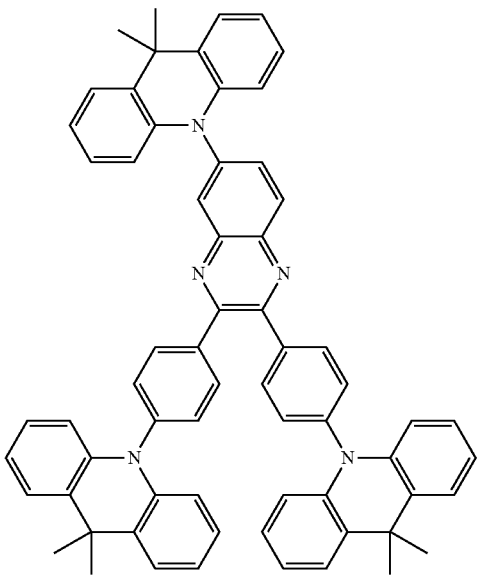
D1-15
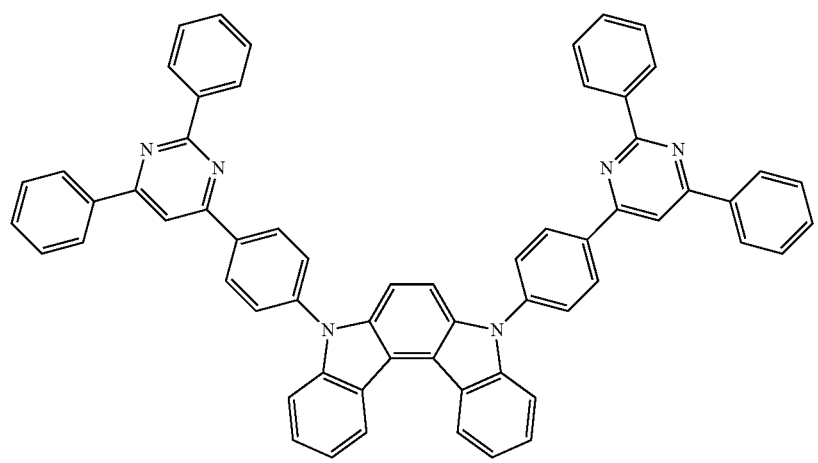
D1-16
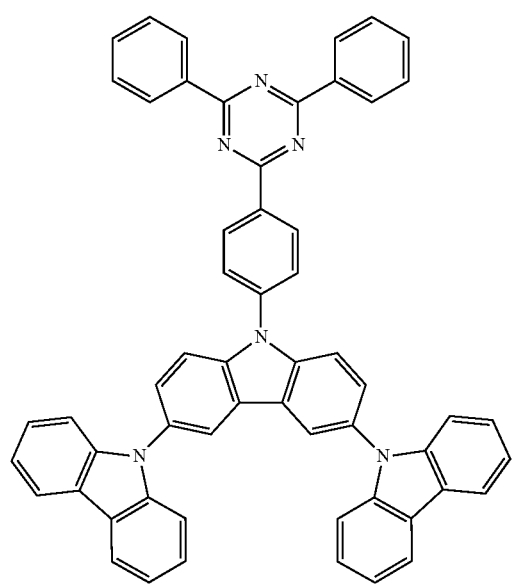
D1-17
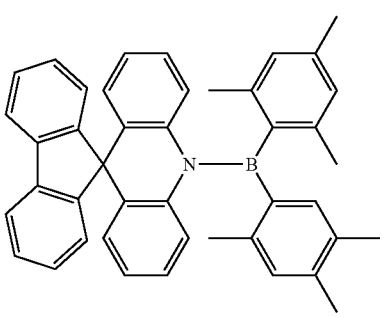

-continued

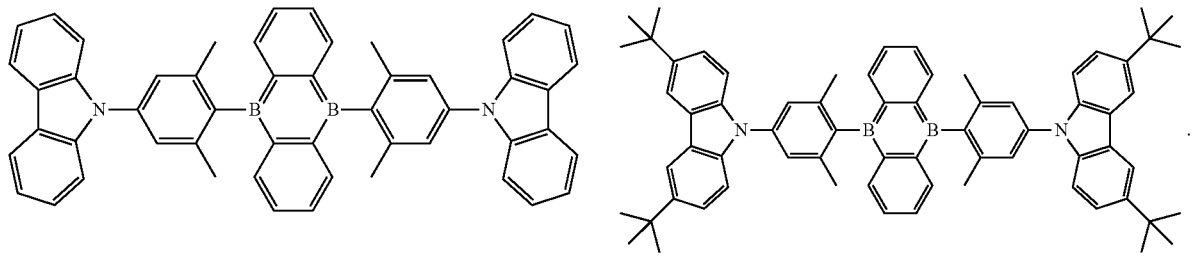

In an embodiment, Formula 2 may be represented by the following Formula 2-1 or Formula 2-2:

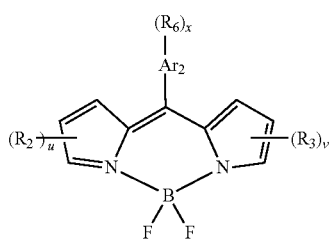

Formula 2-1

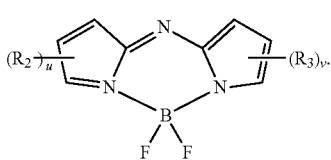

Formula 2-2

In Formula 2-1 and Formula 2-2, $Ar_2$ may be a substituted or unsubstituted aryl group of 6 to 30 carbon atoms for forming a ring, or a substituted or unsubstituted heteroaryl group of 2 to 30 carbon atoms for forming a ring. $R_6$ may be a hydrogen atom, a deuterium atom, a halogen atom, a cyano group, a substituted or unsubstituted silyl group, a substituted or unsubstituted amine group of 1 to 30 carbon atoms, a substituted or unsubstituted boron group, a substituted or unsubstituted alkoxy group of 1 to 20 carbon atoms, a substituted or unsubstituted alkyl group of 1 to 20 carbon atoms, a substituted or unsubstituted cycloalkyl group of 3 to 30 carbon atoms, a substituted or unsubstituted aryl group of 6 to 30 carbon atoms for forming a ring, or a substituted or unsubstituted heteroaryl group of 2 to 30 carbon atoms for forming a ring, or may be combined with an adjacent group to form a ring. "x" may be an integer of 0 to 3. $R_2$, $R_3$, "u" and "v" may be the same as defined with respect to Formula 2.

In an embodiment, Formula 2-1 may be represented by the following Formula 2-1-1 or Formula 2-1-2:

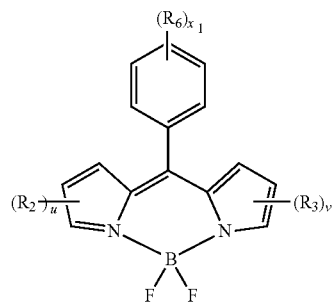

Formula 2-1-1

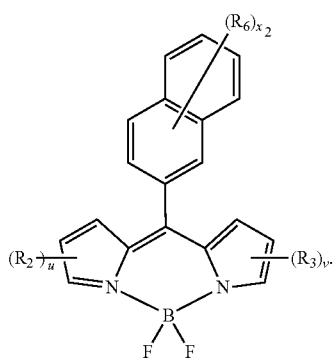

Formula 2-1-2

In Formula 2-1-1 and Formula 2-1-2, "$x_1$" and "$x_2$" may each independently be an integer of 0 to 3. $R_2$, $R_3$, $R_6$, "u", and "v" may be the same as defined with respect to Formula 2-1.

In an embodiment, Formula 2 may be represented by the following Formula 2-3 or Formula 2-4:

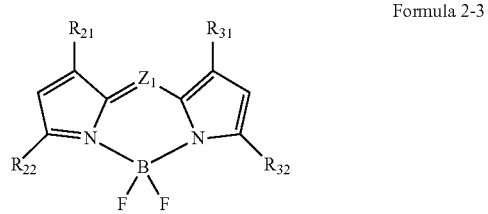

Formula 2-3

Formula 2-4

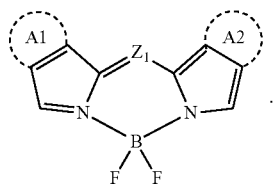

In Formula 2-3 and Formula 2-4, $R_{21}$, $R_{22}$, $R_{31}$, and $R_{32}$ may each independently be a deuterium atom, a halogen atom, a cyano group, a substituted or unsubstituted silyl group, a substituted or unsubstituted alkyl group of 1 to 20 carbon atoms, a substituted or unsubstituted cycloalkyl group of 3 to 30 carbon atoms, a substituted or unsubstituted aryl group of 6 to 30 carbon atoms for forming a ring, or a substituted or unsubstituted heteroaryl group of 2 to 30 carbon atoms for forming a ring. A1 and A2 may each independently be a substituted or unsubstituted aryl group of 6 to 30 carbon atoms for forming a ring. $Z_1$ may be the same as defined with respect to Formula 2.

In an embodiment, the second dopant may include at least one selected from compounds represented in the following Compound Group 4:

Compound Group 4

D2-1

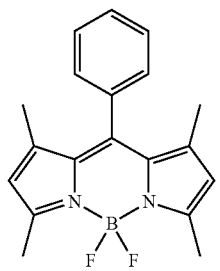

D2-2

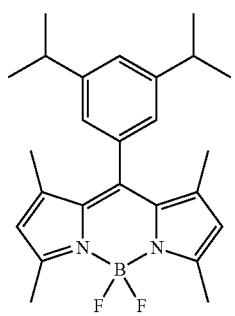

D2-3

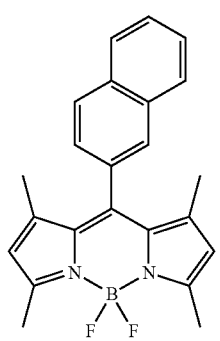

D2-4

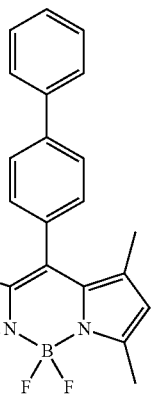

D2-5

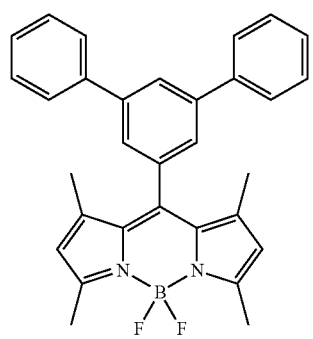

D2-6

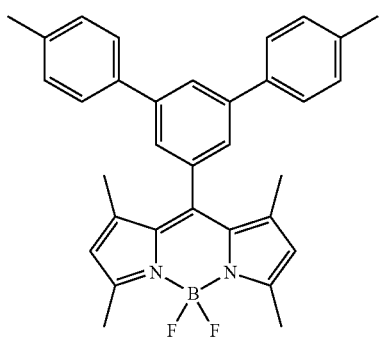

D2-7

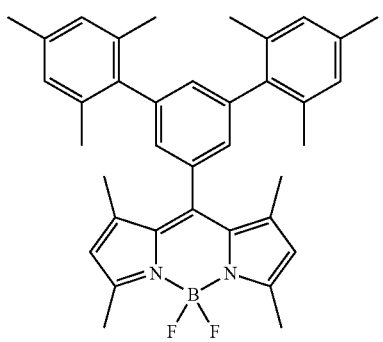

D2-8
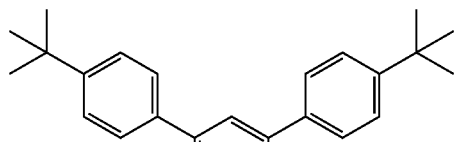
D2-9
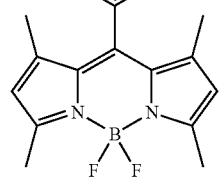
D2-10
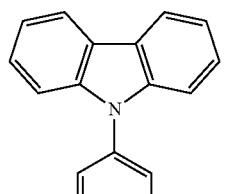
D2-11
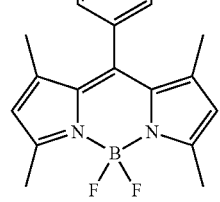
D2-12
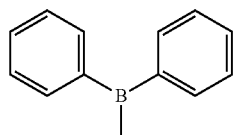
D2-13
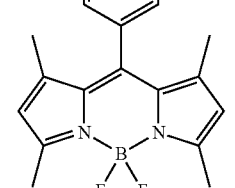
D2-14
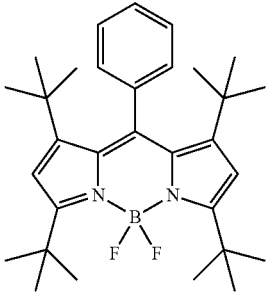
D2-15
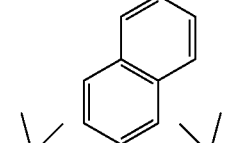

-continued
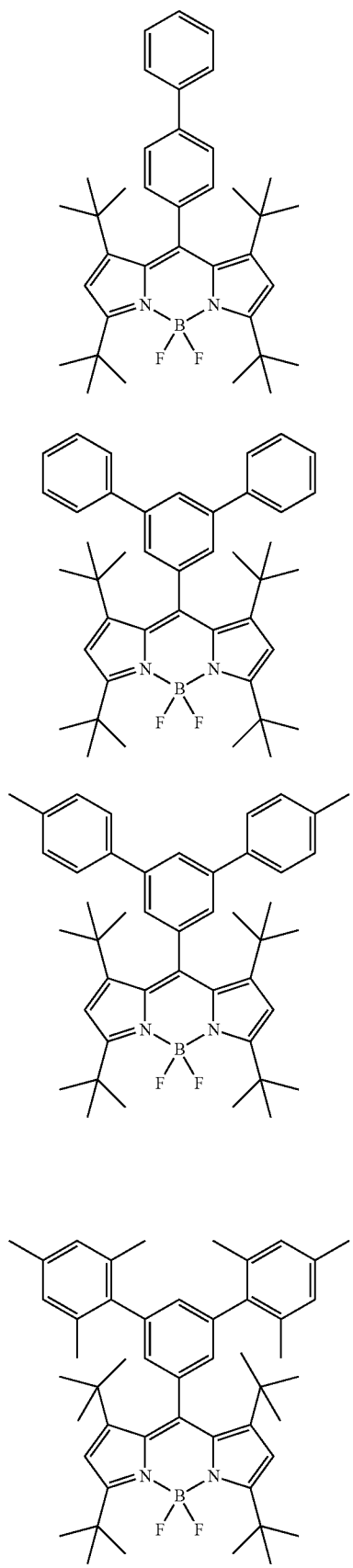
D2-16
D2-17
D2-18
D2-19
-continued
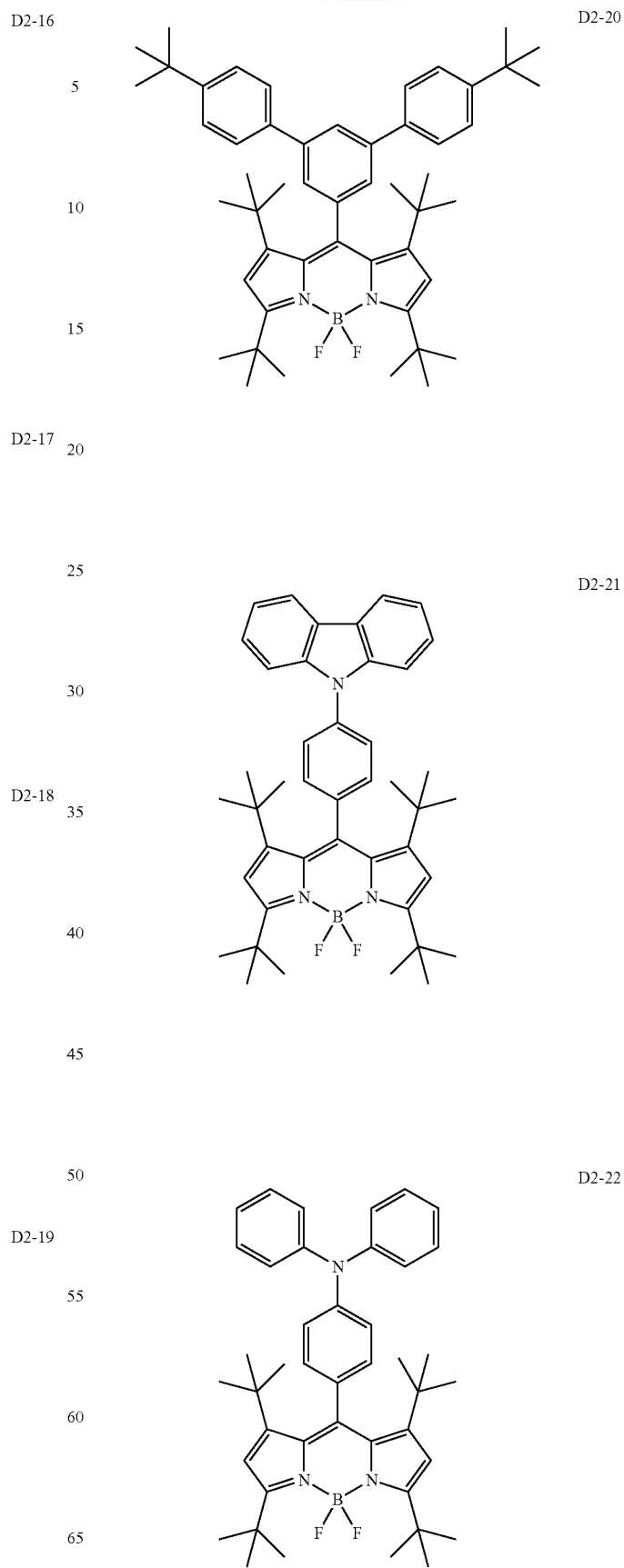
D2-20
D2-21
D2-22

D2-23
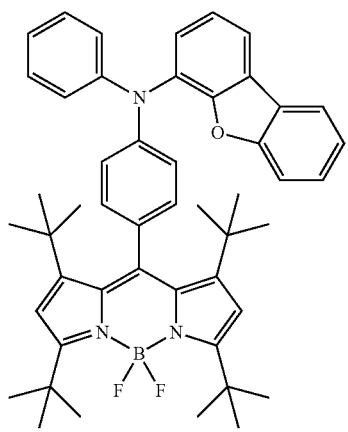
D2-24
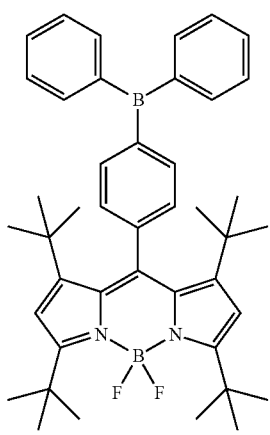
D2-25
D2-26
D2-27
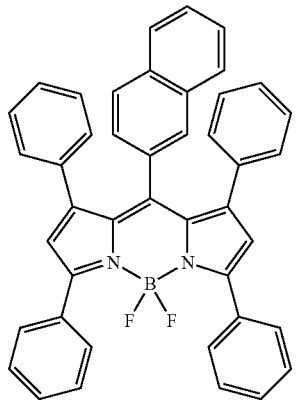
D2-28
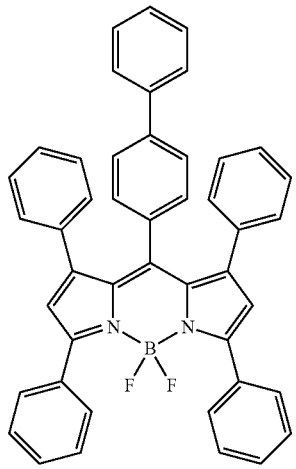
D2-29
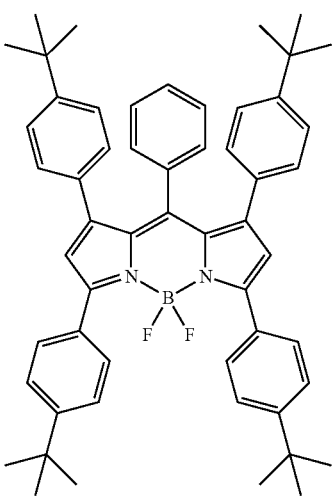

D2-30
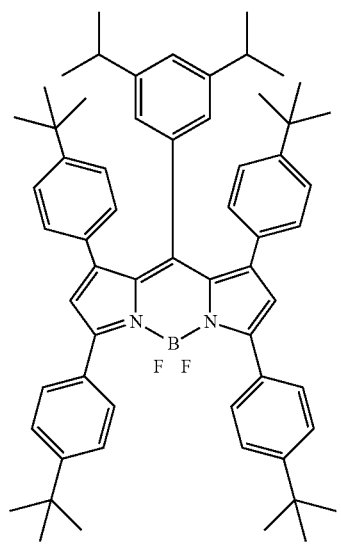
D2-31
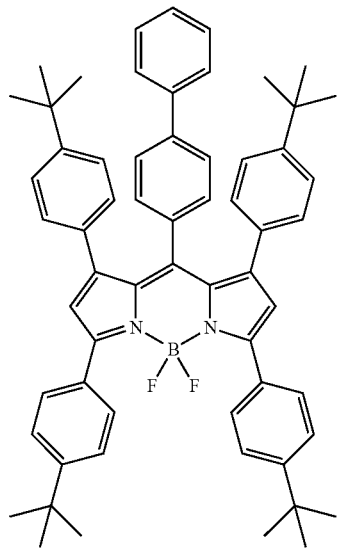
D2-32
D2-33
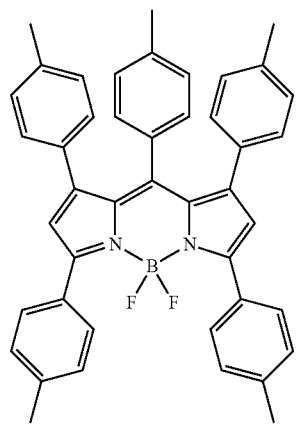
D2-34
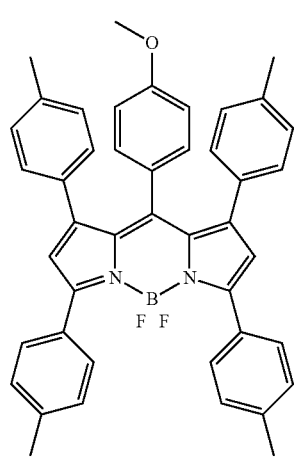
D2-35
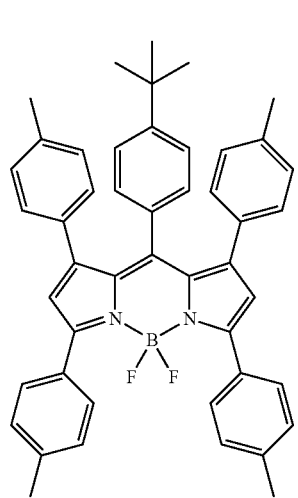

-continued
D2-36
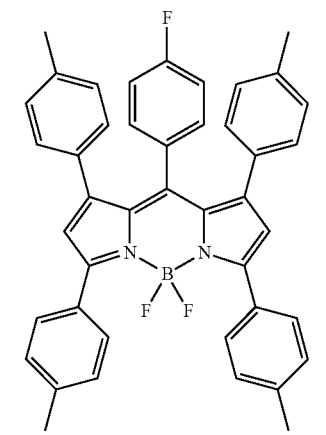
D2-37
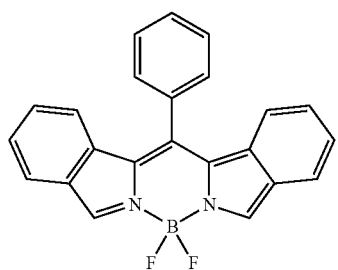
D2-38
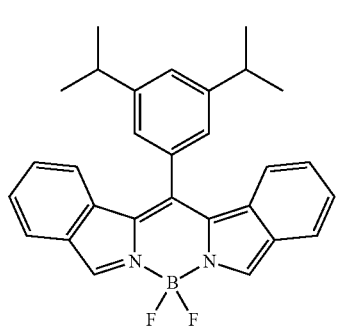
D2-39
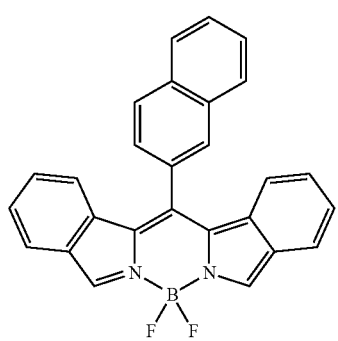
-continued
D2-40
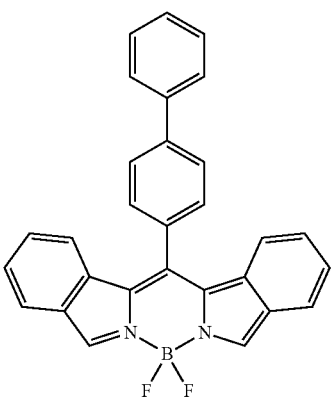
D2-41
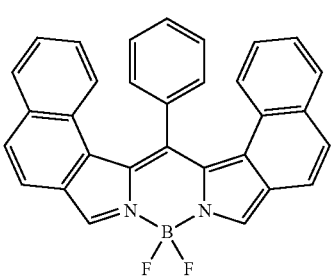
D2-42
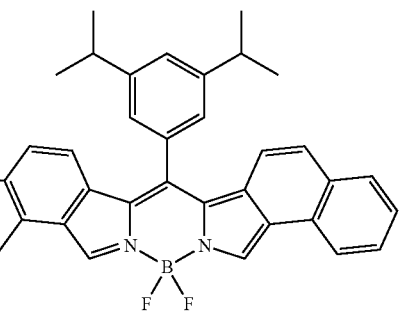
D2-43
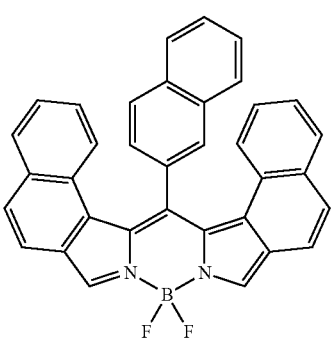

-continued

D2-44
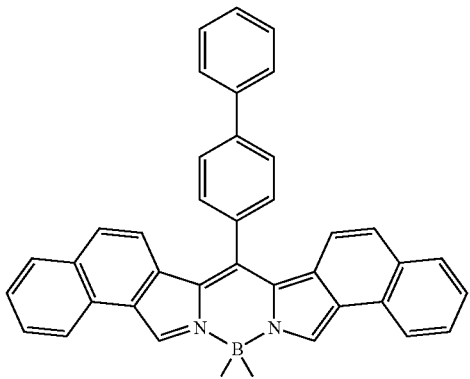

D2-45
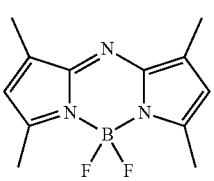

D2-46
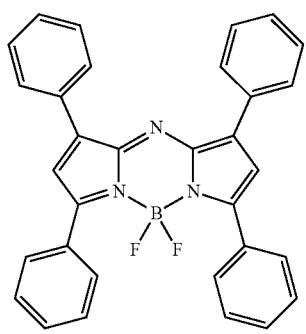

D2-47
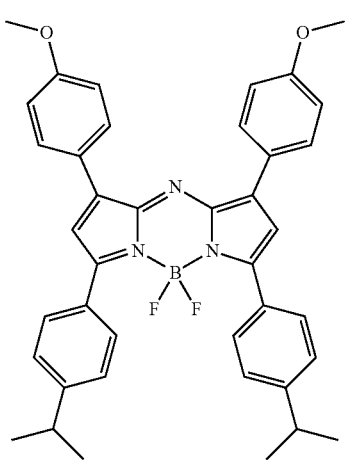

-continued

D2-48
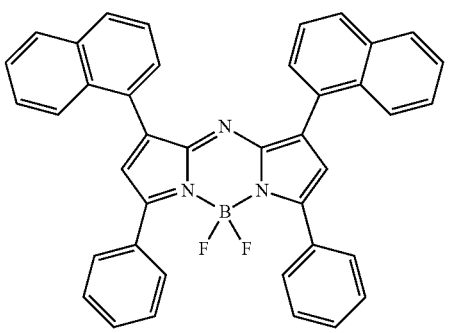

A display device according to an embodiment may include a plurality of pixels. The plurality of pixels may be separately arranged from each other. At least one among the pixels may include the organic electroluminescence device according to an embodiment.

BRIEF DESCRIPTION OF THE DRAWINGS

The accompanying drawings are included to provide a further understanding of the subject matter of the present disclosure, and are incorporated in and constitute a part of this specification. The drawings illustrate exemplary embodiments of the present disclosure and, together with the description, serve to explain principles of the present disclosure. In the drawings.

DETAILED DESCRIPTION

Figure 1:
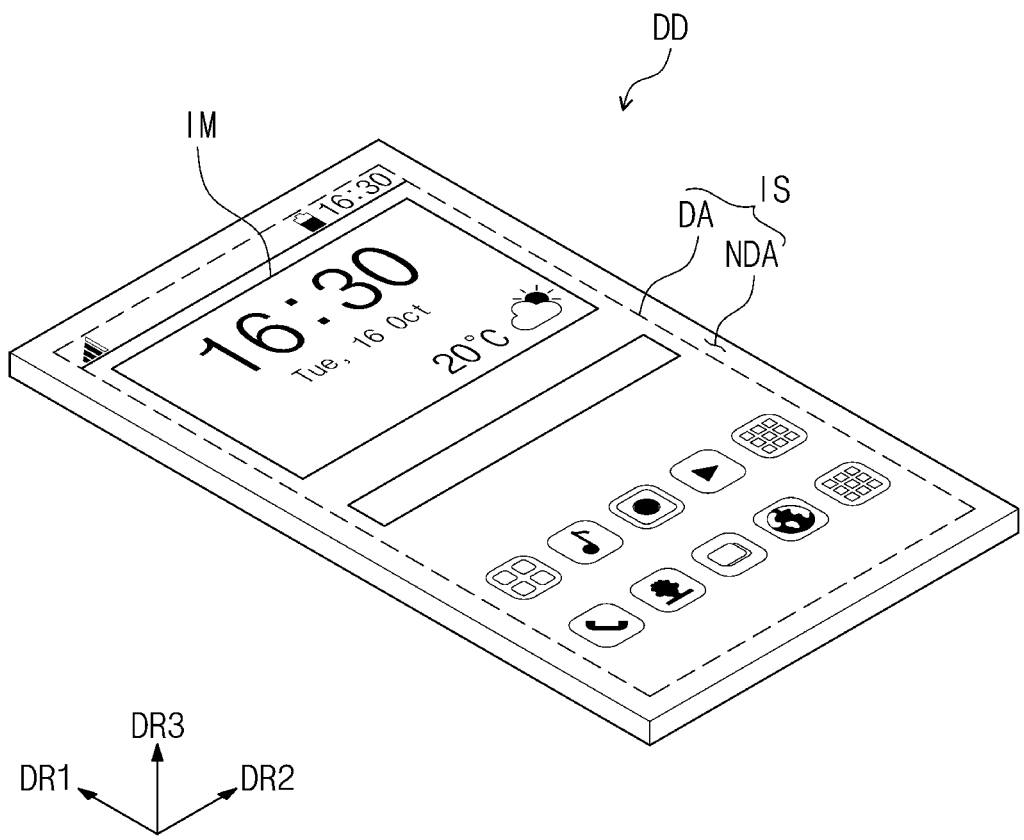
FIG. 1 is a perspective view of a display device according to an embodiment of the present disclosure.

The subject matter of the present disclosure may have various modifications and may be embodied in different forms, and example embodiments will be explained in more detail with reference to the accompany drawings. The subject matter of the present disclosure may, however, be embodied in different forms and should not be construed as limited to the embodiments set forth herein. Rather, all modifications, equivalents, and substituents which are included in the spirit and technical scope of the present disclosure should be included in the present disclosure.

Like reference numerals refer to like elements IN each drawing. In the drawings, the sizes of elements may be enlarged for clarity of the present disclosure. It will be understood that, although the terms first, second, etc. may be used herein to describe various elements, these elements should not be limited by these terms. These terms are only used to distinguish one element from another element. For example, a first element discussed below could be termed a second element, and similarly, a second element could be termed a first element. As used herein, the singular forms are intended to include the plural forms as well, unless the context clearly indicates otherwise.

It will be further understood that the terms "comprises" or "comprising," when used in this specification, specify the presence of stated features, numerals, steps, operations, elements, parts, or a combination thereof, but do not preclude the presence or addition of one or more other features, numerals, steps, operations, elements, parts, or a combination thereof.

It will also be understood that when a layer, a film, a region, a plate, etc. is referred to as being "on" or "above" another part, it can be "directly on" the other part, or intervening layers may also be present. Additionally, when a layer, a film, a region, a plate, etc. is referred to as being "under" or "beneath" another part, it can be "directly under" the other part, or intervening layers may also be present. In addition, being "on" a part in the present disclosure may include both cases of being above or beneath the part.

Hereinafter, embodiments of the present disclosure will be explained referring to attached drawings.

FIG. 1 is a perspective view of a display device DD according to an embodiment of the present disclosure. As shown in FIG. 1, the display device DD may display an image IM through a display surface IS. The display surface IS and a plane defined by a first directional axis DR1 and a second directional axis DR2, are parallel (e.g., substantially parallel). The normal line direction of the display surface IS, e.g., the thickness direction of the display device DD is indicated by a third directional axis DR3.

The front side (top side) and the rear side (or bottom side) of each member or unit explained hereinafter are divided by the third directional axis DR3. However, the first directional axis DR1, the second directional axis DR2 and the third directional axis DR3, shown in this embodiment are only illustrations, and the directions indicated by the first directional axis DR1, the second directional axis DR2, and the third directional axis DR3 are relative concepts and may be changed to another direction. Hereinafter, the first to third directions are directions indicated by the first directional axis DR1, the second directional axis DR2, and the third directional axis DR3, respectively, and refer to the same drawing symbols.

In an embodiment of the present disclosure, a display device DD provided with a planar display surface is shown, but embodiments of the present disclosure are not limited thereto. The display device DD may include a curved type display surface (e.g., a curved display surface) or a three-dimensional type display surface (e.g., a display surface having a plurality of display surfaces). The three-dimensional type display surface may include a plurality of displaying regions which indicate different directions from each other, for example may include a polygonal pillar type display surface (e.g., a display surface having a shape of a polygonal pillar).

The display device DD according to this embodiment may be a rigid display device. However, embodiments of the present disclosure are not limited thereto, and the display device DD according to embodiments of the present disclosure may be a flexible display device DD. In this embodiment, a display device DD which may be applied to a portable terminal is shown for illustration. In some embodiments, the portable terminal may be configured by receiving electronic modules, a camera module, a power module, etc. installed on a main board in a housing. The display device DD according to embodiments of the present disclosure may be applied to large-sized electronic devices such as a television and/or monitor, and/or medium and/or small-sized electronic devices such as a tablet, a car navigation, a game console, and/or a smart watch.

As shown in FIG. 1, the display surface IS may include a display area DA configured to display an image IM, and a non display area NDA which is adjacent to the display area DA. The non display area NDA is a region where the image IM is not displayed. In FIG. 1, icon images are shown as examples of the image IM.

As shown in FIG. 1, the display area DA may have a rectangular shape (e.g., a quadrilateral shape). The non display area NDA may at least partially surround the display area DA. However, the shape of the display area DA and the shape of the non display area NDA may be designed in a relative relation.

Figure 2:
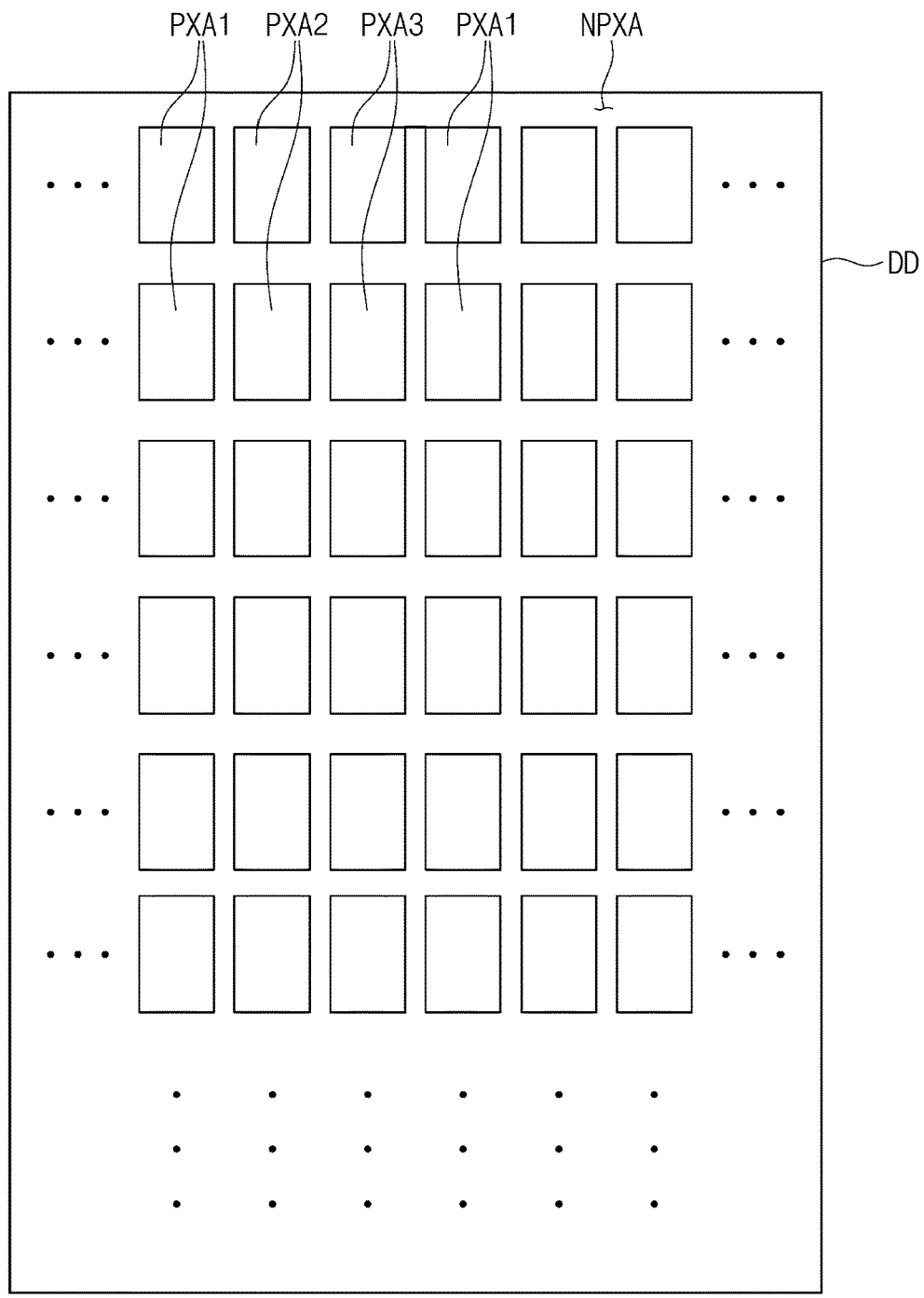
FIG. 2 is a plan view of a display device according to an embodiment of the present disclosure.
Figure 2:
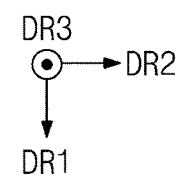

FIG. 2 is a plan view of a display device DD according to an embodiment. FIG. 2 shows a top view of the display device DD.

Referring to FIG. 2, in the display device DD, first pixel areas PXA1, second pixel areas PXA2, third pixel areas PXA3, and a nonpixel area NPXA may be defined.

The first pixel areas PXA1, the second pixel areas PXA2, and the third pixel areas PXA3 may be referred to as first pixels PXA1, second pixels PXA2 and third pixels PXA3, respectively.

The first pixels PXA1 may be arranged along the first direction DR1, the second pixels PXA2 may be arranged along the first direction DR1, the third pixels PXA3 may be arranged along the first direction DR1. The first pixels PXA1, the second pixels PXA2, and the third pixels PXA3 may be alternately arranged along the second direction DR2. For example, one of the first pixels PXA1, one of the second pixels PXA2, and one of the third pixels PXA3 may be arranged in order along the second direction DR2.

The first pixels PXA1 may be configured to provide first color light, the second pixels PXA2 may be configured to provide second color light, and the third pixels PXA3 may be configured to provide third color light. The first color light, the second color light, and the third color light may be lights having different colors from each other. For example, one selected from the first color light, the second color light, and the third color light may be blue light, another one may be red light, and the remaining one may be green light.

The non pixel area NPXA may be a region adjacent to the first pixels PXA1, the second pixels PXA2, and the third pixels PXA3. The non pixel area NPXA may establish a boundary of the first pixels PXA1, the second pixels PXA2, and the third pixels PXA3.

Figure 3:
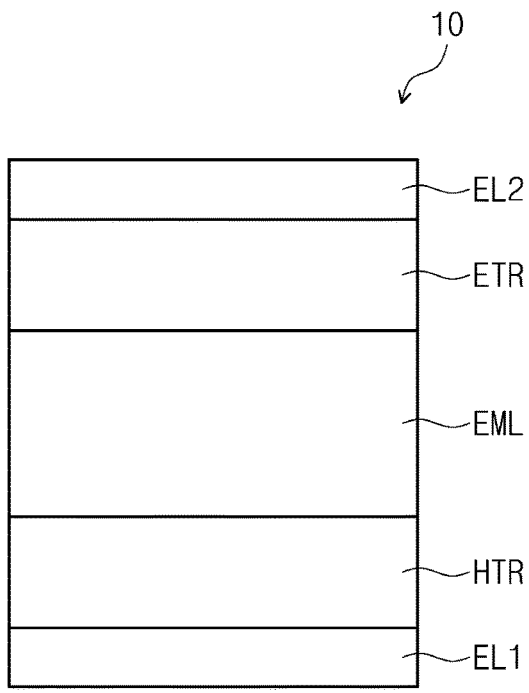
FIG. 3 is a cross-sectional view schematically showing an organic electroluminescence device according to an embodiment.
Figure 4:
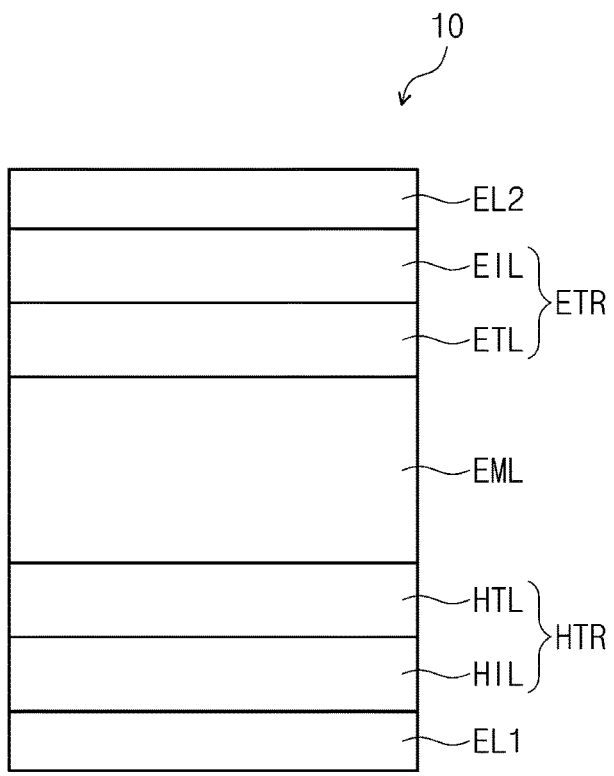
FIG. 4 is a cross-sectional view schematically showing an organic electroluminescence device according to an embodiment.
Figure 5:
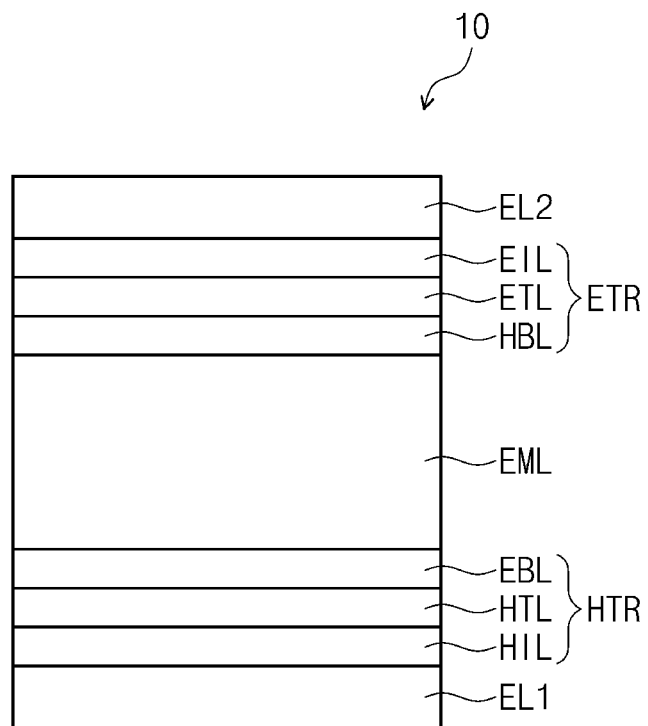
FIG. 5 is a cross-sectional view schematically showing an organic electroluminescence device according to an embodiment.

At least one selected from the first pixels PXA1, the second pixels PXA2, and the third pixels PXA3 may include an organic electroluminescence device 10 (FIG. 3 to FIG. 5).

FIG. 3 is a cross-sectional view schematically showing an organic electroluminescence device according to an embodiment of the present disclosure. An organic electroluminescence device 10 according to an embodiment may include a first electrode EL1, an emission layer EML, and a second electrode EL2 stacked one by one. Between the first electrode EL1 and the emission layer EML, a hole transport region HTR may be included, and between the emission layer EML and the second electrode EL2, an electron transport region ETR may be included.

When compared with FIG. 3, FIG. 4 shows a cross-sectional view showing an organic electroluminescence device 10 according to an embodiment, in which a hole transport region HTR includes a hole injection layer HIL and a hole transport layer HTL, and an electron transport region ETR includes an electron injection layer EIL and an electron transport layer ETL. In addition, when compared with FIG.

3, FIG. 5 shows a cross-sectional view showing an organic electroluminescence device 10 according to an embodiment, in which a hole transport region HTR includes a hole injection layer HIL, a hole transport layer HTL, and an electron blocking layer EBL, and an electron transport region ETR includes an electron injection layer EIL, an electron transport layer ETL, and a hole blocking layer HBL.

The first electrode EL1 has conductivity (e.g., electrical conductivity). The first electrode EL1 may be formed using a metal alloy or a conductive compound. The first electrode EL1 may be an anode. In addition, the first electrode EL1 may be a pixel electrode. The first electrode EL1 may be a transmissive electrode, a transflective electrode, or a reflective electrode. If the first electrode EL1 is the transmissive electrode, the first electrode EL1 may be formed using a transparent metal oxide such as indium tin oxide (ITO), indium zinc oxide (IZO), zinc oxide (ZnO), and/or indium tin zinc oxide (ITZO). If the first electrode EL1 is the transflective electrode or reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). Also, the first electrode EL1 may include a plurality of layers including the reflective layer or transflective layer formed using the above materials, and a transparent conductive layer formed using ITO, IZO, ZnO, and/or ITZO. For example, the first electrode EL1 may have a three-layer structure of ITO/Ag/ITO. However, embodiments of the present disclosure are not limited thereto. The thickness of the first electrode EL1 may be from about 1,000 Å to about 10,000 Å, for example, from about 1,000 Å to about 3,000 Å.

The hole transport region HTR is provided on the first electrode EL1. The hole transport region HTR may include at least one of a hole injection layer HIL, a hole transport layer HTL, a hole buffer layer, or an electron blocking layer EBL.

The hole transport region HTR may have a single layer formed using a single material, a single layer formed using a plurality of different materials, or a multilayer structure including a plurality of layers formed using a plurality of different materials.

For example, the hole transport region HTR may have the structure of a single layer such as a hole injection layer HIL and a hole transport layer HTL, or may have a structure of a single layer formed using a hole injection material and a hole transport material. In addition, the hole transport region HTR may have a structure of a single layer formed using a plurality of different materials, or a structure of hole injection layer HIL/hole transport layer HTL, hole injection layer HIL/hole transport layer HTL/hole buffer layer, hole injection layer HIL/hole buffer layer, hole transport layer HTL/hole buffer layer, or hole injection layer HIL/hole transport layer HTL/electron blocking layer EBL, stacked one by one from the first electrode EL1 without limitation.

The hole transport region HTR may be formed using various suitable methods such as, for example, a vacuum deposition method, a spin coating method, a cast method, a Langmuir-Blodgett (LB) method, an inkjet printing method, a laser printing method, and/or a laser induced thermal imaging (LITI) method.

The hole injection layer HIL may include, for example, a phthalocyanine compound such as copper phthalocyanine, N,N'-diphenyl-N,N'-bis[4-(di-m-tolyl-amino)-phenyl]-biphenyl-4,4'-diamine (DNTPD), 4,4',4"-tris(3-methylphenylphenylamino)triphenylamine (m-MTDATA), 4,4',4"-tris (N,N-diphenylamino)triphenylamine (TDATA), 4,4',4"-tris {N-(2-naphthyl)-N-phenylamino}-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(naphthalene-1-yl)-N,N'-diphenyl-benzidine (NPB), triphenylamine-containing polyether ketone (TPAPEK), 4-isopropyl-4'-methyldiphenyliodonium tetrakis(pentafluorophenyl) borate, dipyrazino[2,3-f: 2',3'-h] quinoxaline-2,3,6,7,10,11-hexacarbonitrile (HAT-CN), etc.

The hole transport layer HTL may include, for example, carbazole derivatives such as N-phenyl carbazole and polyvinyl carbazole, fluorene-based derivatives, N,N'-bis(3-methylphenyl)-N, N'-diphenyl-[1,1'-biphenyl]-4,4'-diamine (TPD), triphenylamine-based derivatives such as 4,4',4"-tris (N-carbazolyl)triphenylamine (TCTA), N,N'-di(naphthalene-1-yl)-N,N'-diphenyl-benzidine (NPB), 4,4'-cyclohexylidene-bis[N,N-bis(4-methylphenyl)benzenamine] (TAPC), 4,4'-bis[N,N'-(3-tolyl)amino]-3,3'-dimethylbiphenyl (HMTPD), 1,3-bis(N-carbazolyl)benzene (mCP), etc.

The thickness of the hole transport region HTR may be from about 100 Å to about 10,000 Å, for example, from about 100 Å to about 5,000 Å. The thickness of the hole injection layer HIL may be, for example, from about 30 Å to about 1,000 Å, and the thickness of the hole transport layer HTL may be from about 30 Å to about 1,000 Å. For example, the thickness of the electron blocking layer EBL may be from about 10 Å to about 1,000 Å. If the thicknesses of the hole transport region HTR, the hole injection layer HIL, the hole transport layer HTL, and the electron blocking layer EBL satisfy the above-described ranges, suitable or satisfactory hole transport properties may be obtained without substantial increase of a driving voltage.

The hole transport region HTR may further include a charge generating material in addition to the above-described materials to improve conductivity (e.g., electrical conductivity). The charge generating material may be dispersed in the hole transport region HTR uniformly or non-uniformly. The charge generating material may be, for example, a p-dopant. The p-dopant may be one of quinone derivatives, metal oxides, and/or cyano group-containing compounds, without limitation. For example, non-limiting examples of the p-dopant may include quinone derivatives such as tetracyanoquinodimethane (TCNQ), and 2,3,5,6-tetrafluoro-7,7,8,8-tetracyanoquinodimethane (F4-TCNQ), metal oxides such as tungsten oxide, molybdenum oxide, etc., without limitation.

As described above, the hole transport region HTR may further include at least one selected from a hole buffer layer and an electron blocking layer EBL, in addition to the hole injection layer HIL and the hole transport layer HTL. The hole buffer layer may compensate for an optical resonance distance according to the wavelength of light emitted from the emission layer EML and thereby increase light emission efficiency. Materials included in the hole transport region HTR may be used as materials included in the hole buffer layer. The electron blocking layer EBL is a layer that prevents or reduces the injection of electrons from the electron transport region ETR to the hole transport region HTR.

The emission layer EML is provided on the hole transport region HTR. The thickness of the emission layer EML may be, for example, from about 100 Å to about 1,000 Å, or about 100 Å to about 300 Å. The emission layer EML may have a single layer formed using a single material, a single layer formed using a plurality of different materials, or a multilayer structure having a plurality of layers formed using a plurality of different materials.

In the organic electroluminescence device 10 of an embodiment, the emission layer EML may include a first host, a second host, a first dopant, and a second dopant.

In the present description, the term "substituted or unsubstituted" corresponds to substituted or unsubstituted with at least one substituent selected from the group consisting of a deuterium atom, a halogen atom, a cyano group, a nitro group, an amino group, a silyl group, an oxy group, a thio group, a sulfinyl group, a sulfonyl group, a carbonyl group, a boron group, a phosphine oxide group, a phosphine sulfide group, an alkyl group, an alkenyl group, an alkoxy group, a hydrocarbon ring group, an aryl group, and a hetero aryl group. In addition, each of the substituents may be substituted or unsubstituted. For example, a biphenyl group may be interpreted as an aryl group or a phenyl group substituted with a phenyl group.

In the present description, the term "forming a ring via the combination with an adjacent group" may mean forming a substituted or unsubstituted hydrocarbon ring, or a substituted or unsubstituted heterocyclic ring via the combination with an adjacent group. The hydrocarbon ring may include an aliphatic hydrocarbon ring and/or an aromatic hydrocarbon ring. The heterocyclic ring may include an aliphatic heterocycle and/or an aromatic heterocycle. The hydrocarbon ring and the heterocyclic ring may be a monocyclic ring or a polycyclic ring. In addition, the ring formed via the combination with an adjacent group may be combined with another ring to form a spiro structure.

In the present description, the term "adjacent group" may mean a substituent substituted on an atom which is directly combined with an atom substituted with a corresponding substituent, another substituent substituted on an atom which is substituted with a corresponding substituent, or a substituent sterically positioned at the nearest position to a corresponding substituent. For example, in 1,2-dimethylbenzene, the two methyl groups may be interpreted as "adjacent groups" to each other, and in 1,2-diethylcyclopentane, the two ethyl groups may be interpreted as "adjacent groups" to each other.

In the present description, examples of the halogen atom may include a fluorine atom, a chlorine atom, a bromine atom, or an iodine atom.

In the present description, the alkyl may be a linear, branched or cyclic type (e.g., a linear, branched, or cyclic alkyl group). The number of carbon atoms of the alkyl may be 1 to 50, 1 to 30, 1 to 20, 1 to 10, or 1 to 6. Examples of the alkyl may include methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldodecyl, 2-octyldodecyl, n-tridecyl, n-tetradecyl, n-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyleicosyl, 2-butyleicosyl, 2-hexyleicosyl, 2-octyleicosyl, n-henicosyl, n-docosyl, n-tricosyl, n-tetracosyl, n-pentacosyl, n-hexacosyl, n-heptacosyl, n-octacosyl, n-nonacosyl, n-triacontyl, etc., without limitation.

In the present description, the term "hydrocarbon ring group" means an optional functional group or substituent derived from an aliphatic hydrocarbon ring. The hydrocarbon ring group may include a saturated hydrocarbon ring of 5 to 20 carbon atoms for forming a ring.

In the present description, the term "aryl group" means an optional functional group or substituent derived from an aromatic hydrocarbon ring. The aryl group may be a monocyclic aryl group or a polycyclic aryl group. The number of carbon atoms for forming a ring in the aryl group may be 6 to 30, 6 to 20, or 6 to 15. Examples of the aryl group may include phenyl, naphthyl, fluorenyl, anthracenyl, phenanthryl, biphenyl, terphenyl, quaterphenyl, quinqphenyl, sexiphenyl, triphenylenyl, pyrenyl, benzofluoranthenyl, chrysenyl, etc., without limitation.

In the present description, the fluorenyl group may be substituted, and two substituents of the fluorenyl group may be combined with each other to form a spiro structure. Examples of a substituted fluorenyl group are as follows. However, embodiments of the present disclosure are not limited thereto.

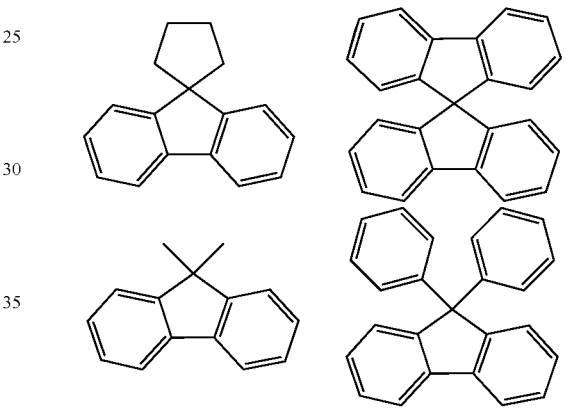

In the present description, the heteroaryl group may be a heteroaryl group including at least one of B, O, N, P, Si, Se or S as a heteroatom for forming a ring. If the heteroaryl group includes two or more heteroatoms, the two or more heteroatoms may be the same or different. The heteroaryl group may be a monocyclic heterocycle or a polycyclic heterocycle. The number of carbon atoms for forming a ring of the heteroaryl group may be 2 to 30, 2 to 20, or 2 to 10. Examples of the heteroaryl may include thiophene group, furan group, pyrrole group, imidazole group, oxazole group, oxadiazole group, triazole group, pyridine group, bipyridine group, pyrimidine group, triazine group, triazole group, acridyl group, pyridazine group, pyrazinyl group, quinoline group, quinazoline group, quinoxaline group, phenoxazine group, phthalazine group, pyrido pyrimidine group, pyrido pyrazine group, pyrazino pyrazine group, isoquinoline group, indole group, carbazole group, N-arylcarbazole group, N-heteroarylcarbazole group, N-alkylcarbazole group, benzoxazole group, benzoimidazole group, benzothiazole group, benzocarbazole group, benzothiophene group, dibenzothiophene group, thienothiophene group, benzofuran group, phenanthroline group, thiazole group, isooxazole group, oxadiazole group, thiadiazole group, phenothiazine group, dibenzosilole group, dibenzofuran group, etc., without limitation.

In the present description, the explanation of the aryl group may be applied to the arylene group except that the arylene group is a divalent group. The explanation of the heteroaryl group may be applied to the heteroarylene group except that the heteroarylene group is a divalent group.

In the present description, the term "silyl group" includes an alkyl silyl group and an aryl silyl group. Examples of the silyl group may include trimethylsilyl, triethylsilyl, t-butyldimethylsilyl, vinyldimethylsilyl, propyldimethylsilyl, triphenylsilyl, diphenylsilyl, phenylsilyl, etc. However, embodiments of the present disclosure are not limited thereto.

In the present description, the number of carbon atoms of the carbonyl group is not specifically limited, but may be 1 to 40, 1 to 30, or 1 to 20. For example, the carbonyl group may have any of the structures below, but is not limited thereto.

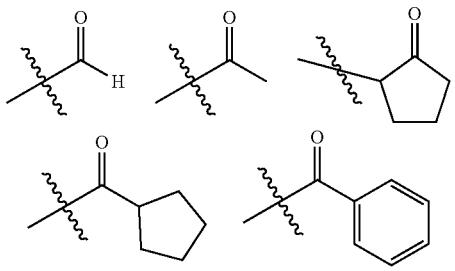

In the present description, the symbol

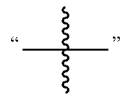

means a position to be connected or identifies a connection to another group.

In the present description, the number of carbon atoms of the sulfonyl group is not specifically limited, but may be 1 to 30. The sulfonyl group may include an alkyl sulfonyl group and/or an aryl sulfonyl group.

In the present description, the number of carbon atoms of the phosphonyl group is not specifically limited, but may be 1 to 30. The phosphonyl group may include an alkyl phosphonyl group and/or an aryl phosphonyl group.

In the present description, the thio group may include an alkyl thio group and/or an aryl thio group.

In the present description, the oxy group may include an alkoxy group and/or an aryl oxy group. The alkoxy group may be a linear chain, a branched chain, or a cyclic chain (e.g., a linear, branched, or cyclic alkoxy group). The number of carbon atoms of the alkoxy group is not specifically limited, but may be 1 to 20, or 1 to 10. Examples of the oxy group may include methoxy, ethoxy, n-propoxy, isopropoxy, butoxy, pentyloxy, hexyloxy, octyloxy, nonyloxy, decyloxy, benzyloxy, etc., without limitation.

In the present description, the boron group includes an alkyl boron group and an aryl boron group. Examples of the boron group may include a trimethylboron group, a triethylboron group, a t-butyldimethylboron group, a triphenylboron group, a diphenylboron group, a phenylboron group, etc., without limitation.

In the description, the alkenyl group may be a linear chain or a branched chain (e.g., a linear alkenyl group, or a branched alkenyl group). The number of carbon atoms of the alkenyl group is not specifically limited, but may be 2 to 30, 2 to 20, or 2 to 10. Examples of the alkenyl group may include a vinyl group, a 1-butenyl group, a 1-pentenyl group, a 1,3-butadienyl aryl group, a styrenyl group, a styrylvinyl group, etc., without limitation.

In the description, the number of carbon atoms of the amine group is not specifically limited, but may be 1 to 30. The amine group may include an alkyl amine group and an aryl amine group. Examples of the amine group may include a methylamine group, a dimethylamine group, a phenylamine group, a diphenylamine group, a naphthylamine group, a 9-methyl-anthracenylamine group, a diphenylamine group, etc., without limitation.

In the description, the alkyl group in an alkylthio group, alkylsulfoxy group, alkyl phosphonyl group, alkoxy group, alkylamino group, alkyl boron group, alkyl silyl group, and alkyl amine group is the same as the examples of the above-described alkyl group.

In the description, the aryl group in an aryloxy group, arylthiol group, arylsulfoxy group, aryl phosphonyl group, arylamino group, aryl boron group, aryl silyl group, and aryl amine group is the same as the examples of the above-described aryl group.

In the description, a direct linkage may mean a single bond.

The emission layer EML may further include any suitable material available in the art as a host material. For example, the emission layer EML may include as a host material, at least one selected from bis[2-(diphenylphosphino)phenyl] ether oxide (DPEPO), 4,4'-bis(carbazol-9-yl) biphenyl (CBP), 1,3-bis(carbazol-9-yl)benzene (mCP), 2,8-bis(diphenylphosphoryl)dibenzo[b,d]furan (PPF), 4,4',4"-tris(carbazol-9-yl)-triphenylamine (TCTA) and 1,3,5-tris(N-phenylbenzimidazole-2-yl)benzene (TPBi).

For example, tris(8-hydroxyquinolino)aluminum (Alq3), 4,4'-bis(N-carbazolyl)-1,1'-biphenyl (CBP), poly(N-vinylcarbazole) (PVK), 9,10-di(naphthalene-2-yl)anthracene (ADN), 4,4',4"-tris(carbazol-9-yl)-triphenylamine (TCTA), 1,3,5-tris(N-phenylbenzimidazole-2-yl)benzene (TPBi), 2-tert-butyl-9,10-di(naphth-2-yl)anthracene (TBADN), distyrylarylene (DSA), 4,4'-bis(9-carbazolyl)-2,2'-dimethylbiphenyl (CDBP), 2-methyl-9,10-bis(naphthalen-2-yl)anthracene (MADN), bis[2-(diphenylphosphino)phenyl]ether oxide (DPEPO), hexaphenyl cyclotriphosphazene (CP1), 1,4-bis(triphenylsilyl)benzene (UGH2), hexaphenylcyclotrisiloxane (DPSiO3), octaphenylcyclotetra siloxane (DPSiO4), 2,8-bis(diphenylphosphoryl)dibenzofuran (PPF), etc. may be used as the host material, but embodiments of the present disclosure are not limited thereto.

In an embodiment, the emission layer EML may include any suitable dopant material such as, for example, styryl derivatives (for example, 1,4-bis[2-(3-N-ethylcarbazoryl) vinyl]benzene (BCzVB), 4-(di-p-tolylamino)-4'-[(di-p-tolylamino)styryl]stilbene (DPAVB), and N-(4-((E)-2-(6-((E)-4-(diphenylamino)styryl)naphthalen-2-yl)vinyl)phenyl)-N-phenylbenzenamine (N-BDAVBi)), perylene and derivatives thereof (for example, 2,5,8,11-tetra-t-butylperylene (TBP)), pyrene and derivatives thereof (for example, 1,1'-dipyrene, 1,4-dipyrenylbenzene, 1,4-bis(N, N-diphenylamino) pyrene), etc.

The first host may be represented by the following Formula 1:

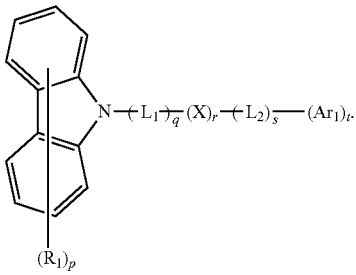

Formula 1

In Formula 1, $R_1$ is a hydrogen atom, a deuterium atom, a halogen atom, a cyano group, a silyl group, a phosphonyl group, an alkyl group, a cycloalkyl group, an aryl group, or a heteroaryl group, or may be combined with an adjacent group to form a ring.

The silyl group may be a substituted or unsubstituted silyl group, the phosphonyl group may be a substituted or unsubstituted phosphonyl group, the alkyl group may be a substituted or unsubstituted alkyl group of 1 to 20 carbon atoms, the cycloalkyl group may be a substituted or unsubstituted cycloalkyl group of 3 to 30 carbon atoms, the aryl group may be a substituted or unsubstituted aryl group of 6 to 30 carbon atoms for forming a ring, and the heteroaryl group may be a substituted or unsubstituted heteroaryl group of 2 to 30 carbon atoms for forming a ring.

In some embodiments, the alkyl group may be a methyl group, and the phosphonyl group may be an aryl phosphonyl group.

The heteroaryl group may be a substituted or unsubstituted dibenzoheterocycle group, and, for example, may be a substituted or unsubstituted carbazole group.

In embodiments where $R_1$ is combined with an adjacent group to form a ring, a substituted or unsubstituted hydrocarbon ring or a substituted or unsubstituted heterocycle may be formed. The hydrocarbon ring may include an aliphatic hydrocarbon ring or an aromatic hydrocarbon ring. The heterocycle may include an aliphatic heterocycle or an aromatic heterocycle. For example, the carbazole group in Formula 1 may be a substituted or unsubstituted indolocarbazole group in which an indole group-condensed, a substituted or unsubstituted benzofurocarbazole group in which a benzofuran group-condensed, or a substituted or unsubstituted benzothienocarbazole group in which a benzothio group-condensed.

$L_1$ and $L_2$ may each independently be a direct linkage, an arylene group, or a heteroarylene group. The arylene group may be a substituted or unsubstituted arylene group of 6 to 30 carbon atoms for forming a ring, and the heteroarylene group may be a substituted or unsubstituted heteroarylene group of 2 to 30 carbon atoms for forming a ring.

In embodiments where $L_1$ or $L_2$ are a substituted or unsubstituted heteroarylene group, N, O, S, Si or Se may be included as a heteroatom. In some embodiments, $L_1$ or $L_2$ may be a substituted or unsubstituted divalent dibenzoheterocycle group including N, O, S, Si or Se as a heteroatom.

In some embodiments, $L_1$ and $L_2$ may each independently be a direct linkage, a substituted or unsubstituted phenylene group, a substituted or unsubstituted divalent biphenyl group, a substituted or unsubstituted divalent triphenyl group, a substituted or unsubstituted divalent naphthyl group, a substituted or unsubstituted divalent pyridinyl group, or a substituted or unsubstituted divalent phenanthrolinyl group.

$L_1$ and $L_2$ may each independently be substituted with a deuterium atom, a halogen atom, a cyano group, a substituted or unsubstituted boron group, a substituted or unsubstituted sulfonyl group, a substituted or unsubstituted alkyl group of 1 to 20 carbon atoms, a substituted or unsubstituted aryl group of 6 to 30 carbon atoms for forming a ring, or a substituted or unsubstituted heteroaryl group of 6 to 30 carbon atoms for forming a ring.

For example, in embodiments where $L_1$ or $L_2$ is substituted with a boron group, the substituent may be an alkyl boron group or an aryl boron group, in embodiments where $L_1$ or $L_2$ is substituted with a sulfonyl group, the substituent may be an aryl sulfonyl group, and in embodiments where $L_1$ or $L_2$ is substituted with a heteroaryl group, the substituent may be a dibenzoheterocycle group represented by Formula A.

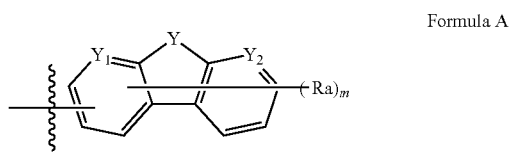

Formula A

In Formula A, Y may be $CR_aR_b$, $NR_a$, O, S, $SiR_aR_b$ or $SeR_aR_b$. $R_a$ and $R_b$ may be a substituted or unsubstituted alkyl group of 1 to 20 carbon atoms, a substituted or unsubstituted aryl group of 2 to 30 carbon atoms for forming a ring, or a substituted or unsubstituted heteroaryl group of 6 to 30 carbon atoms for forming a ring. $Y_1$ and $Y_2$ may each independently be CH or N. "m" may be an integer of 0 to 6.

In Formula 1, X may be a direct linkage, a substituted or unsubstituted divalent silyl group, or a substituted or unsubstituted divalent thioxanthene group.

$Ar_1$ may be a substituted or unsubstituted aryl group of 6 to 30 carbon atoms for forming a ring, or a substituted or unsubstituted heteroaryl group of 2 to 30 carbon atoms for forming a ring. In embodiments where $Ar_1$ is an aryl group, the aryl group may be a substituted or unsubstituted triphenylene group.

"p" may be an integer of 0 to 8. For example, "p" may be 0 or 1. "q" and "s" may each independently be an integer of 0 to 3, where at least one selected from "q" and "s" may be 1 or more. "r" may be 0 or 1. "t" may be an integer of 0 to 3. For example, "t" may be 0, 1 or 2.

Formula 1 may be represented by the following Formula 1-1:

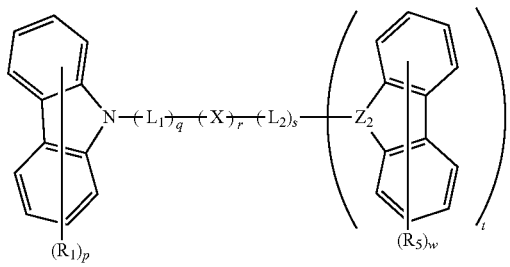

[Formula 1-1]

In Formula 1-1, $Z_2$ may be N or P=O.

$R_5$ may be a hydrogen atom, a deuterium atom, a halogen atom, a cyano group, a silyl group, a phosphonyl group, an alkyl group, a cycloalkyl group, an aryl group, or a heteroaryl group, or combined with an adjacent group to form a ring.

The silyl group may be a substituted or unsubstituted silyl group, the phosphonyl group may be a substituted or unsubstituted phosphonyl group, the alkyl group may be a substituted or unsubstituted alkyl group of 1 to 20 carbon atoms, the cycloalkyl group may be a substituted or unsubstituted cycloalkyl group of 3 to 30 carbon atoms. The aryl group may be a substituted or unsubstituted aryl group of 6 to 30 carbon atoms for forming a ring, and the heteroaryl group may be a substituted or unsubstituted heteroaryl group of 2 to 30 carbon atoms for forming a ring.

"w" may be an integer of 0 to 8. For example, "w" may be 0 or 1.

$R_1$, $L_1$, $L_2$, X, "p", "q", "r", "s", and "t" may be the same as defined with respect to Formula 1.

Formula 1 may be represented by the following Formula 1-3, and Formula 1-1 may be represented by the following Formula 1-4:

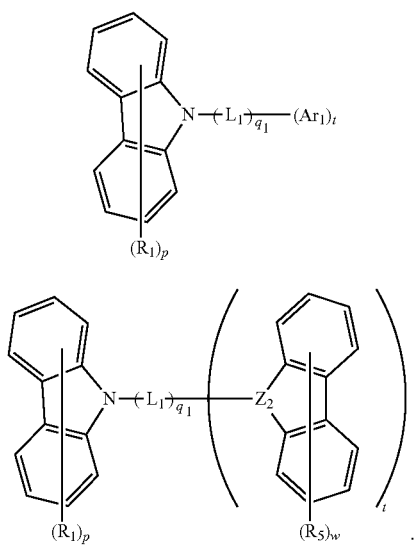

Formula 1-3

Formula 1-4

Formula 1-3 and Formula 1-4 are embodied chemical formula of Formula 1 and Formula 1-1 where "r" and "s" are 0. In Formula 1-3 and Formula 1-4, "$q_1$" may be an integer of 1 to 3. $R_1$, $R_5$, $L_1$, $Ar_1$, "p", "t" and "w" may be the same as defined with respect to Formula 1 and Formula 1-1.

For example, the first host may include at least one selected from the compounds represented in the following Compound Group 1:

Compound Group 1

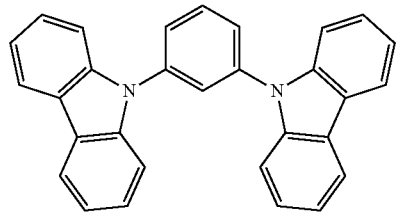

H1-1

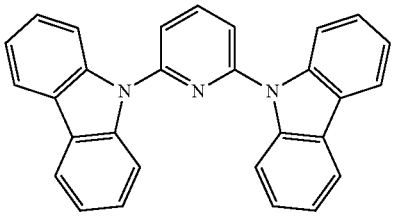

H1-2

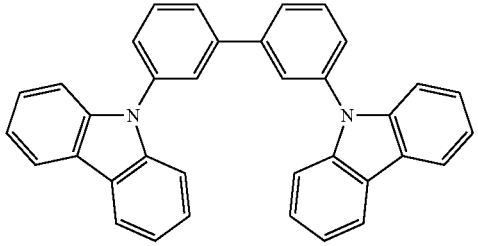

H1-3

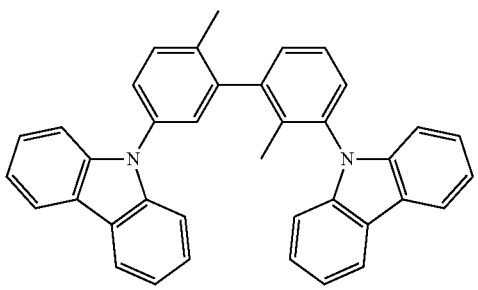

H1-4

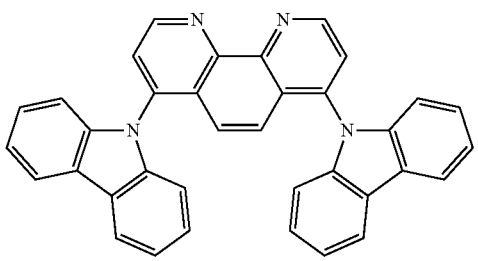

H1-5

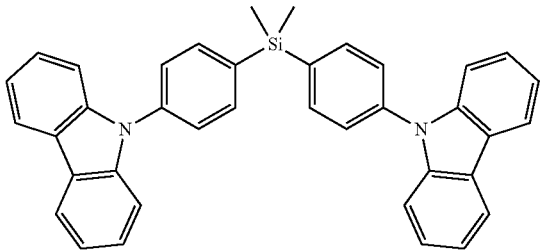

H1-6

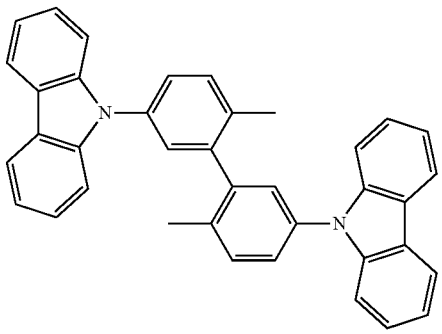

H1-7

H1-8
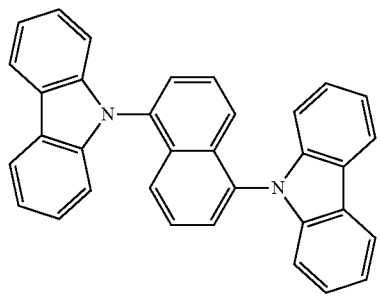
H1-9
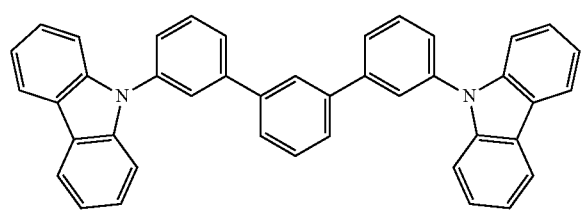
H1-10
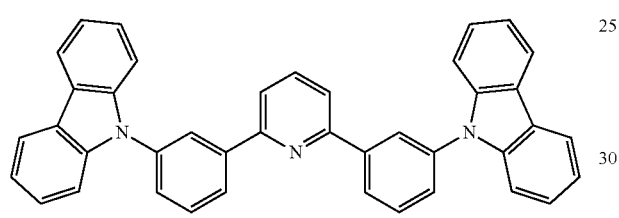
H1-11
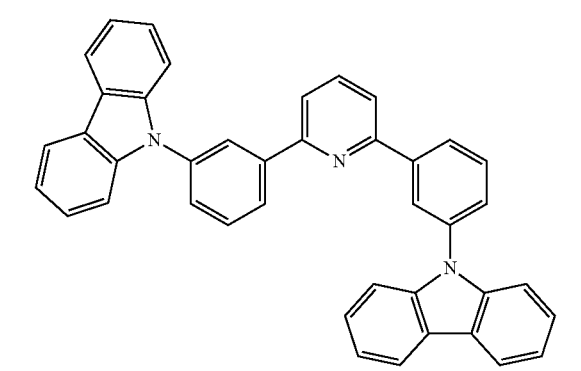
H1-12
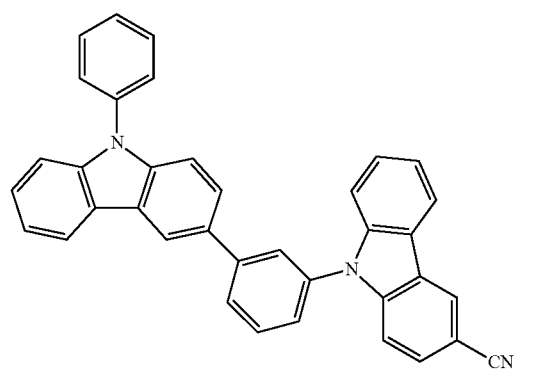
H1-13
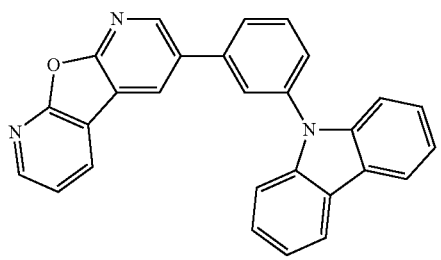
H1-14
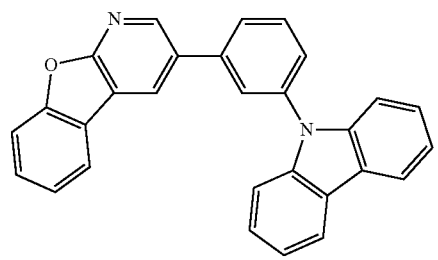
H1-15
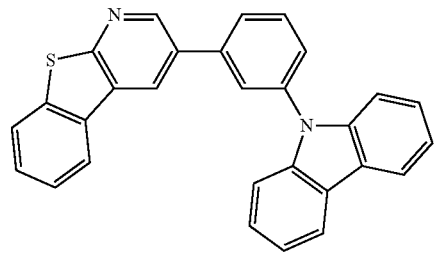
H1-16
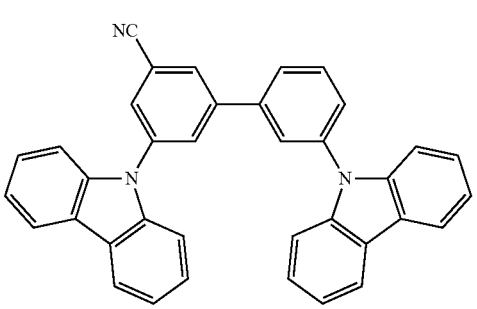
H1-17
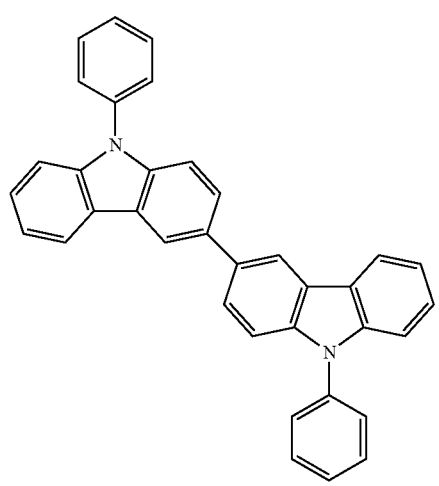

H1-18
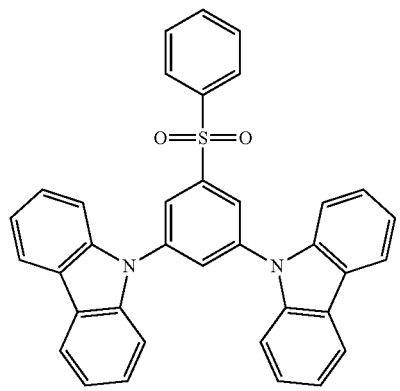

H1-19
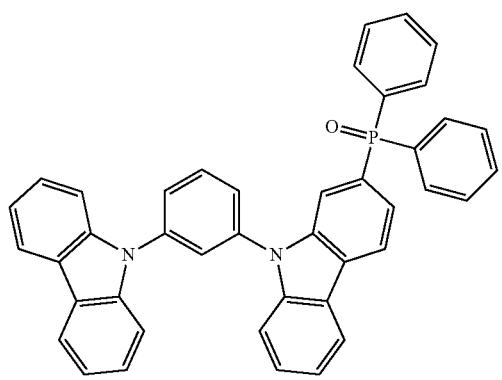

H1-20
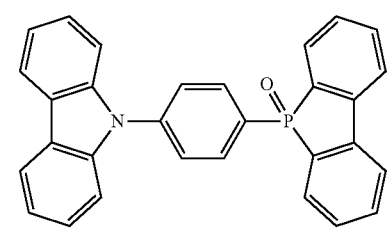

H1-21
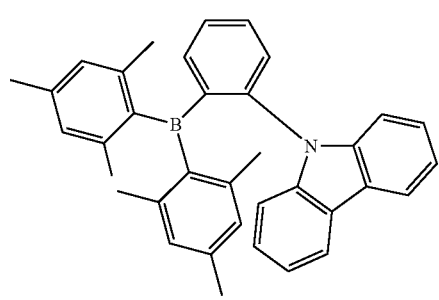

H1-22
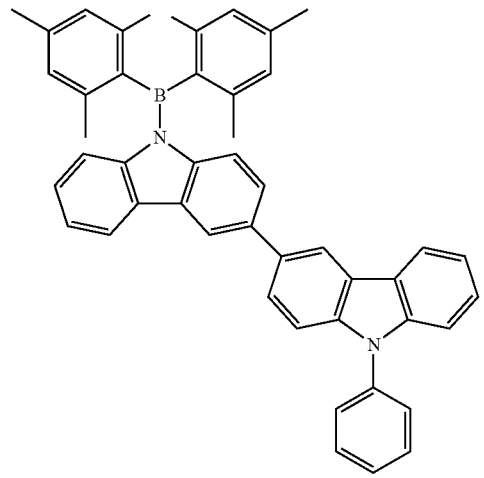

H1-23
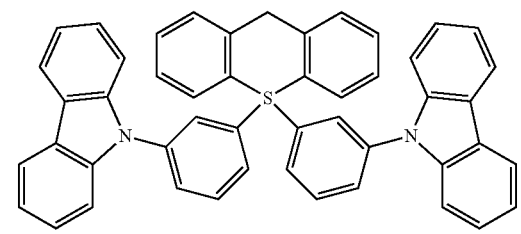

H1-24
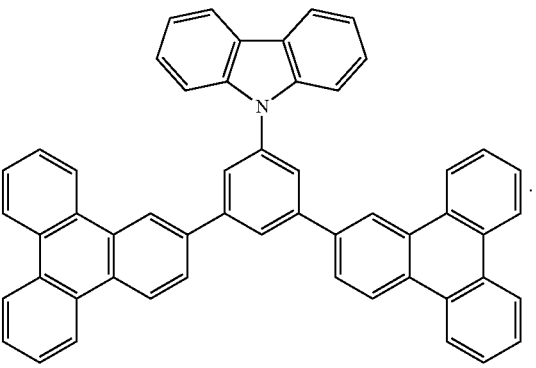

The second host may be different from the first host. The second host may include an aryl group or a heteroaryl group. The aryl group may be a substituted or unsubstituted aryl group of 10 to 80 carbon atoms for forming a ring, and the heteroaryl group may be a substituted or unsubstituted heteroaryl group of 10 to 80 carbon atoms for forming a ring.

In some embodiments, the number of carbon atoms of the aryl group may be 10 to 80, 10 to 70, 10 to 60, or 10 to 40. The aryl group may be substituted with an arylamine group. The aryl group may be a condensed or substituted structure including a plurality of benzene rings. For example, the aryl group may include a substituted or unsubstituted naphthyl group, a substituted or unsubstituted phenanthryl group, a substituted or unsubstituted triphenylene group, a substituted or unsubstituted anthracenyl group, a substituted or unsubstituted fluorenyl group, a substituted or unsubstituted fluoranthenyl group, or a substituted or unsubstituted pyrenyl group. The aryl group may be substituted with a substituted or unsubstituted silyl group or a substituted or unsubstituted phosphonyl group.

In some embodiments, the heteroaryl group may include N, O or S as a heteroatom. The heteroaryl group may include an azine-based compound such as a substituted or unsubstituted pyridine group, a substituted or unsubstituted pyrimidine group, and a substituted or unsubstituted triazine group. The heteroaryl group may include a substituted or unsubstituted thiophene group, a substituted or unsubstituted benzothienoindole group, a substituted or unsubstituted imidazole group, a substituted or unsubstituted oxadiazole group, a substituted or unsubstituted phenanthroline group, or a substituted or unsubstituted dibenzoheterocycle group. For example, the heteroaryl group may include a substituted or unsubstituted carbazole group, a substituted or unsubstituted thiophene group, a substituted or unsubstituted dibenzofuran group, and a substituted or unsubstituted acridine group. The dibenzocycle group of the dibenzohetero group may include a heteroatom.

The second host may include at least one selected from the compounds represented in the following Compound Group 2:

Compound Group 2

H2-1

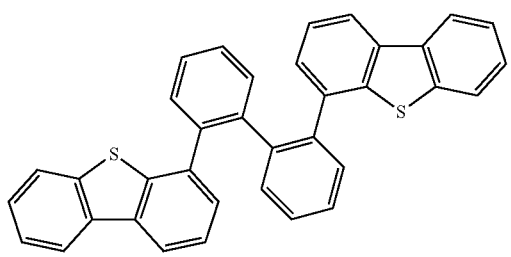

H2-2

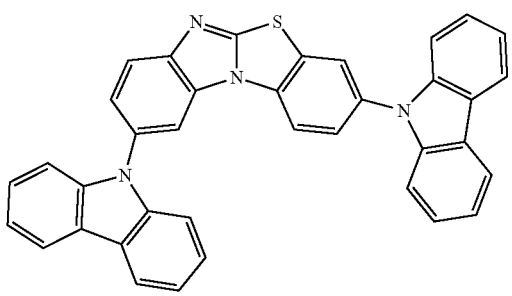

H2-3

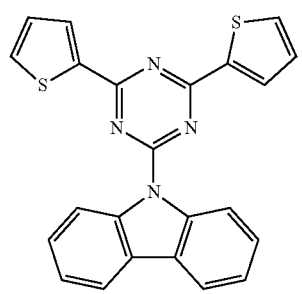

-continued

H2-4

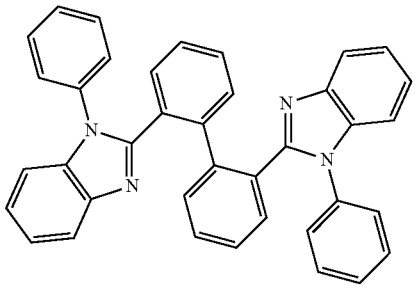

H2-5

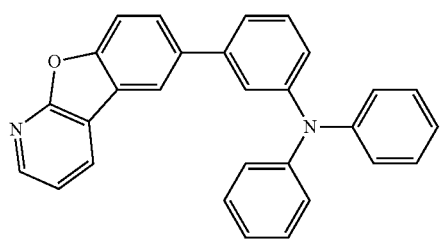

H2-6

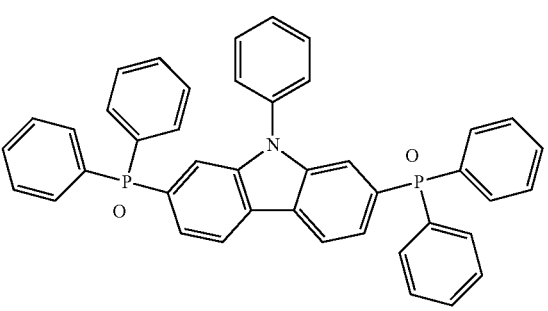

H2-7

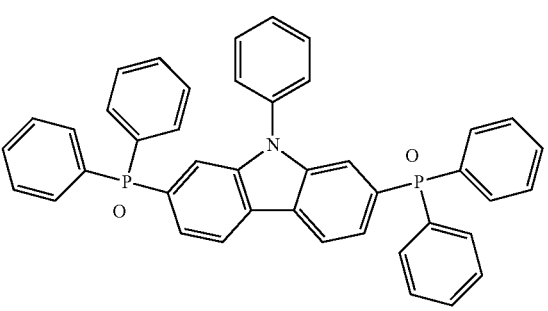

H2-8

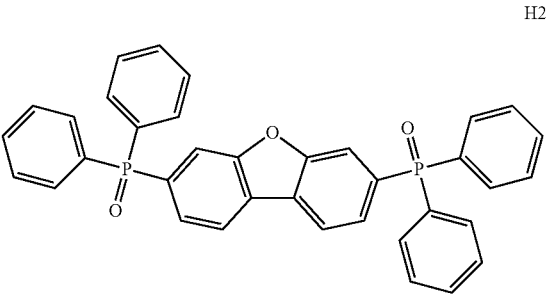

H2-9
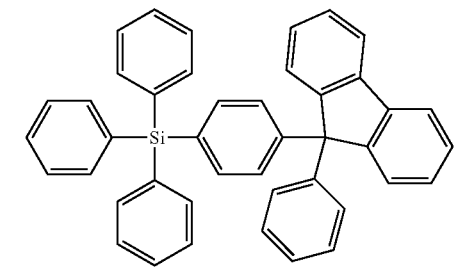
H2-10
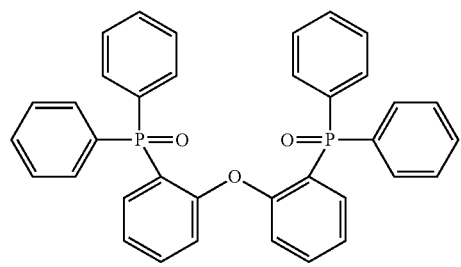
H2-11
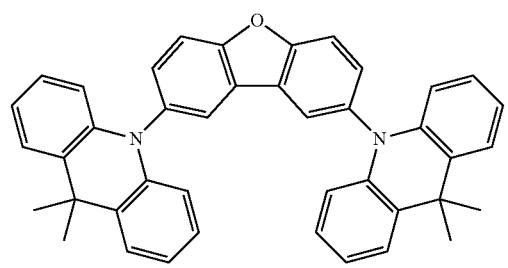
H2-12
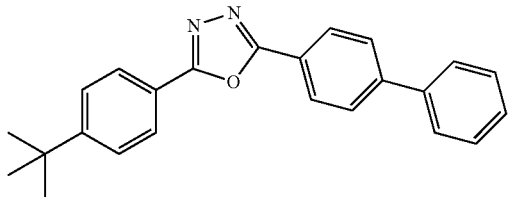
H2-13
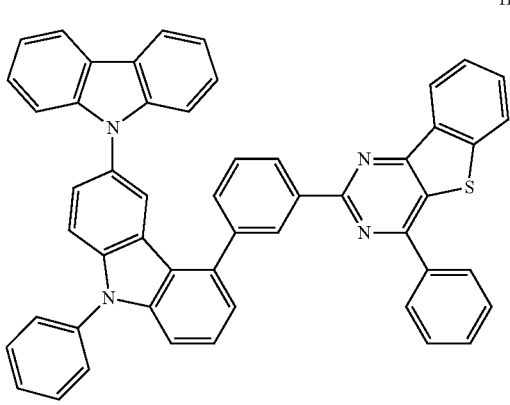
H2-14
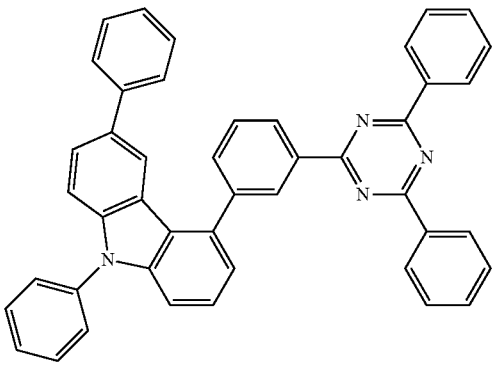
H2-15
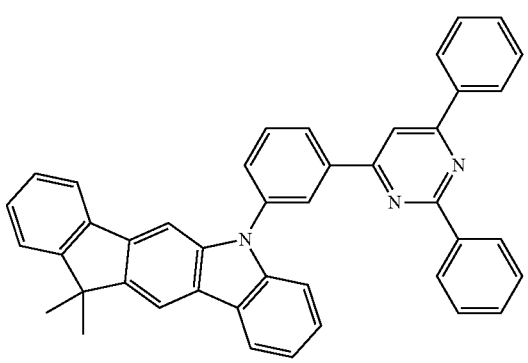
H2-16
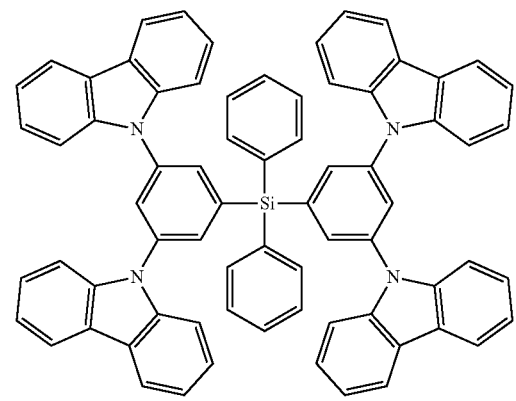

H2-17
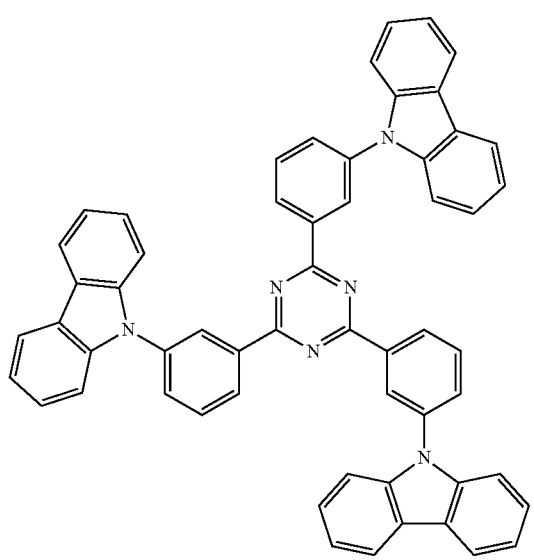

H2-18
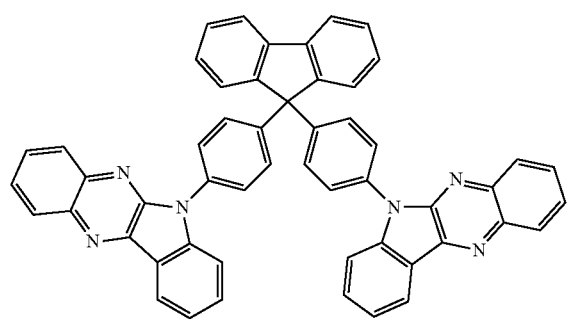

H2-19
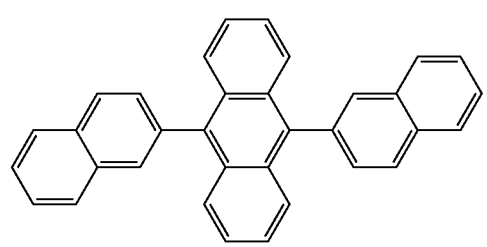

H2-20
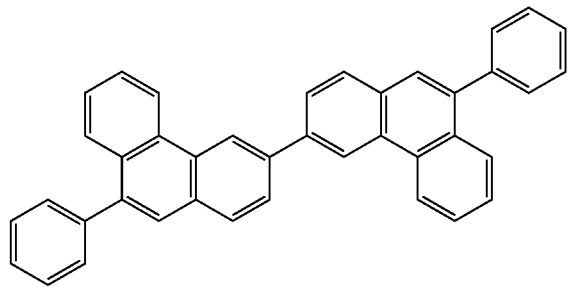

H2-21
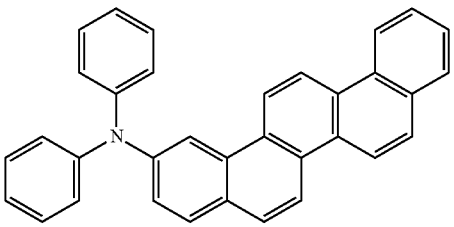

H2-22
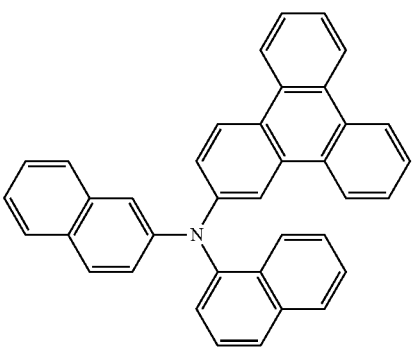

H2-23
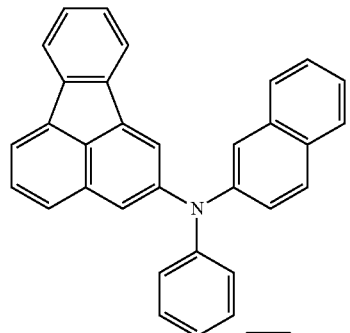

H2-24
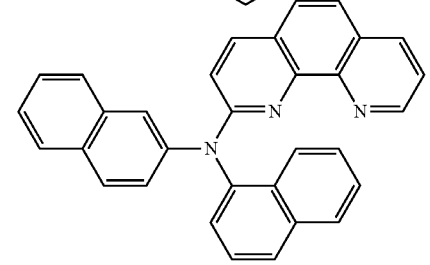

The organic electroluminescence device 10 of an embodiment may use the first host which is a hole transport host and the second host which is an electron transport host as suitable hosts, and the charge balance of the emission layer EML may be better than when using a single host. Accordingly, the deterioration of the emission layer EML may be restrained or reduced and the long life of a device may be achieved. Also, the leakage of electrons and holes to organic layers other than the emission layer EML may be prevented or reduced, and excellent emission efficiency may be achieved.

The first host and the second host may have various suitable mixing ratios. Hereinafter, the term "mixing ratio of the first host and the second host" refers to a weight ratio.

The first host and the second host may have, for example, a ratio of about 3:7 to about 7:3 based on the total weight of the host. Embodiments of the present disclosure is not limited thereto, but in embodiments where the first host and the second host have the mixing ratio of about 3:7 to about 7:3, suitable or satisfactory light-emitting properties of emission efficiency and life may be achieved.

The first dopant may be a thermally activated delayed fluorescence material. For example, the first dopant may be a thermally activated delayed fluorescence material having an electron donor and an electron acceptor. A difference between the lowest singlet energy level and the lowest triplet energy level of the first dopant may be about 0.3 eV or less. For example, the difference between the lowest singlet energy level and the lowest triplet energy level of the first dopant may be about 0.2 eV or less or about 0.1 eV or less.

The electron donor of the first dopant may have a negative (−) Hammett substituent constant (σ) value, and the electron acceptor of the first dopant may have a positive (+) Hammett substituent constant (σ) value. In the present description, the negative value of the Hammett substituent constant value means that all the Hammett substituent constant values at para and ortho positions are negative numbers, and the positive value of the Hammett substituent constant value means that all the Hammett substituent constant values at para and ortho positions are positive numbers.

The electron donor of the first dopant may be a substituted or unsubstituted carbazole group, a substituted or unsubstituted indole group, a substituted or unsubstituted acridine group, a substituted or unsubstituted phenoxazine group, a substituted or unsubstituted phenothiazine group, or a substituted or unsubstituted aryl amine group of 6 to 30 carbon atoms for forming a ring. The substituted carbazole group may be a substituted or unsubstituted indolocarbazole group.

The electron acceptor of the first dopant may be a substituted or unsubstituted boron group, a substituted or unsubstituted azole group, a substituted or unsubstituted carbonyl group of 1 to 20 carbon atoms, a substituted or unsubstituted azine group, a substituted or unsubstituted sulfonyl group, an aryl group of 6 to 30 carbon atoms for forming a ring, which is substituted with a cyano group or a trihalomethyl group, or a heteroaryl group of 2 to 30 carbon atoms for forming a ring, which is substituted with a cyano group or a trihalomethyl group. The trihalomethyl group may be a trifluoromethyl group (—CF$_3$). The substituted or unsubstituted azole group may be a substituted or unsubstituted oxadiazole group. The boron group may be a heteroaryl group including an aryl boron group or a boron atom as a heteroatom. The substituted or unsubstituted carbonyl group may be a substituted or unsubstituted aldehyde group or a substituted or unsubstituted ketone group. The azine group may be a substituted or unsubstituted pyridine group, a substituted or unsubstituted pyrimidine group, a substituted or unsubstituted pyrazine group, or a substituted or unsubstituted s-triazine group.

The first dopant may include at least one selected from the compounds represented in the following Compound Group 3:

Compound Group 3

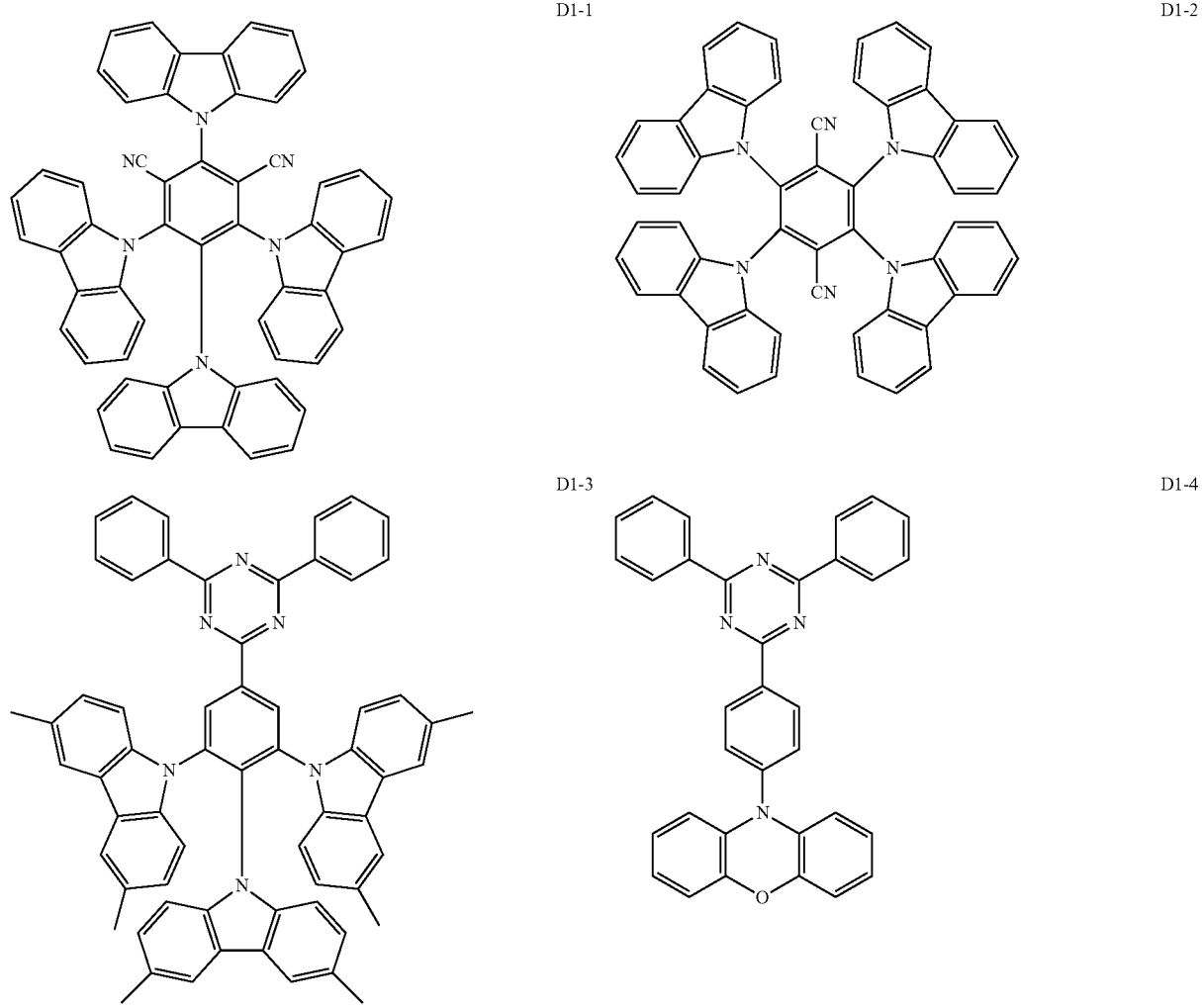

D1-5
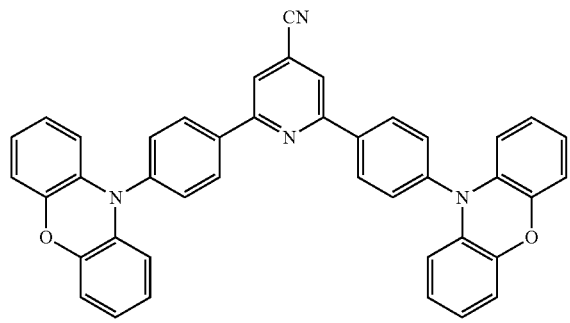
D1-6
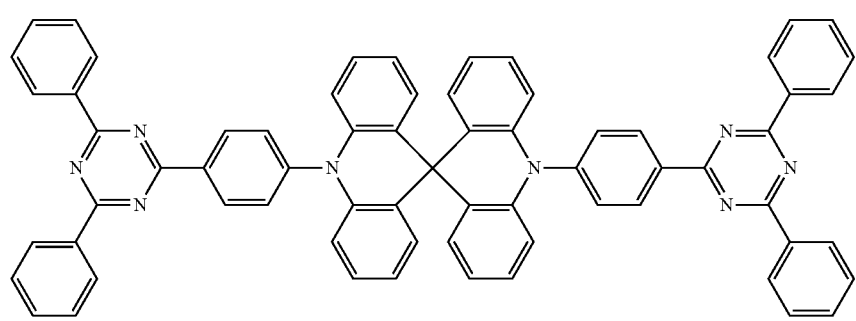
D1-7
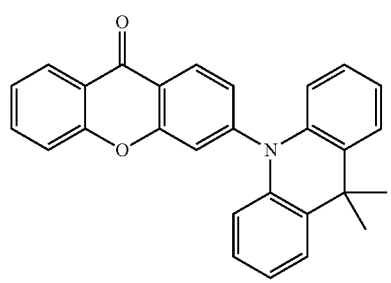
D1-8
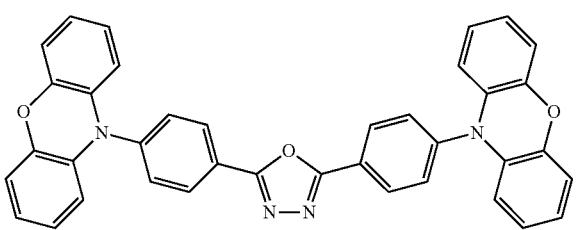
D1-9
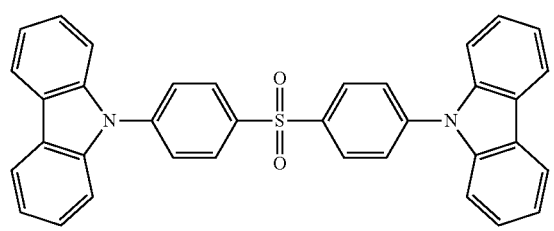
D1-10
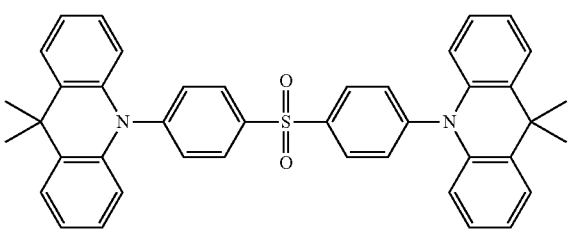

D1-11
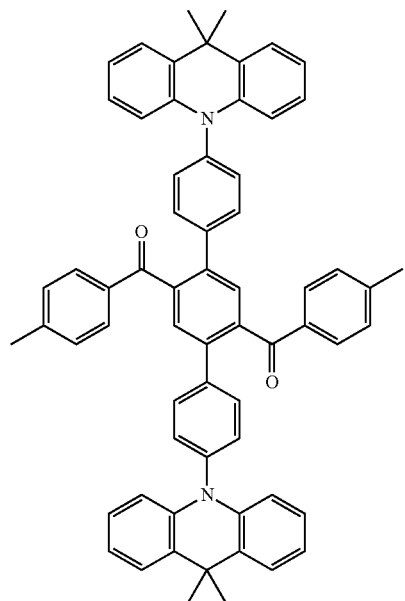
D1-12
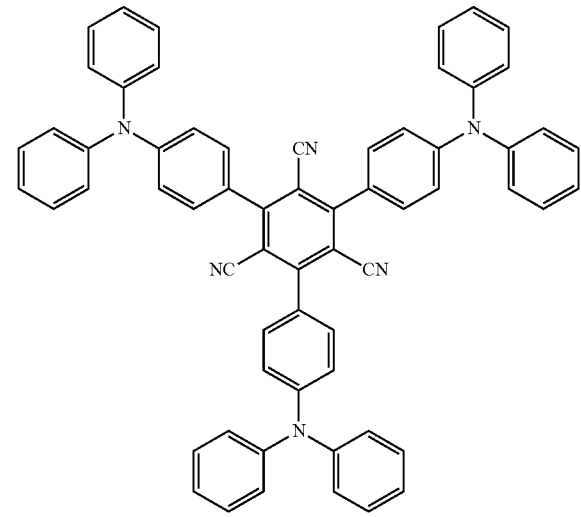
D1-13
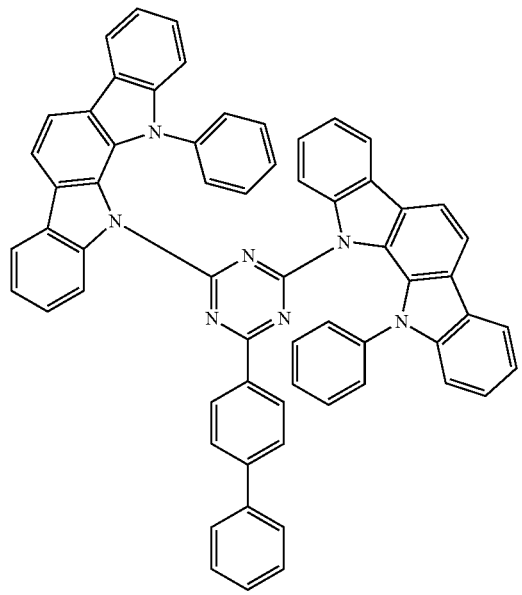
D1-14
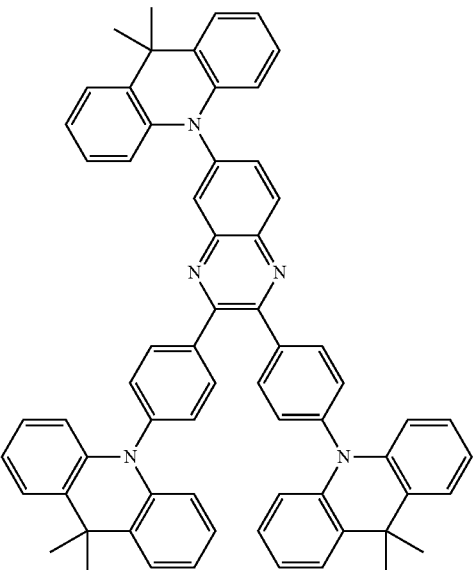
D1-15
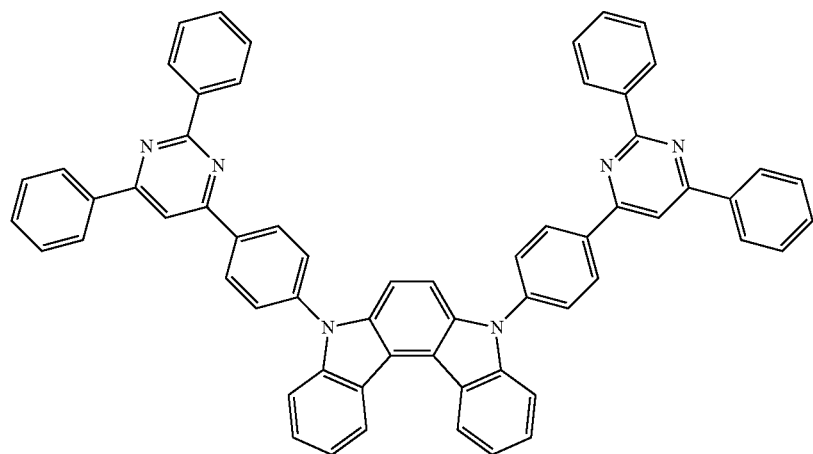

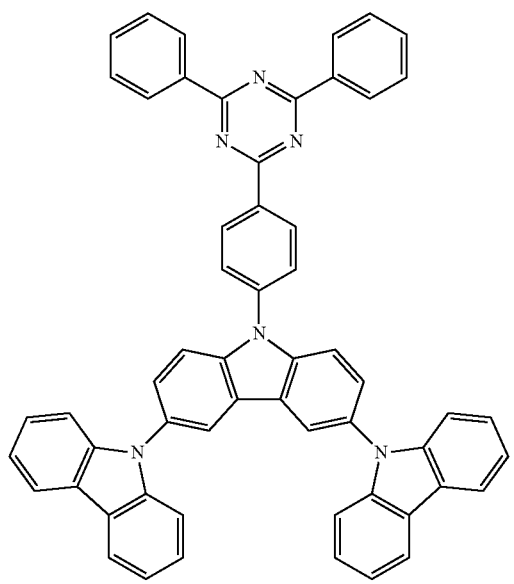
D1-16

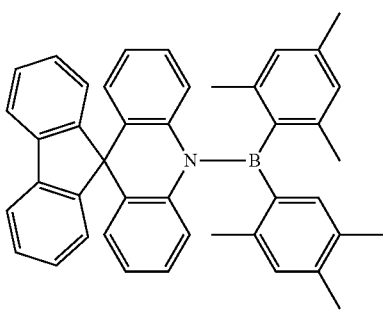
D1-17

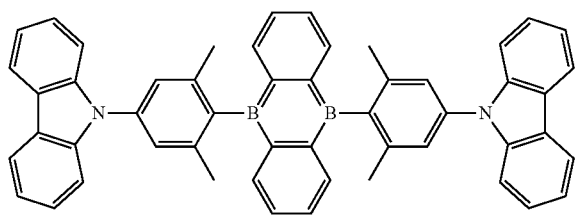
D1-18

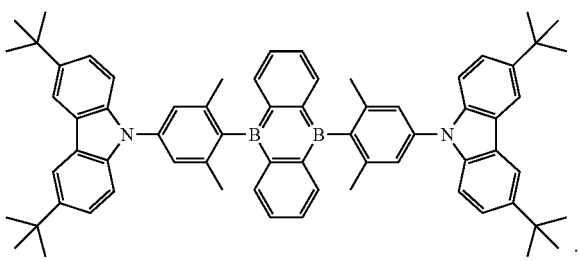
D1-19

The second dopant may be represented by the following Formula 2:

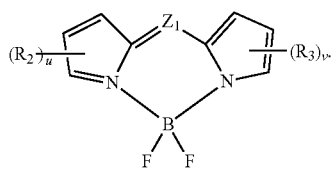
Formula 2

In Formula 2, $Z_1$ may be $CR_4$ or N.

$R_2$ and $R_3$ may each independently be a hydrogen atom, a deuterium atom, a halogen atom, a cyano group, a silyl group, an alkyl group, a cycloalkyl group, an aryl group, or a heteroaryl group, or combined with an adjacent group to form a ring.

The silyl group may be a substituted or unsubstituted silyl group, the alkyl group may be a substituted or unsubstituted alkyl group of 1 to 20 carbon atoms, and the cycloalkyl group may be a substituted or unsubstituted cycloalkyl group of 3 to 30 carbon atoms. The aryl group may be a substituted or unsubstituted aryl group of 6 to 30 carbon atoms for forming a ring, and the heteroaryl group may be a substituted or unsubstituted heteroaryl group of 2 to 30 carbon atoms for forming a ring.

$R_4$ may be an aryl group or a heteroaryl group. The aryl group may be a substituted or unsubstituted aryl group of 6 to 60 carbon atoms for forming a ring, and the heteroaryl group may be a substituted or unsubstituted heteroaryl group of 2 to 60 carbon atoms for forming a ring.

$R_3$ and $R_4$ may be the same or different. For example, $R_3$ and $R_4$ may be the same.

"u" and "v" may each independently be an integer of 0 to 3. For example, "u" and "v" may be 2. If "u" is 2 or more, a plurality of $R_2$ groups may be the same or different. For example, a plurality of $R_2$ groups may be the same. If "v" is 2 or more, a plurality of $R_3$ groups may be the same or different. For example, a plurality of $R_3$ groups may be the same.

Formula 2 may be represented by the following Formula 2-1 or Formula 2-2:

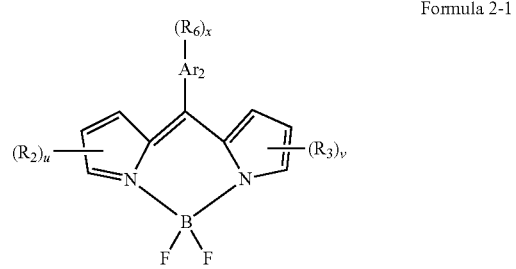
Formula 2-1

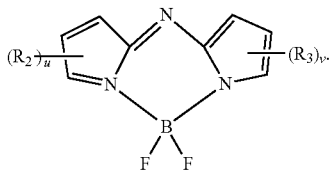

Formula 2-2

Formula 2-1 and Formula 2-2 are embodied formula with respect to $Z_1$.

In Formula 2-1 or Formula 2-2, $Ar_2$ may be an aryl group or a heteroaryl group. The aryl group may be a substituted or unsubstituted aryl group of 6 to 30 carbon atoms for forming a ring, and the heteroaryl group may be a substituted or unsubstituted heteroaryl group of 2 to 30 carbon atoms for forming a ring.

$R_6$ may be a hydrogen atom, a deuterium atom, a halogen atom, a cyano group, a silyl group, an amine group, a boron group, an alkoxy group, an alkyl group, a cycloalkyl group, an aryl group, or a heteroaryl group, or combined with an adjacent group to form a ring. The silyl group may be a substituted or unsubstituted silyl group, the amine group may be a substituted or unsubstituted amine group of 1 to 30 carbon atoms, the boron group may be a substituted or unsubstituted boron group, and the alkoxy group may be a substituted or unsubstituted alkoxy group of 1 to 20 carbon atoms. The alkyl group may be a substituted or unsubstituted alkyl group of 1 to 20 carbon atoms, the cycloalkyl group may be a substituted or unsubstituted cycloalkyl group of 3 to 30 carbon atoms, the aryl group may be a substituted or unsubstituted aryl group of 6 to 30 carbon atoms for forming a ring, or the heteroaryl group may be a substituted or unsubstituted heteroaryl group of 2 to 30 carbon atoms for forming a ring.

In some embodiments, the alkoxy group may be a methoxy group. The alkyl group may be a methyl group, an isopropyl group or a t-butyl group. The aryl group may be a substituted or unsubstituted phenyl group. The amine group may be an amine group of 1 to 30 carbon atoms, which is substituted with at least one of an aryl group or a heteroaryl group. The boron group may be an aryl boron group. The heteroaryl group may be a substituted or unsubstituted carbazole group.

"x" may be an integer of 0 to 3. For example, "x" may be 0, 1 or 2. $R_2$, $R_3$, "u" and "v" may be the same as defined with respect to Formula 2.

Formula 2-1 may be represented by the following Formula 2-1-1 or Formula 2-1-2:

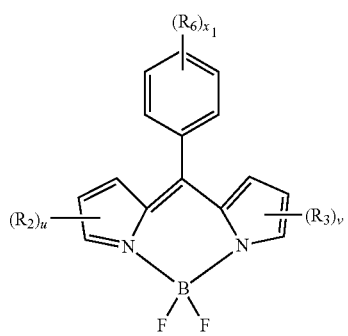

Formula 2-1-1

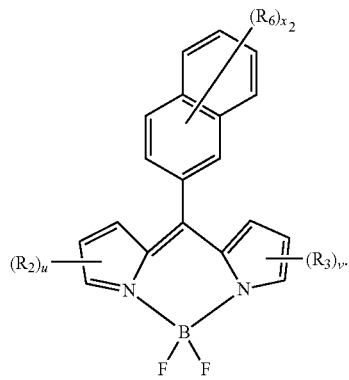

Formula 2-1-2

Formula 2-1-1 and Formula 2-1-2 are Formula 2-1 in which $Ar_2$ is embodied.

In Formula 2-1-1 and Formula 2-1-2, "$x_1$" and "$x_2$" may each independently be an integer of 0 to 3. For example, "$x_1$" and "$x_2$" may each independently be 0, 1 or 2. If "$x_1$" or "$x_2$" is 2 or more, $R_6$ may be the same or different. For example, the plurality of $R_6$ may be the same.

$R_2$, $R_3$, $R_6$, "u", and "v" may be the same as defined with respect to Formula 2-1.

Formula 2 may be represented by the following Formula 2-3 or Formula 2-4:

Formula 2-3

Formula 2-4

Formula 2-3 and Formula 2-4 are Formula 2 in which $R_2$ and $R_3$ are embodied.

In Formula 2-3 and Formula 2-4, $R_{21}$, $R_{22}$, $R_{31}$, and $R_{32}$ may each independently be a deuterium atom, a halogen atom, a cyano group, a silyl group, an alkyl group, a cycloalkyl group, an aryl group, or a heteroaryl group. The silyl group may be a substituted or unsubstituted silyl group, the alkyl group may be a substituted or unsubstituted alkyl group of 1 to 20 carbon atoms, or the cycloalkyl group may be a substituted or unsubstituted cycloalkyl group of 3 to 30 carbon atoms. The aryl group may be a substituted or unsubstituted aryl group of 6 to 30 carbon atoms for forming a ring, or the heteroaryl group may be a substituted or unsubstituted heteroaryl group of 2 to 30 carbon atoms for forming a ring.

A1 and A2 may each independently be a substituted or unsubstituted aryl group of 6 to 30 carbon atoms for forming a ring. $Z_1$ may be the same as defined with respect to Formula 2.

Formula 2-4 may be represented by the following Formula 2-4-1:

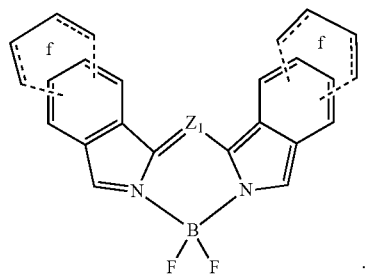

Formula 2-4-1

In Formula 2-4-1, "f" may be 0 or 1. $Z_1$ may be the same as defined with respect to Formula 2-4.

If "f" is 0, a benzene ring is not additionally condensed with (e.g., combined with) Formula 2-4-1, but if "f" is 1, a benzene ring is additionally condensed with (e.g., combined with) each benzene ring of Formula 2-4-1.

The second dopant may include at least one selected from compounds represented in the following Compound Group 4:

Compound Group 4

D2-1

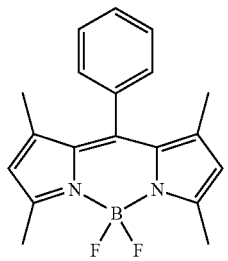

D2-2

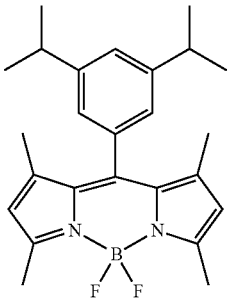

D2-3

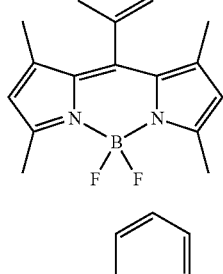

D2-4

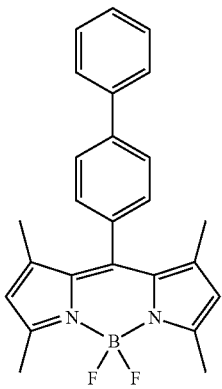

D2-5

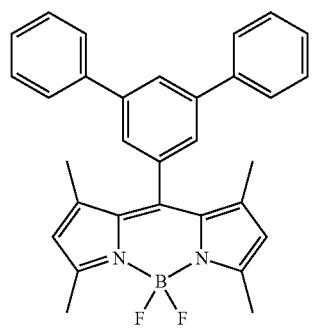

D2-6

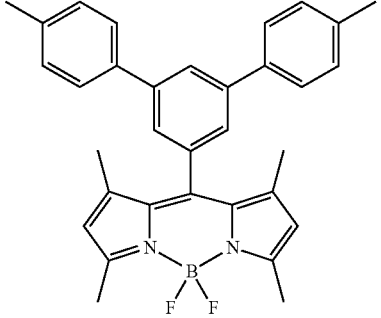

D2-7

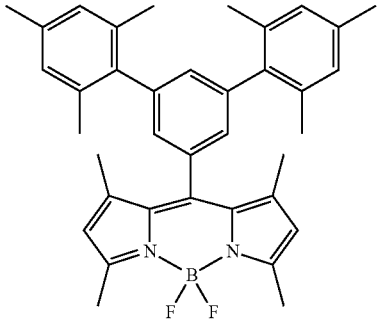

-continued
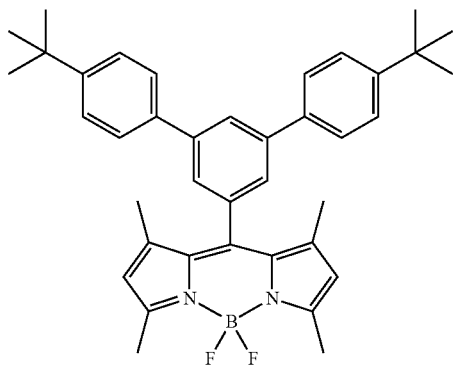
D2-8
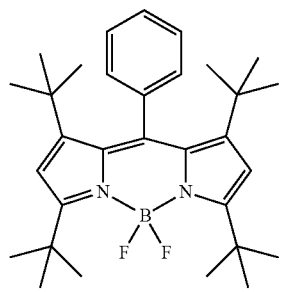
D2-9
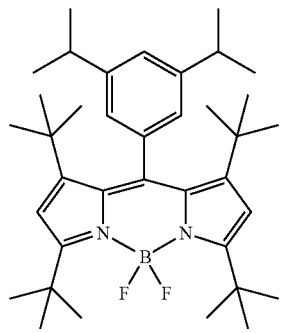
D2-10
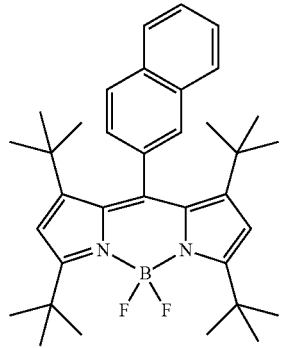
D2-11
-continued
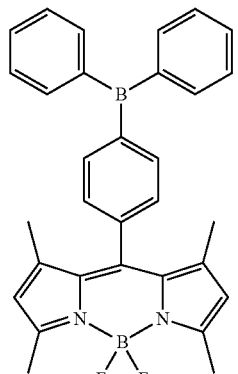
D2-12
D2-13
D2-14
D2-15

-continued
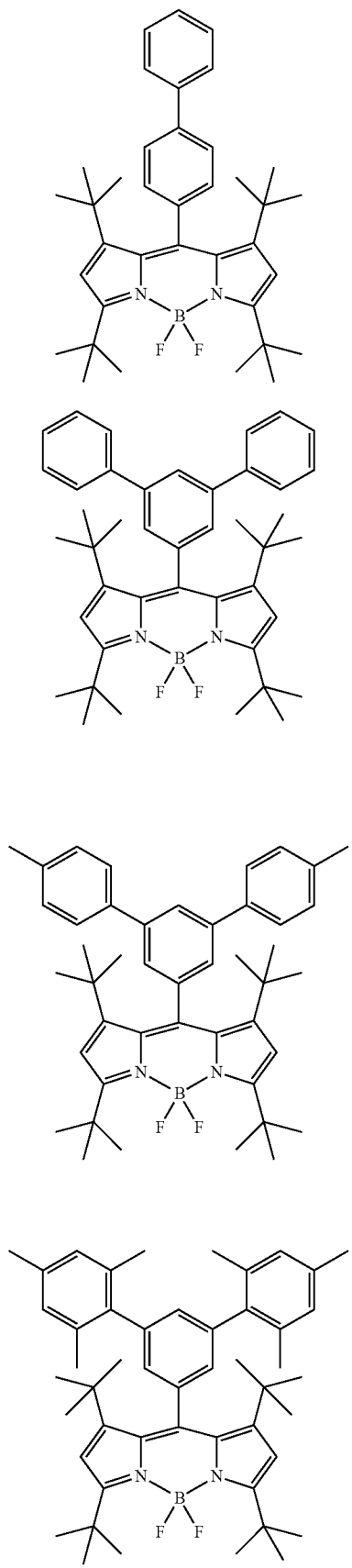
D2-16
D2-17
D2-18
D2-19
-continued
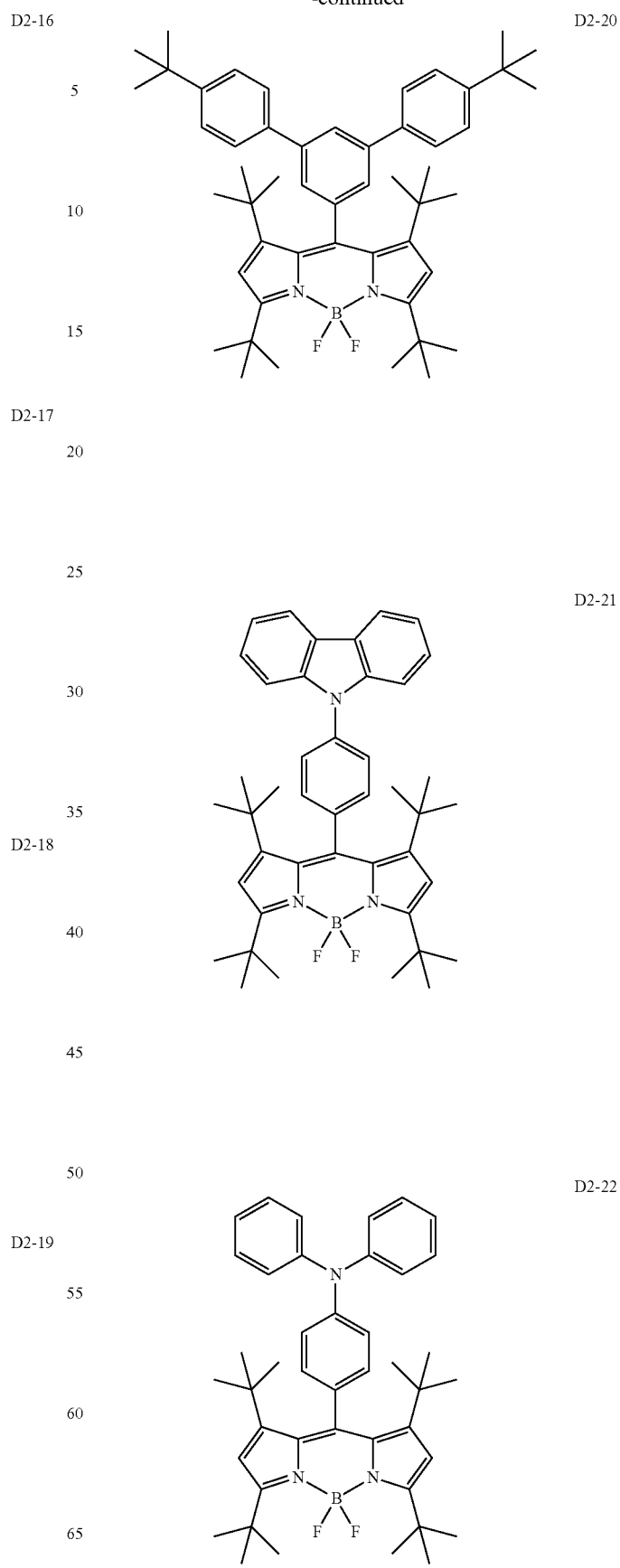
D2-20
D2-21
D2-22

D2-23
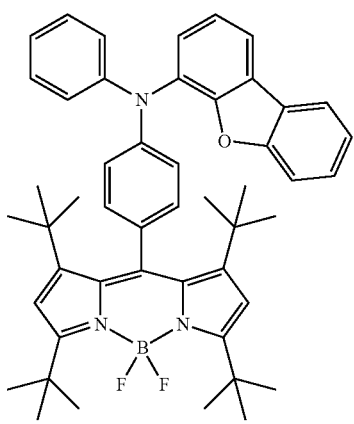
D2-24
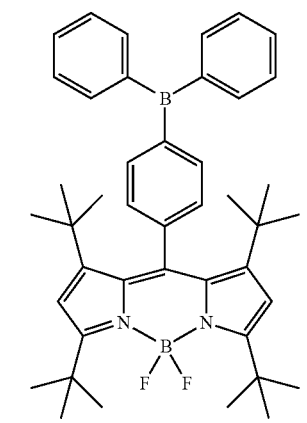
D2-25
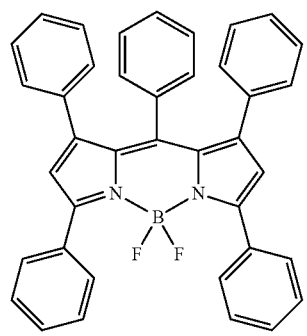
D2-26
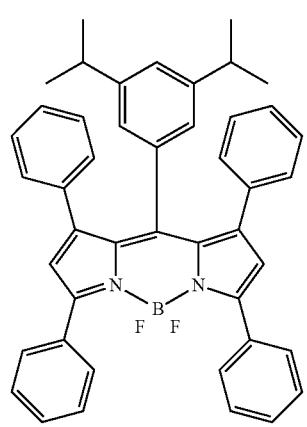
D2-27
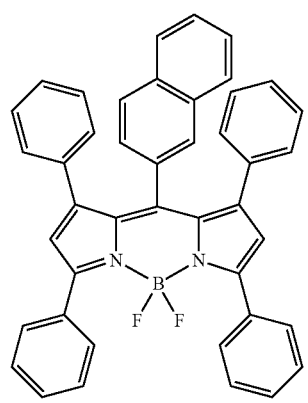
D2-28
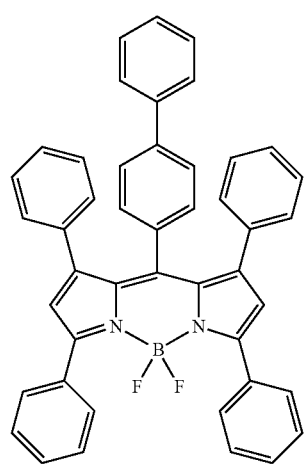
D2-29
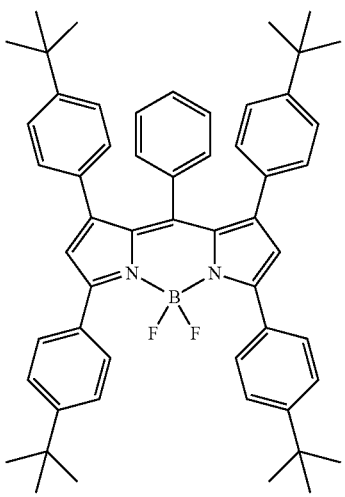

D2-30
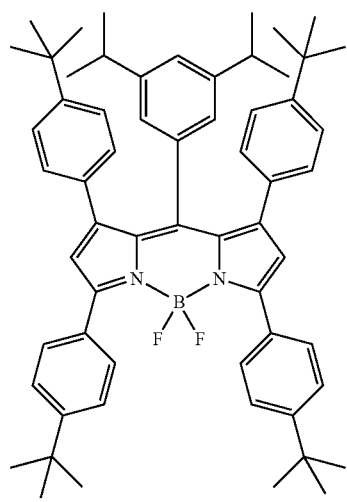
D2-31
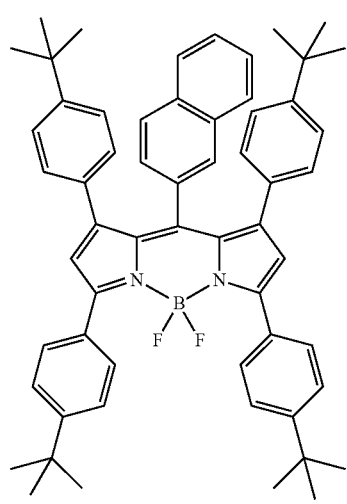
D2-32
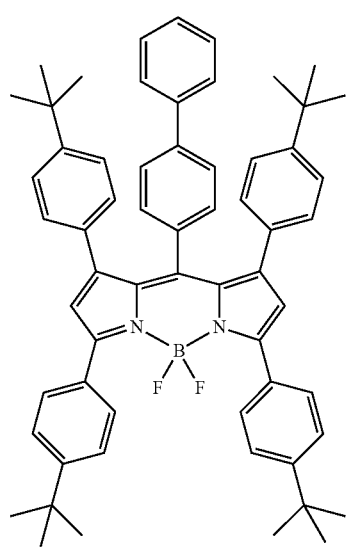
D2-33
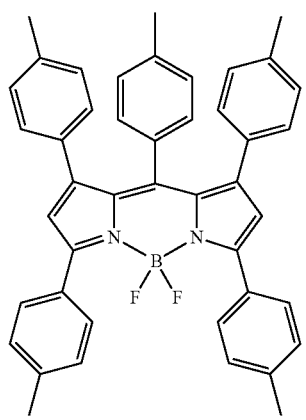
D2-34
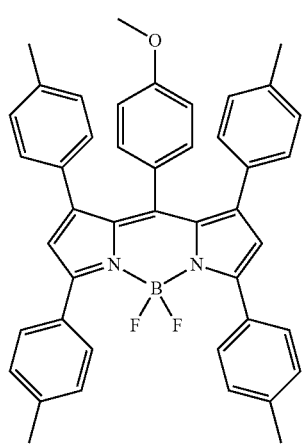
D2-35
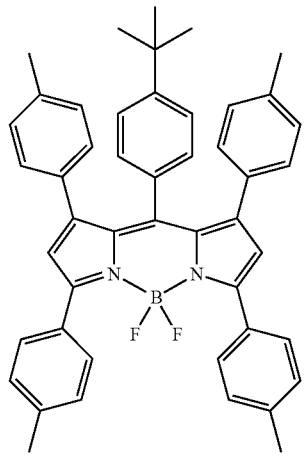

D2-36 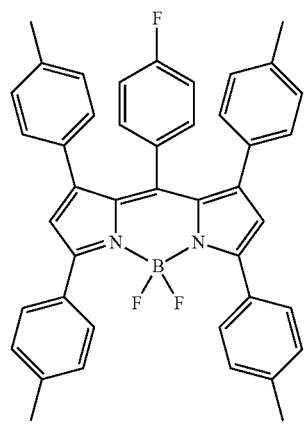
D2-40 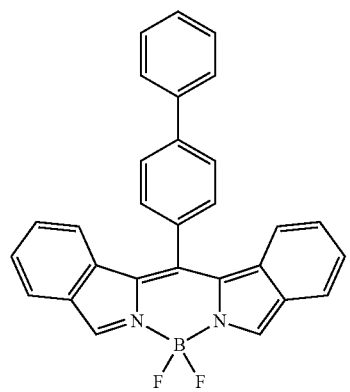
D2-37 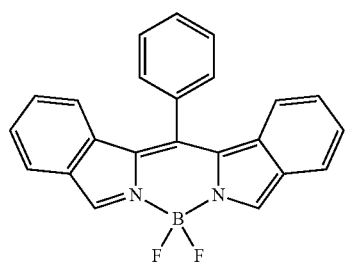
D2-41
D2-38 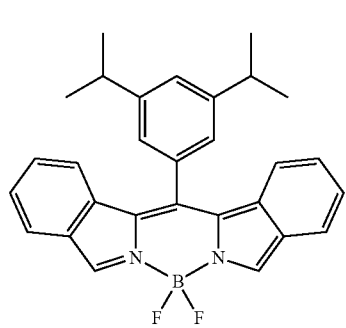
D2-42
D2-39 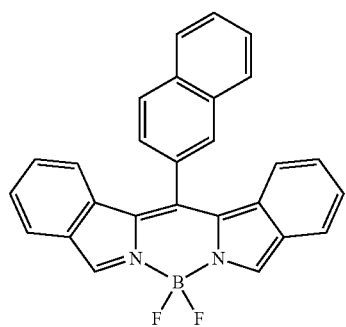
D2-43 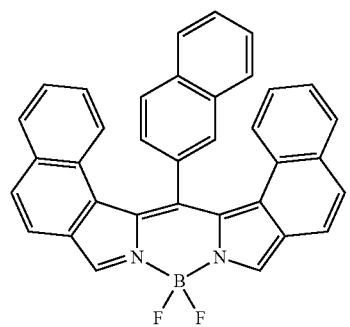

-continued

D2-44
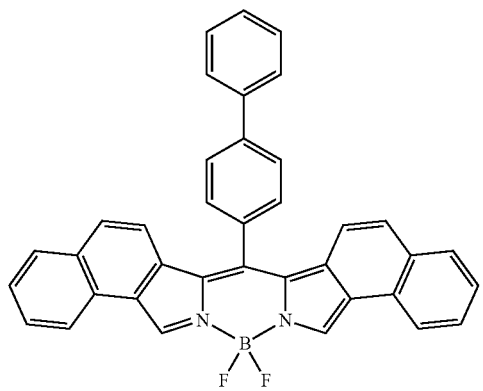

D2-45
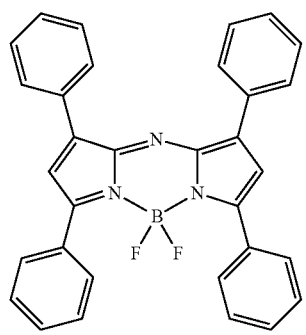

D2-46
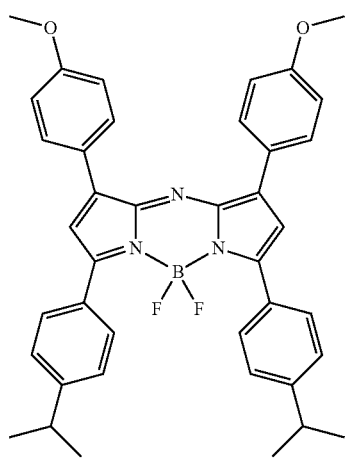

D2-47

-continued

D2-48
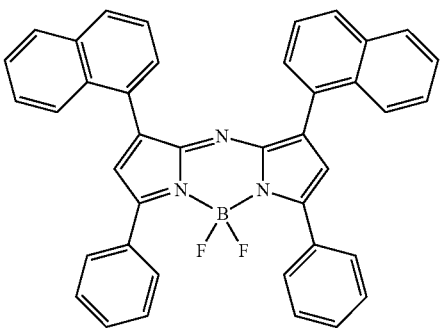

If an existing phosphorescence dopant for an emission layer is used, problems relating to high cost occur, and if a thermally activated delayed fluorescence dopant is used, problems relating to short life and low color purity occur.

In the organic electroluminescence device 10 of an embodiment, the thermally activated delayed fluorescence compound having an electron donor and an electron acceptor is used as the first dopant, and a compound represented by Formula 2 is used as the second dopant.

Accordingly, because singlet excitons produced by the first dopant which is a thermally activated delayed fluorescence dopant, rapidly emit light via the second dopant which is a fluorescence dopant, the deterioration of a device may decrease and device efficiency may increase. Further, because a thermally activated delayed fluorescence dopant of an electron donor-electron acceptor type has relatively short life when compared with an existing fluorescence dopant, the defects of the first dopant may be compensated for by the second dopant, which is the fluorescence dopant having long life.

In addition, the second dopant has larger overlap between the highest occupied molecular orbital (HOMO) and the lowest unoccupied molecular orbital (LUMO) when compared with the first dopant, which is a thermally activated delayed fluorescence dopant. Accordingly, the full width at half maximum (FWHM) of the wavelength of emitted light may be small, and light having high color purity may be emitted.

The first dopant and the second dopant may be doped in various suitable ratios. Hereinafter, the doping ratio of the first dopant and the second dopant means a weight ratio.

The first dopant may be doped, for example, to a ratio of about 10% to about 40% based on the total weight of the emission layer. The second dopant may be doped, for example, to a ratio of about 0.25% to about 2% based on the total weight of the emission layer. Embodiments of the present disclosure are not limited thereto, but if the above-mentioned doping ratios are satisfied, suitable or satisfactory light-emitting properties including emission efficiency, life and full width at half maximum of the wavelength of emitted light may be achieved.

The emission layer composed of the first host, the second host, the first dopant and the second dopant may have diverse mixing ratios. For example, the first host and the second host may have a ratio of about 3:7, about 5:5 or about 7:3. In addition, the first dopant may be doped to a ratio of about 10%, about 20% or about 30%, and the second dopant may be doped to a ratio of about 0.25%, about 0.5% or about 1%.

In the organic electroluminescence devices 10 of embodiments, as shown in FIG. 3 to FIG. 5, the electron transport region ETR is provided on the emission layer EML. The electron transport region ETR may include at least one selected from a hole blocking layer HBL, an electron transport layer ETL, and an electron injection layer EIL, but embodiments of the present disclosure are not limited thereto.

The electron transport region ETR may have a single layer formed using a single material, a single layer formed using a plurality of different materials, or a multilayer structure including a plurality of layers formed using a plurality of different materials.

For example, the electron transport region ETR may have the structure of a single layer such as an electron injection layer EIL and an electron transport layer ETL, or a single layer structure formed using an electron injection material and an electron transport material. In addition, the electron transport region ETR may have a single layer structure formed using a plurality of different materials, or a structure of electron transport layer ETL/electron injection layer EIL, or hole blocking layer HBL/electron transport layer ETL/electron injection layer EIL, stacked one by one from the emission layer EML without limitation. The thickness of the electron transport region ETR may be, for example, from about 1,000 Å to about 1,500 Å.

The electron transport region ETR may be formed using various suitable methods such as a vacuum deposition method, a spin coating method, a cast method, a Langmuir-Blodgett (LB) method, an inkjet printing method, a laser printing method, and/or a laser induced thermal imaging (LITI) method.

If the electron transport region ETR includes the electron transport layer ETL, the electron transport region ETR may include an anthracene-based compound. Though embodiments of the present disclosure are not limited thereto, the electron transport region ETR may include, for example, tris(8-hydroxyquinolinato)aluminum (Alq3), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazol-1-yl)phenyl)-9,10-dinaphthylanthracene, 1,3,5-tri(1-phenyl-1H-benzo[d]imidazol-2-yl)phenyl (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate) (Bebq2), 9,10-di(naphthalene-2-yl)anthracene (ADN), or a mixture thereof, without limitation. The thickness of the electron transport layer ETL may be from about 100 Å to about 1,000 Å, for example, from about 150 Å to about 500 Å. If the thickness of the electron transport layer ETL satisfies the above-described range, suitable or satisfactory electron transport properties may be obtained without substantial increase of a driving voltage.

If the electron transport region ETR includes the electron injection layer EIL, the electron transport region ETR may include LiF, lithium quinolate (LiQ), $Li_2O$, BaO, NaCl, CsF, a metal in lanthanides such as Yb, or a metal halide such as RbCl and RbI, without limitation. The electron injection layer EIL also may be formed using a mixture material of an electron transport material and an insulating organo metal salt. The organo metal salt may be a material having an energy band gap of about 4 eV or more. In some embodiments, the organo metal salt may include, for example, a metal acetate, a metal benzoate, a metal acetoacetate, a metal acetylacetonate, or a metal stearate. The thickness of the electron injection layer EIL may be from about 1 Å to about 100 Å, for example, from about 3 Å to about 90 Å. If the thickness of the electron injection layer EIL satisfies the above-described range, suitable or satisfactory electron injection properties may be obtained without inducing substantial increase of a driving voltage.

The electron transport region ETR may include a hole blocking layer HBL, as described above. The hole blocking layer HBL may include, for example, at least one of 2,9-dimethyl-4,7-diphenyl-1,10-phenanthroline (BCP), and 4,7-diphenyl-1,10-phenanthroline (Bphen), without limitation.

The second electrode EL2 is provided on the electron transport region ETR. The second electrode EL2 may be a common electrode or a cathode. The second electrode EL2 may be a transmissive electrode, a transflective electrode or a reflective electrode. If the second electrode EL2 is the transmissive electrode, the second electrode EL2 may include a transparent metal oxide, for example, ITO, IZO, ZnO, ITZO, etc.

If the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, a compound including thereof, or a mixture thereof (for example, a mixture of Ag and Mg). The second electrode EL2 may have a multilayered structure including a reflective layer or a transflective layer formed using the above-described materials, and a transparent conductive layer formed using ITO, IZO, ZnO, ITZO, etc.

The thickness of the second electrode EL2 may be from about 100 Å to about 10,000 Å, for example, from about 100 Å to about 1,000 Å, or from about 100 Å to about 3,000 Å.

In some embodiments, the second electrode EL2 may be connected with an auxiliary electrode. If the second electrode EL2 is connected with the auxiliary electrode, the resistance of the second electrode EL2 may be decreased.

In some embodiments, on the second electrode EL2 of the organic electroluminescence device 10 of an embodiment, a capping layer may be further included. The capping layer may include, for example, α-NPD, NPB, TPD, m-MTDATA, Alq3, CuPc, N4,N4, N4', N4'-tetra(biphenyl-4-yl)biphenyl-4,4'-diamine (TPD15), 4,4',4''-tris(carbazol-9-yl)triphenylamine (TCTA), etc.

In the organic electroluminescence device 10, voltages are applied to the first electrode EL1 and the second electrode EL2, respectively, and holes injected from the first electrode EL1 move via the hole transport region HTR to the emission layer EML, and electrons injected from the second electrode EL2 move via the electron transport region ETR to the emission layer EML. The electrons and the holes are recombined in the emission layer EML to generate excitons, and the excitons may emit light by transition from an excited state to a ground state.

Hereinafter, the organic electroluminescence device 10 of an embodiment of the present disclosure will be explained in more detail by referring to examples and comparative examples. The examples described below are only for illustration to assist the understanding of the present disclosure, and the scope of the present disclosure is not limited thereto.

Examples

1. Manufacture and Property Evaluation of Organic Electroluminescence Device 10
(Manufacture of Organic Electroluminescence Device)

The organic electroluminescence devices 10 of Example 1 to Example 36 were manufactured by the method described below. On a substrate, ITO/Ag/ITO was deposited to a thickness of about 2,000 Å. The deposited substrate was cut into a size of 50 mm×50 mm×0.7 mm (width×length× height), washed by ultrasonic waves using isopropyl alcohol and distilled water for about 5 minutes, and washed by exposing to ultraviolet rays for about 30 minutes and exposing to ozone. After that, the ITO substrate was installed in a vacuum deposition apparatus to form a first electrode EL1. On the first electrode EL1, Compound HT1 and F4-TCNQ were co-deposited in vacuum to a weight ratio of about 98:2 to form a hole injection layer HIL of a thickness of about 100 Å. Compound HT1 was deposited in vacuum on the hole injection layer HIL to form a hole transport layer HTL of a thickness of about 1,200 Å, and on the hole transport layer HTL, an emission layer EML of a thickness of about 300 Å was formed by mixing and co-depositing a first host and a second host of an embodiment to a ratio of about 7:3, and co-depositing a first dopant and a second dopant to a ratio of 30% and 0.5%, respectively. The respective first host, second host, first dopant, and second dopant were as shown in Table 1. On the emission layer EML, an electron transport layer ETL of a thickness of about 300 Å was formed by co-depositing Compound ET-1 and Liq to a weight ratio of about 50:50. On the electron transport layer ETL, Liq was deposited to form an electron injection layer EIL with a thickness of about 10 Å, and on the electron injection layer ETL, Mg and Ag were co-deposited to a weight ratio of about 13:1 to form a second electrode EL2 with a thickness of about 130 Å. An organic electroluminescence device 10 was manufactured.

The organic electroluminescence device 10 of Example 37 was manufactured by substantially the same method as the organic electroluminescence devices 10 of Example 1 to Example 36 except for co-depositing the first host and the second host to a ratio of about 5:5.

The organic electroluminescence device 10 of Example 38 was manufactured by substantially the same method as the organic electroluminescence devices 10 of Example 1 to Example 36 except for co-depositing the first host and the second host to a ratio of about 3:7.

The organic electroluminescence device 10 of Example 39 was manufactured by substantially the same method as the organic electroluminescence devices 10 of Example 1 to Example 36 except for co-depositing the first dopant and the second dopant to ratios of about 10% and about 0.5%, respectively.

The organic electroluminescence device 10 of Example 40 was manufactured by substantially the same method as the organic electroluminescence devices 10 of Example 1 to Example 36 except for co-depositing the first dopant and the second dopant to ratios of about 10% and about 0.5%, respectively.

The organic electroluminescence device 10 of Example 41 was manufactured by substantially the same method as the organic electroluminescence devices 10 of Example 1 to Example 36 except for co-depositing the first dopant and the second dopant to ratios of about 20% and about 0.25%, respectively.

The organic electroluminescence device 10 of Example 42 was manufactured by substantially the same method as the organic electroluminescence devices 10 of Example 1 to Example 36 except for co-depositing the first dopant and the second dopant to ratios of about 10% and about 1%, respectively.

The organic electroluminescence devices of Comparative Example 1 and Comparative Example 2 were manufactured by substantially the same method as the organic electroluminescence devices 10 of Example 1 to Example 36 except for using only one host material as the host.

The organic electroluminescence devices of Comparative Example 3 and Comparative Example 4 were manufactured by substantially the same method as the organic electroluminescence devices 10 of Example 1 to Example 36 except for using only one dopant material as the dopant.

The organic electroluminescence device of Comparative Example 5 was manufactured by substantially the same method as the organic electroluminescence devices 10 of Example 1 to Example 36 except for using Comparative Compound C545T instead of the second dopant material.

The organic electroluminescence device of Comparative Example 6 was manufactured by substantially the same method as the organic electroluminescence devices 10 of Example 1 to Example 36 except for using Comparative Compound C545T solely instead of the dopant.

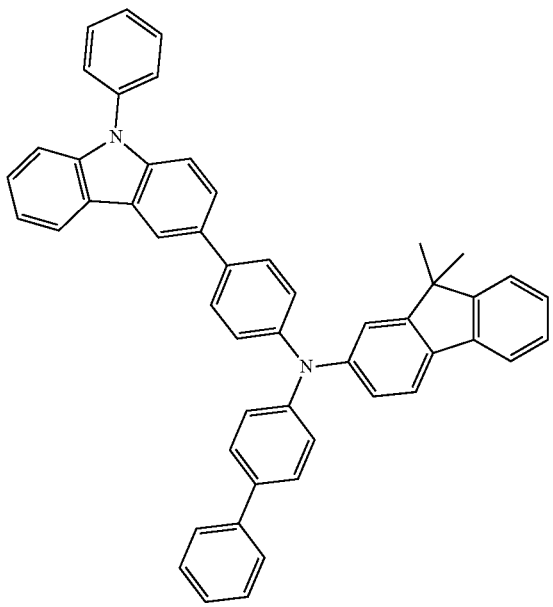

HT1

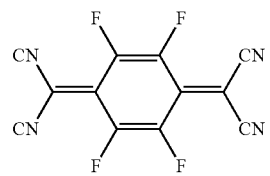

F4-TCNQ

-continued

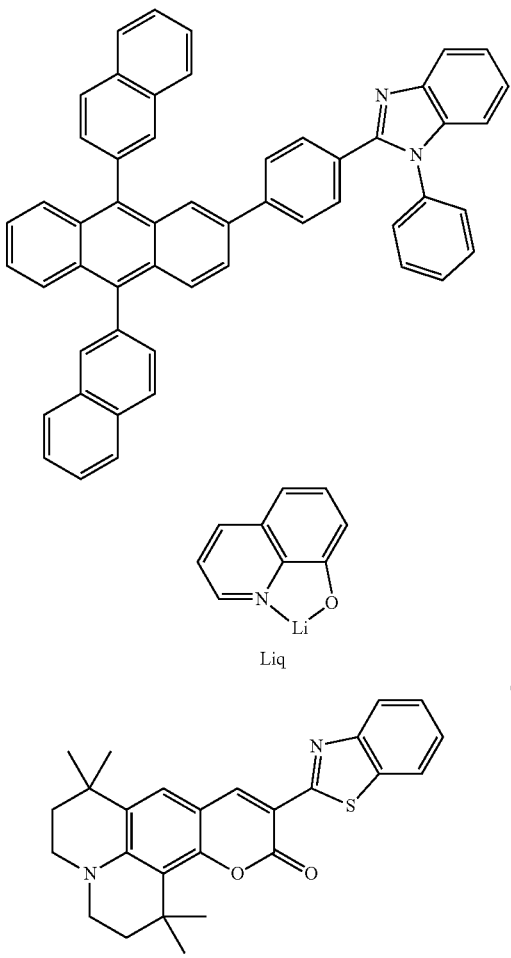

ET1

Liq

C545T

The combination of the host materials used in the Examples and the Comparative Examples are listed in Table 1 below.

TABLE 1

| Device manufacturing example | First host | Second host | First dopant | Second dopant |
|---|---|---|---|---|
| Example 1 | H1-1 | H2-1 | D1-1 | D2-1 |
| Example 2 | H1-3 | H2-1 | D1-1 | D2-1 |
| Example 3 | H1-10 | H2-1 | D1-1 | D2-1 |
| Example 4 | H1-1 | H2-7 | D1-1 | D2-1 |
| Example 5 | H1-3 | H2-7 | D1-1 | D2-1 |
| Example 6 | H1-10 | H2-7 | D1-1 | D2-1 |
| Example 7 | H1-1 | H2-12 | D1-1 | D2-1 |
| Example 8 | H1-3 | H2-12 | D1-1 | D2-1 |
| Example 9 | H1-10 | H2-12 | D1-1 | D2-1 |
| Example 10 | H1-1 | H2-1 | D1-15 | D2-1 |
| Example 11 | H1-3 | H2-1 | D1-15 | D2-1 |
| Example 12 | H1-10 | H2-1 | D1-15 | D2-1 |
| Example 13 | H1-1 | H2-7 | D1-15 | D2-1 |
| Example 14 | H1-3 | H2-7 | D1-15 | D2-1 |
| Example 15 | H1-10 | H2-7 | D1-15 | D2-1 |
| Example 16 | H1-1 | H2-12 | D1-15 | D2-1 |
| Example 17 | H1-3 | H2-12 | D1-15 | D2-1 |
| Example 18 | H1-10 | H2-12 | D1-15 | D2-1 |
| Example 19 | H1-1 | H2-1 | D1-15 | D2-40 |
| Example 20 | H1-3 | H2-1 | D1-15 | D2-40 |
| Example 21 | H1-10 | H2-1 | D1-15 | D2-40 |
| Example 22 | H1-1 | H2-7 | D1-15 | D2-40 |
| Example 23 | H1-3 | H2-7 | D1-15 | D2-40 |
| Example 24 | H1-10 | H2-7 | D1-15 | D2-40 |
| Example 25 | H1-1 | H2-12 | D1-15 | D2-40 |
| Example 26 | H1-3 | H2-12 | D1-15 | D2-40 |
| Example 27 | H1-10 | H2-12 | D1-15 | D2-40 |
| Example 28 | H1-1 | H2-12 | D1-1 | D2-40 |
| Example 29 | H1-3 | H2-12 | D1-1 | D2-40 |
| Example 30 | H1-10 | H2-12 | D1-1 | D2-40 |
| Example 31 | H1-1 | H2-1 | D1-1 | D2-40 |
| Example 32 | H1-3 | H2-1 | D1-1 | D2-40 |
| Example 33 | H1-10 | H2-1 | D1-1 | D2-40 |
| Example 34 | H1-1 | H2-7 | D1-1 | D2-40 |
| Example 35 | H1-3 | H2-7 | D1-1 | D2-40 |
| Example 36 | H1-10 | H2-7 | D1-1 | D2-40 |
| Example 37 | H1-1 | H2-1 | D1-1 | D2-1 |
| Example 38 | H1-1 | H2-1 | D1-1 | D2-1 |
| Example 39 | H1-1 | H2-1 | D1-1 | D2-1 |
| Example 40 | H1-1 | H2-1 | D1-1 | D2-1 |
| Example 41 | H1-1 | H2-1 | D1-1 | D2-1 |
| Example 42 | H1-1 | H2-1 | D1-1 | D2-1 |
| Comparative Example 1 | H1-1 | — | D1-1 | D2-1 |
| Comparative Example 2 | — | H2-1 | D1-1 | D2-1 |
| Comparative Example 3 | H1-1 | H2-1 | D1-1 | — |
| Comparative Example 4 | H1-1 | H2-1 | — | D2-1 |
| Comparative Example 5 | H1-1 | H2-1 | D1-1 | C545T |
| Comparative Example 6 | H1-1 | H2-1 | — | C545T |

A Keithley SMU 236 and a luminance meter PR650 measurement apparatus were used. In order to evaluate the properties of the organic electroluminescence devices according to the Examples and the Comparative Examples, device life and device efficiency were measured. The device life refers to the time required for decreasing luminance from initial luminance to about 95%. The device efficiency is a value on a current density of about 50 mA/cm$^2$. The current density of the device was set differently according to the materials included in the device, and was measured by continuously driving. In addition, from measured luminance spectrum, the light-emitting peak which was the maximum wavelength of emitted light and the full width half maximum (FWHM) of the wavelength of emitted light were measured. The evaluation results of Table 2 were shown based on (100%) the decrease in device life of luminance to 95% and device efficiency of Comparative Example 1, which used Example Compound H1-1 as the first host and used Example Compounds D1-1 and D2-1 as the first dopant and the second dopant, respectively (in Table 2, the device life and efficiency of Comparative Example 1 were set to 100% and the respective properties of the remaining devices are shown relative thereto).

TABLE 2

| Device manufacturing example | Life (%) | Efficiency (%) | Light-emitting peak (nm) | FWHM (nm) |
|---|---|---|---|---|
| Example 1 | 135 | 103 | 512 | 35 |
| Example 2 | 127 | 101 | 513 | 34 |
| Example 3 | 129 | 105 | 512 | 35 |
| Example 4 | 120 | 100 | 514 | 36 |
| Example 5 | 117 | 98 | 512 | 36 |
| Example 6 | 123 | 101 | 512 | 35 |

TABLE 2-continued

| Device manufacturing example | Life (%) | Efficiency (%) | Light-emitting peak (nm) | FWHM (nm) |
|---|---|---|---|---|
| Example 7 | 125 | 102 | 513 | 35 |
| Example 8 | 131 | 110 | 512 | 34 |
| Example 9 | 119 | 100 | 512 | 35 |
| Example 10 | 112 | 100 | 520 | 36 |
| Example 11 | 115 | 101 | 519 | 36 |
| Example 12 | 114 | 100 | 520 | 37 |
| Example 13 | 109 | 95 | 520 | 36 |
| Example 14 | 112 | 99 | 520 | 35 |
| Example 15 | 108 | 95 | 521 | 37 |
| Example 16 | 107 | 94 | 521 | 37 |
| Example 17 | 118 | 102 | 521 | 36 |
| Example 18 | 116 | 100 | 521 | 37 |
| Example 19 | 133 | 110 | 524 | 35 |
| Example 20 | 137 | 112 | 525 | 35 |
| Example 21 | 139 | 115 | 525 | 34 |
| Example 22 | 141 | 117 | 526 | 35 |
| Example 23 | 140 | 117 | 526 | 35 |
| Example 24 | 136 | 114 | 525 | 36 |
| Example 25 | 135 | 113 | 524 | 36 |
| Example 26 | 134 | 113 | 524 | 33 |
| Example 27 | 132 | 106 | 523 | 33 |
| Example 28 | 111 | 101 | 530 | 34 |
| Example 29 | 108 | 99 | 531 | 33 |
| Example 30 | 106 | 97 | 531 | 33 |
| Example 31 | 112 | 103 | 530 | 33 |
| Example 32 | 109 | 100 | 530 | 33 |
| Example 33 | 111 | 99 | 532 | 34 |
| Example 34 | 110 | 99 | 532 | 33 |
| Example 35 | 105 | 95 | 530 | 34 |
| Example 36 | 109 | 97 | 530 | 34 |
| Example 37 | 125 | 107 | 512 | 35 |
| Example 38 | 119 | 112 | 512 | 35 |
| Example 39 | 128 | 108 | 512 | 35 |
| Example 40 | 120 | 111 | 512 | 35 |
| Example 41 | 123 | 115 | 512 | 35 |
| Example 42 | 118 | 116 | 512 | 35 |
| Comparative Example 1 | 100 | 100 | 512 | 35 |
| Comparative Example 2 | 88 | 90 | 512 | 35 |
| Comparative Example 3 | 105 | 95 | 501 | 65 |
| Comparative Example 4 | 88 | 72 | 513 | 35 |
| Comparative Example 5 | 43 | 71 | 515 | 42 |
| Comparative Example 6 | 69 | 65 | 515 | 43 |

Referring to Table 2, the device life of the organic electroluminescence devices of Example 1 to Example 42 was increased when compared with the organic electroluminescence devices of Comparative Example 1 to Comparative Example 6. In addition, most of the Examples showed excellent emission efficiency when compared with Comparative Example 1 to Comparative Example 6. For example, Examples 1 to 3, 6 to 8, 11, 17, 19 to 28, 31 and 37 to 42 showed excellent emission efficiency when compared with Comparative Example 1 to Comparative Example 6. The remaining Examples showed lower emission efficiency than Comparative Example 1 or Comparative Example 3, but in this case, emission efficiency of similar degree as Comparative Example 1 or Comparative Example 3 was shown. In addition, even better emission efficiency was shown than Comparative Example 4 to Comparative Example 6. Life properties were better than all Comparative Examples.

The organic electroluminescence device 10 of an embodiment included the first host, the second host, the first dopant and the second dopant of embodiments as the materials of an emission layer EML. Accordingly, longer life and higher efficiency were achieved when compared with Comparative Example 1 to Comparative Example 6, which did not include any one selected from the first host, the second host, the first dopant and the second dopant, or included Comparative Compound C545T instead of the second dopant.

For example, the organic electroluminescence device 10 according to an embodiment used the first host which was a hole transport host and the second host which was an electron transport host, as suitable hosts, and the charge balance of the emission layer EML was excellent. In addition, the organic electroluminescence device 10 according to an embodiment used the thermally activated delayed fluorescence dopant of an embodiment as the first dopant, and a fluorescence dopant represented by Formula 2 as the second dopant in the emission layer EML, and excitons produced by the first dopant rapidly emitted light via the second dopant, thereby decreasing the deterioration of a device.

Meanwhile, Example 1 to Example 42 had the full width half maximum of a narrow wavelength when compared with Comparative Example 3. Example 1 to Example 42 used a mixture of the first dopant which was a thermally activated delayed fluorescence dopant and the second dopant which was a fluorescence dopant, and were found to achieve excellent color purity with a narrow full width half maximum when compared with Comparative Example 3, which used the first dopant, which was a thermally activated delayed fluorescence dopant, as a single dopant.

Further, the organic electroluminescence device 10 according to an embodiment uses a fluorescence dopant instead of an expensive phosphorescence dopant, and the organic electroluminescence device 10 may be manufactured by a low-cost process.

For example, the organic electroluminescence device 10 according to an embodiment includes all the first host, the second host, the first dopant and the second dopant as materials for an emission layer EML, and may achieve the properties of long life, high efficiency, high color purity, and low cost.

By including the first host, the second host, the first dopant and the second dopant of embodiments as the materials for the emission layer EML, the organic electroluminescence device 10 according to an embodiment and the display device DD including the same may achieve long life, high efficiency, and high color purity.

Because the organic electroluminescence device 10 according to an embodiment and the display device DD includes the first dopant and the second dopant, which are fluorescence dopants as the materials for the emission layer EML, the manufacture thereof by a low-cost process may be possible.

The organic electroluminescence device and the display device including the same according to embodiments of the present disclosure may achieve long life and high color purity.

The organic electroluminescence device and the display device including the same according to embodiments of the present disclosure may be manufactured by a low-cost process.

As used herein, the term "and/or" includes any and all combinations of one or more of the associated listed items. Expressions such as "at least one of," when preceding a list of elements, modify the entire list of elements and do not modify the individual elements of the list.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Although the exemplary embodiments of the present disclosure have been described, it is understood that the subject matter of the present disclosure should not be limited to these exemplary embodiments but various changes and modifications can be made by one ordinary skilled in the art within the spirit and scope of the present disclosure, and equivalents thereof, as hereinafter claimed.

What is claimed is:

1. An organic electroluminescence device, comprising:
   a first electrode;
   a second electrode on the first electrode; and
   an emission layer between the first electrode and the second electrode,
   wherein the emission layer comprises:
   a first host comprising at least one selected from compounds represented in the following Compound Group 1;
   a second host comprising at least one selected from compounds represented in the following Compound Group 2;
   a first dopant comprising at least one selected from compounds represented in the following Compound Group 3, which is a thermally activated delayed fluorescence material having an electron donor and an electron acceptor; and
   a second dopant comprising at least one selected from compounds represented in the following Compound Group 4:

Compound Group 1

H1-1

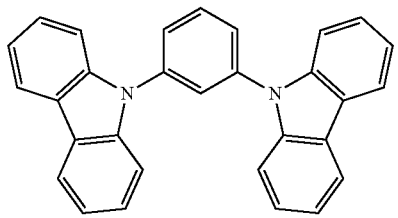

-continued

H1-2

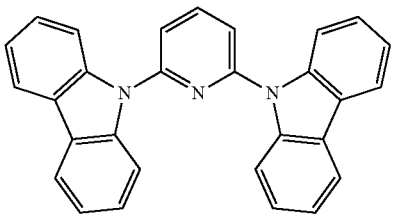

H1-3

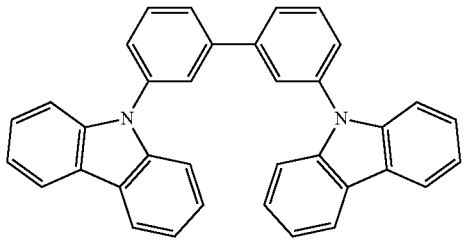

H1-4

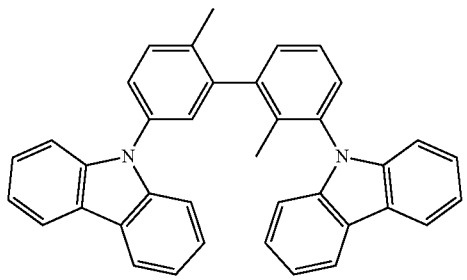

H1-5

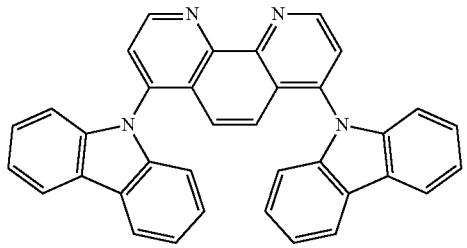

H1-6

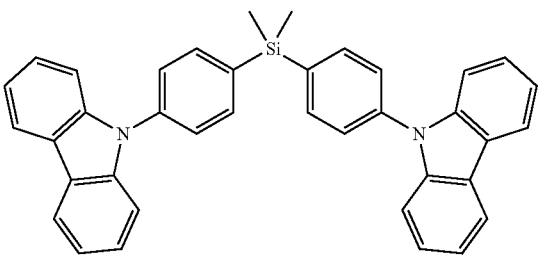

H1-7

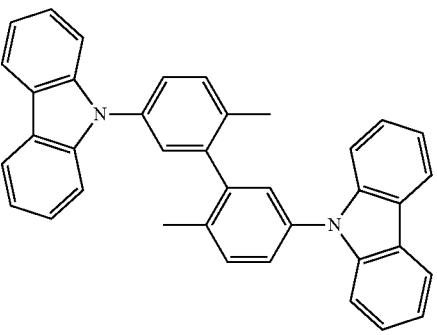

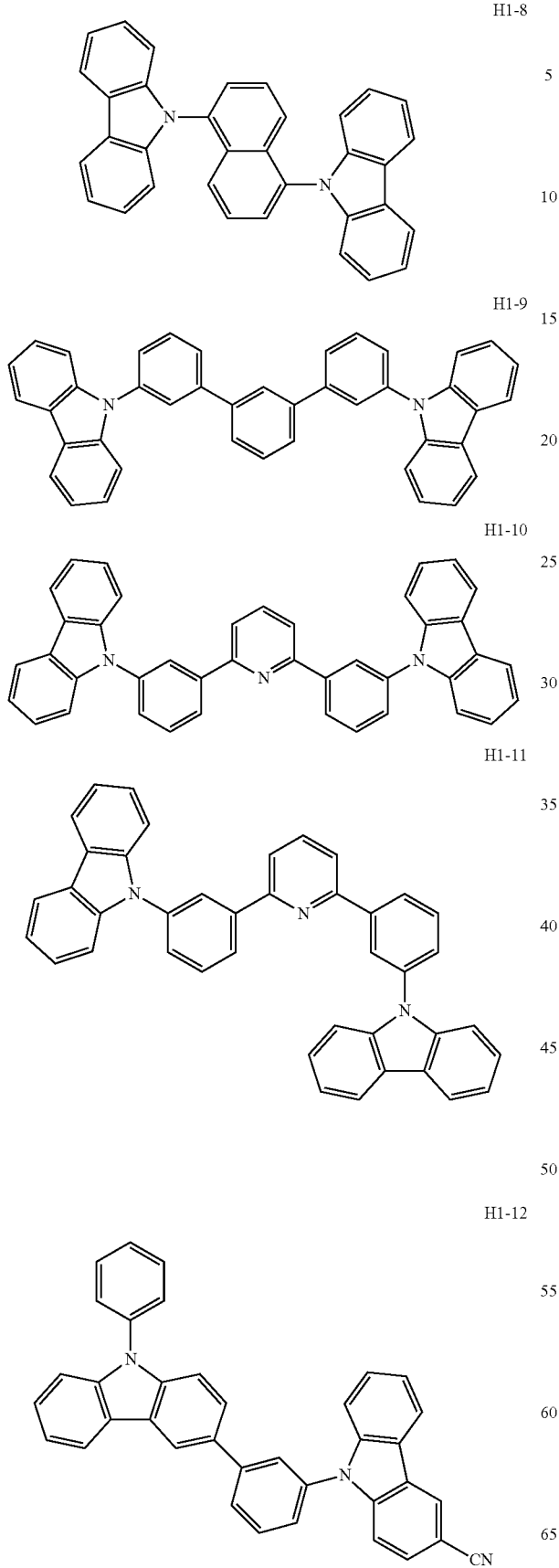
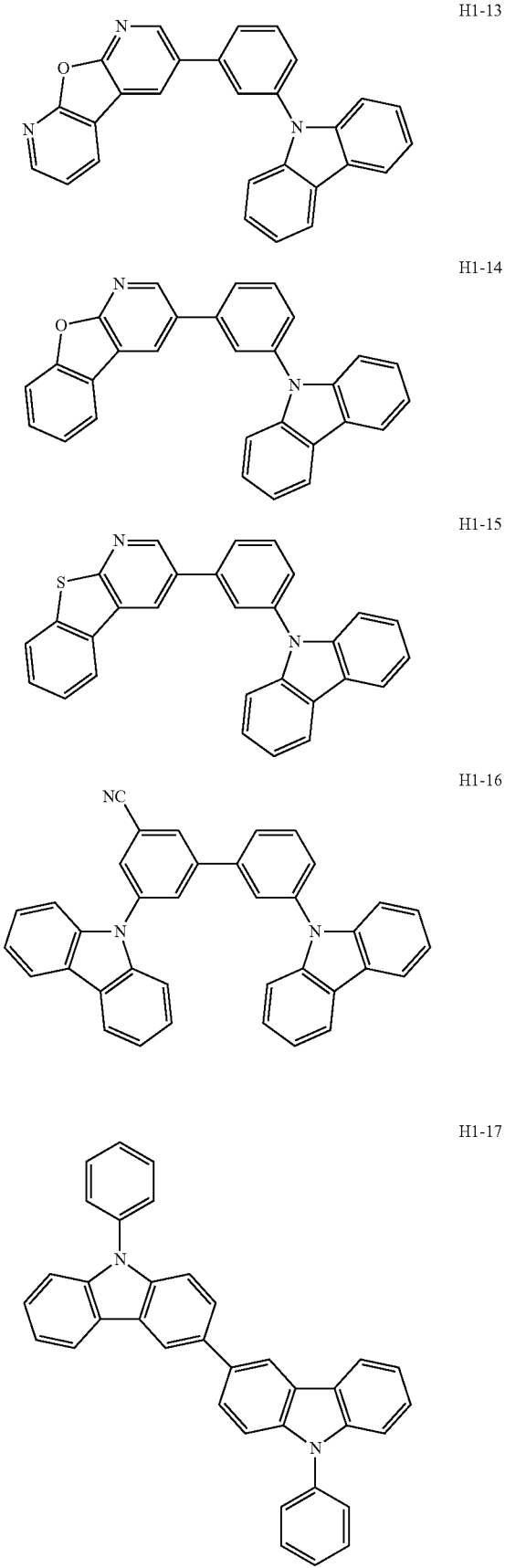

H1-18
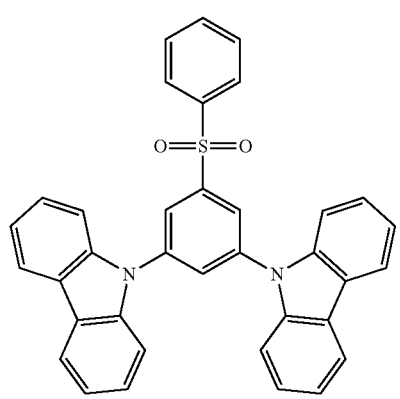
H1-19
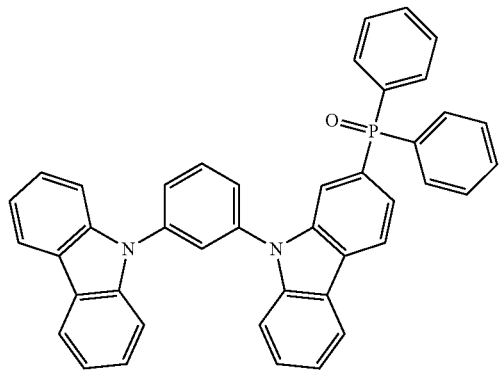
H1-20
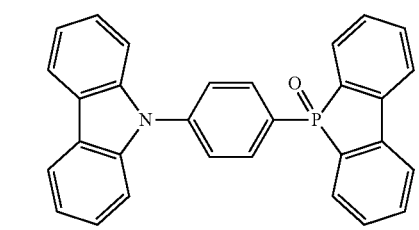
H1-21
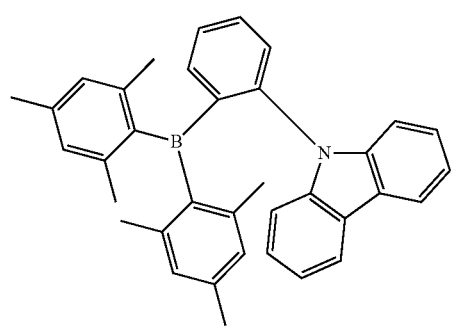
H1-22
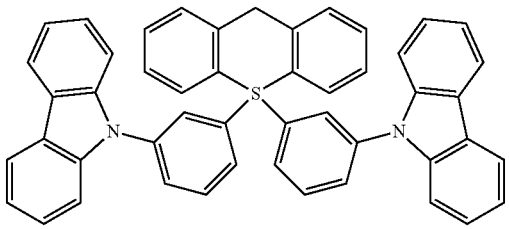
H1-23
H1-24
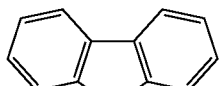
Compound Group 2
H2-1
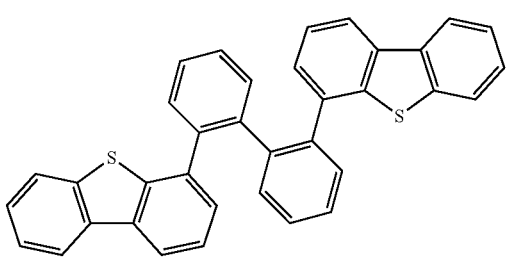

H2-2
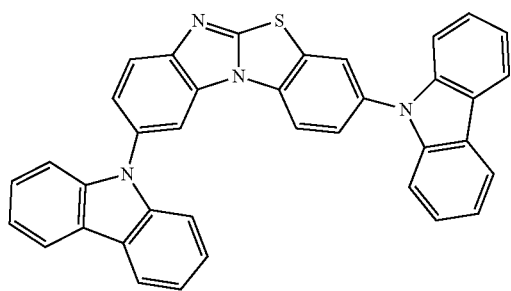
H2-5
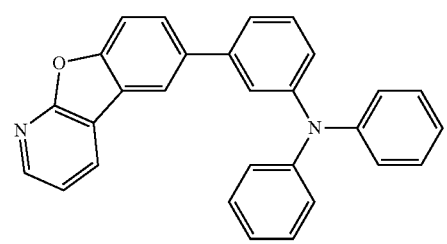
H2-11
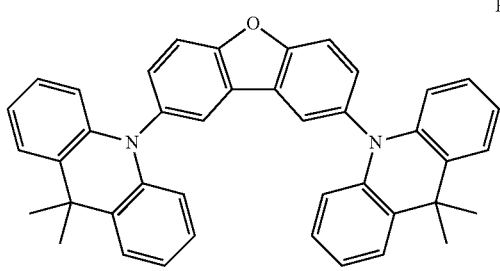
H2-18
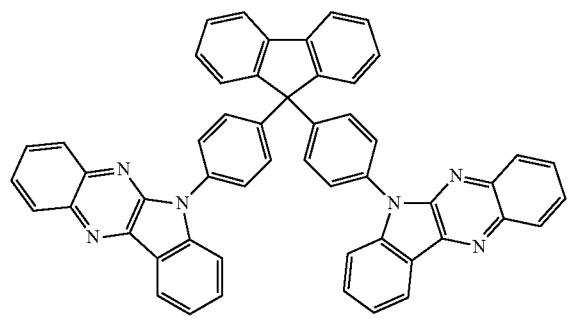
H2-19
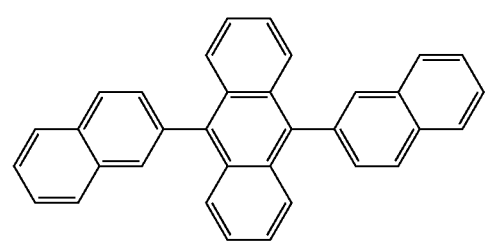
H2-20
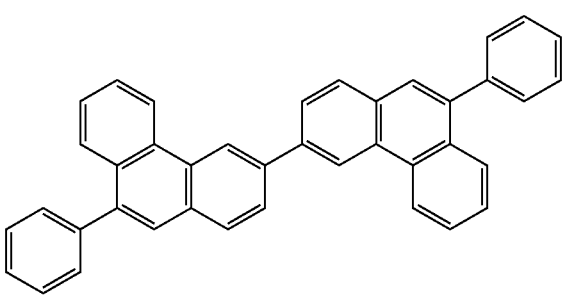
H2-21
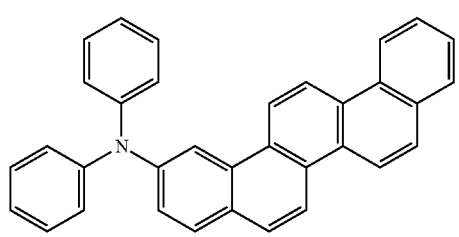
H2-21
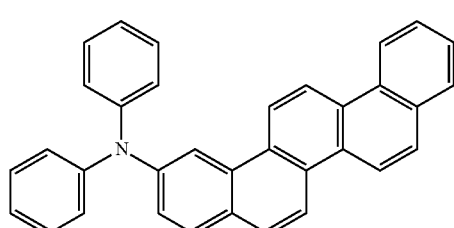
H2-22
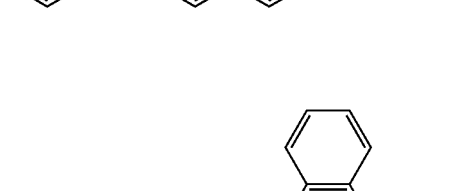
H2-23
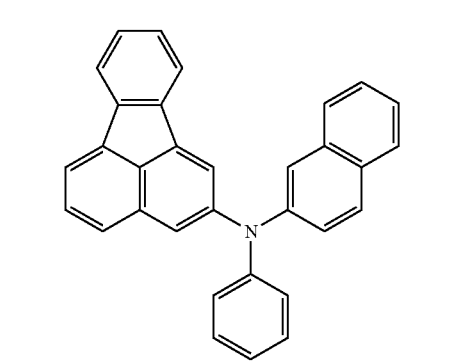

H2-24
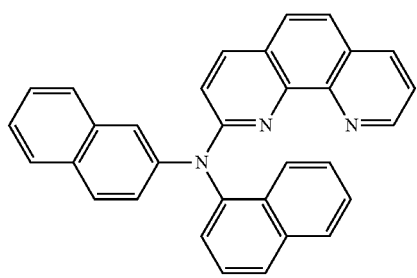
Compound Group 3
D1-1
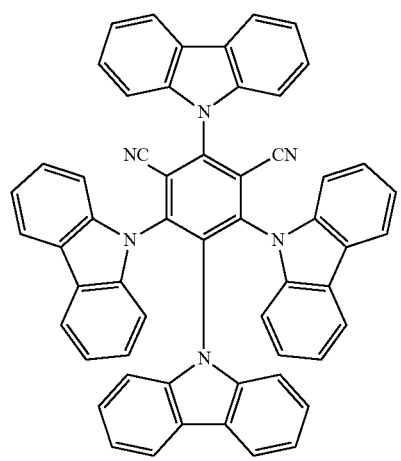
D1-2
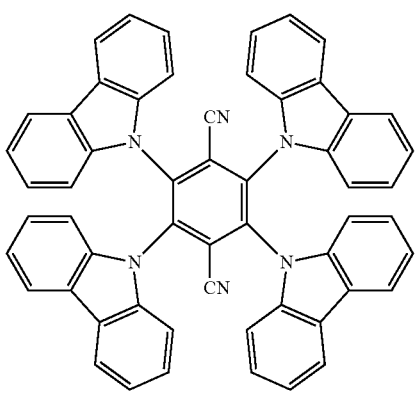
D1-3
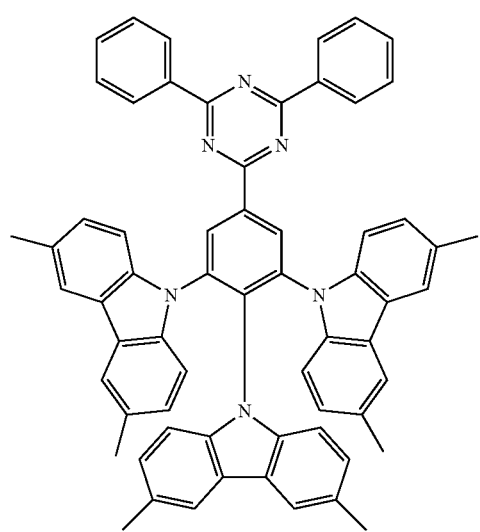
D1-4
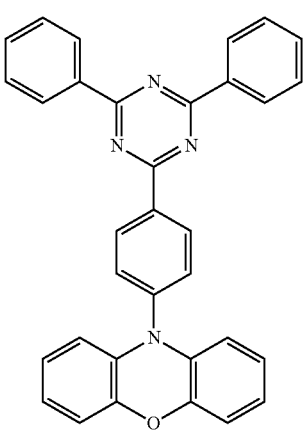

-continued
D1-5
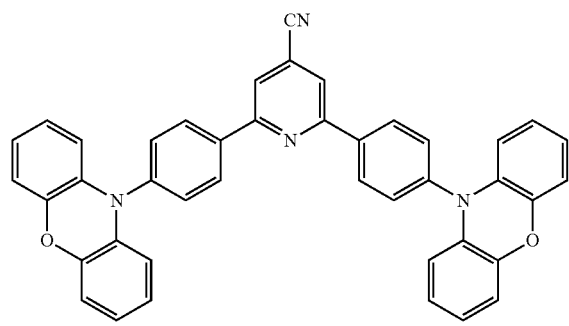
D1-6
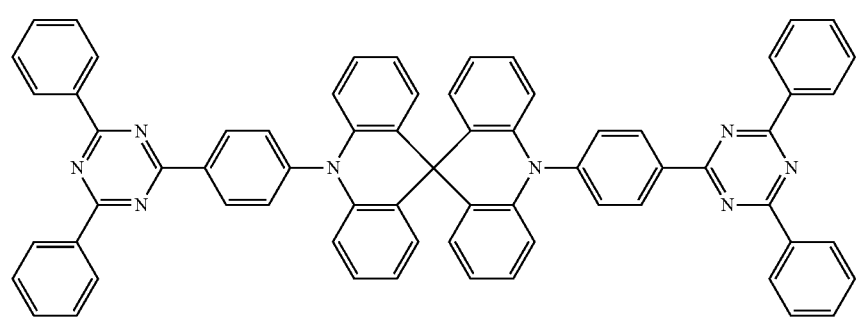
D1-7
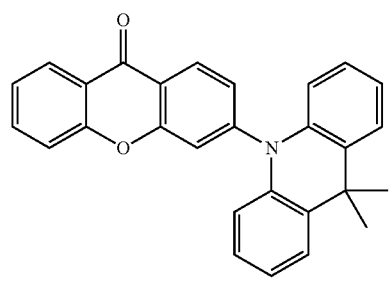
D1-8
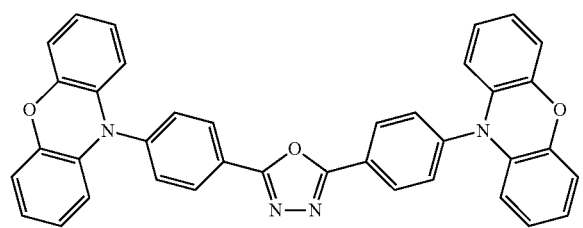
D1-9
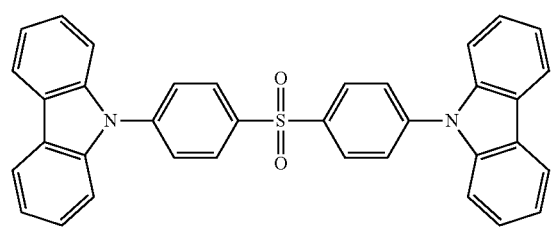
D1-10
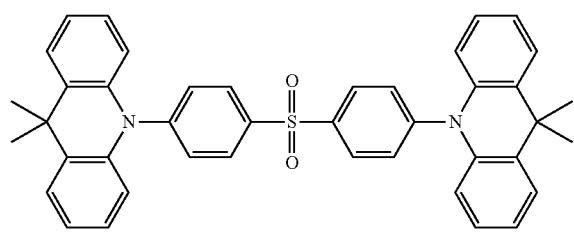

-continued
D1-11
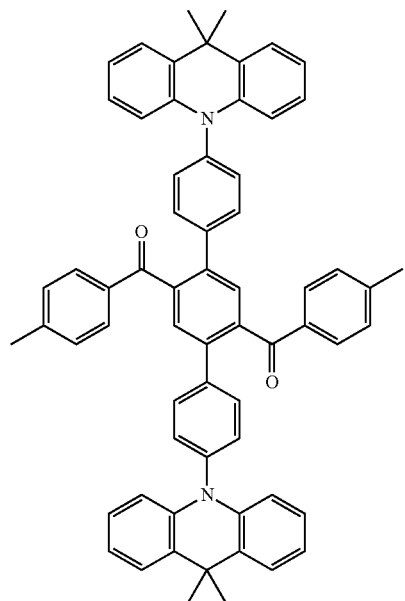
D1-12
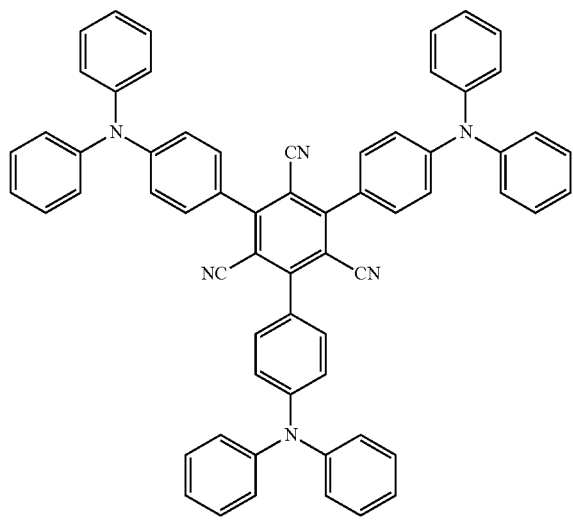
D1-13
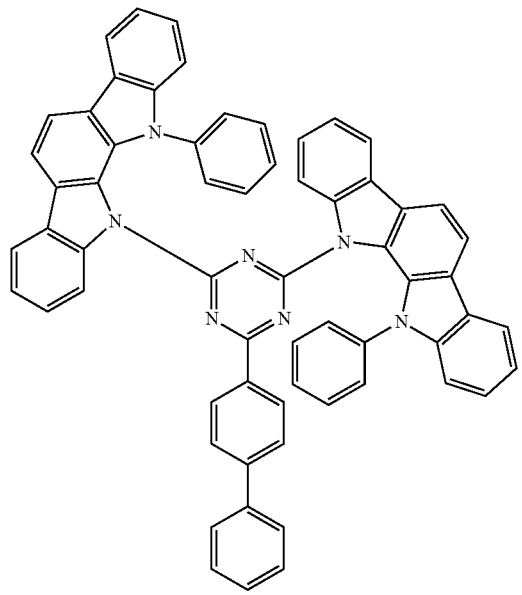
D1-14
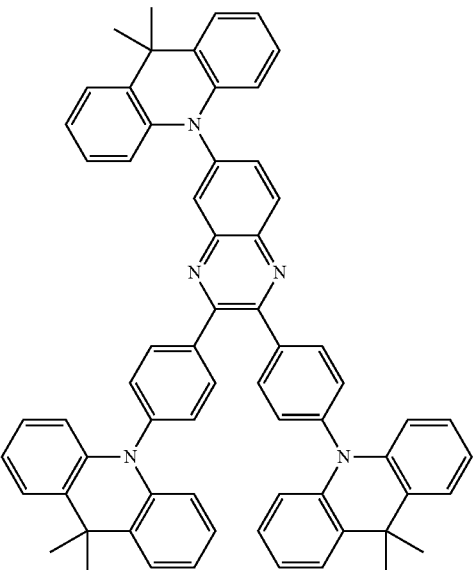
D1-15
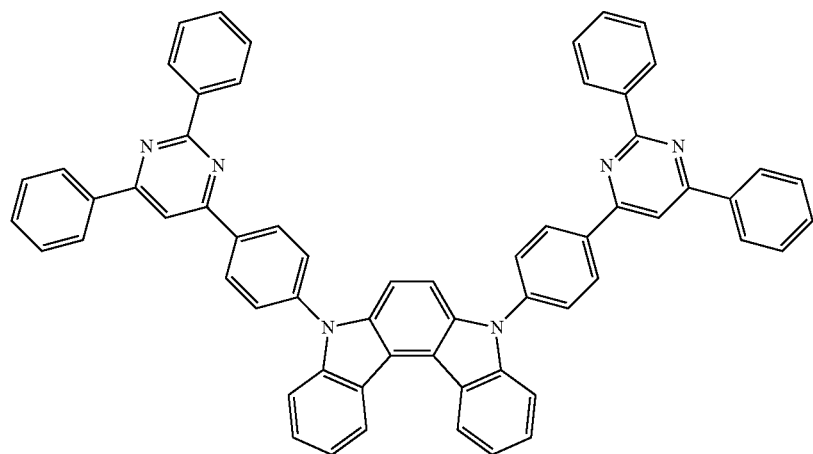

-continued
D1-16
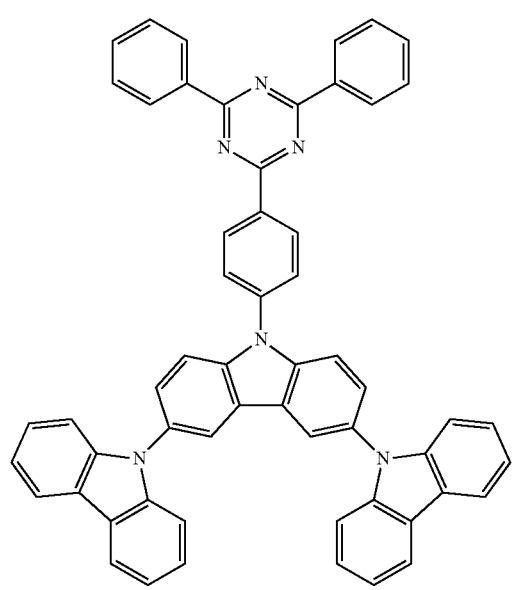
D1-17
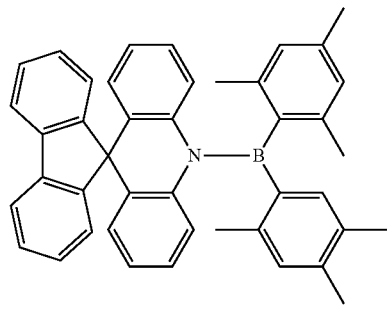
D1-18
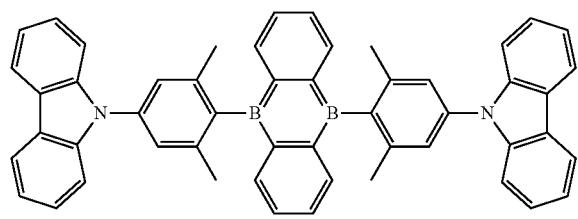
D1-19
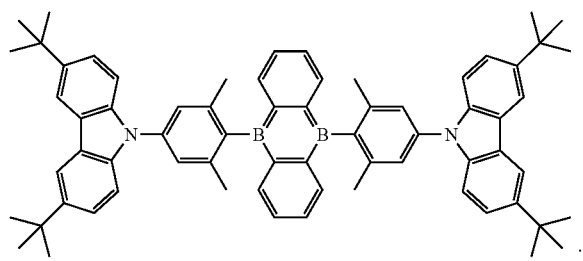
Compound Group 4
D2-1
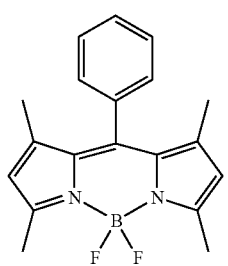
-continued
D2-3
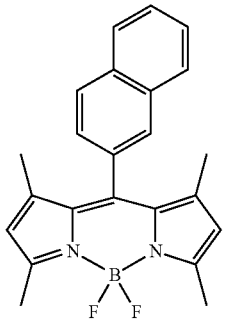
D2-2
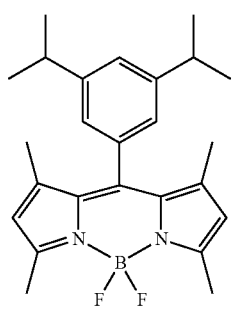
D2-4
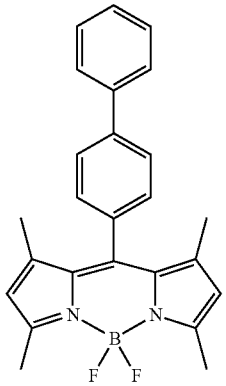

D2-5
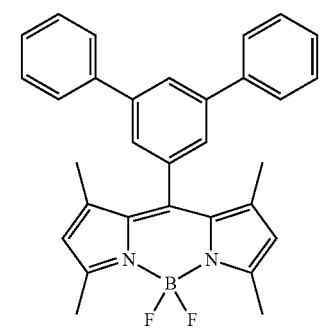
D2-6
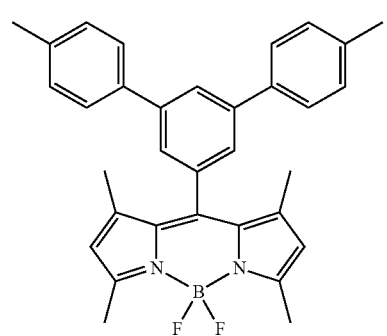
D2-7
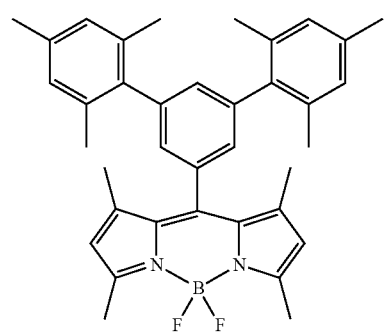
D2-8
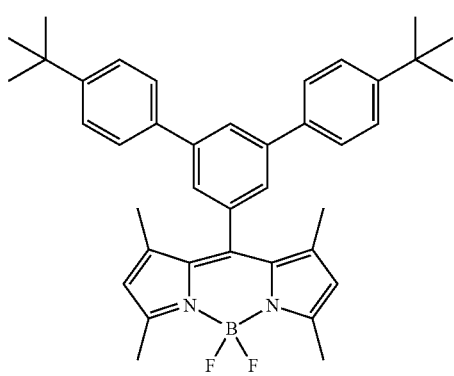
D2-9
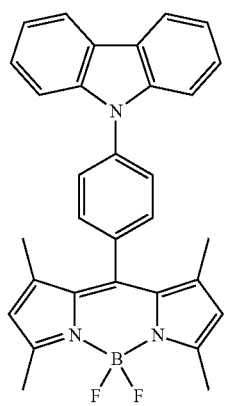
D2-10
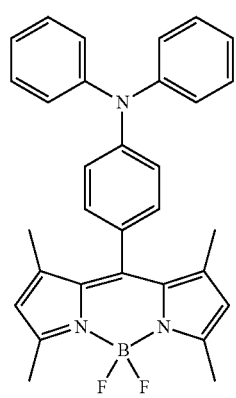
D2-11
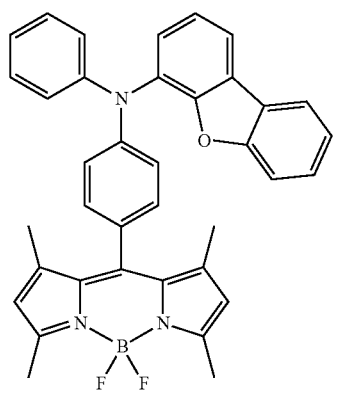
D2-12
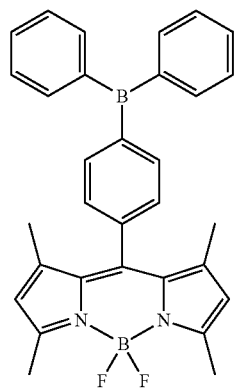

-continued
D2-13
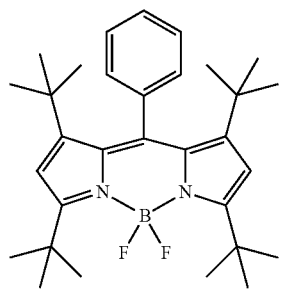
D2-14
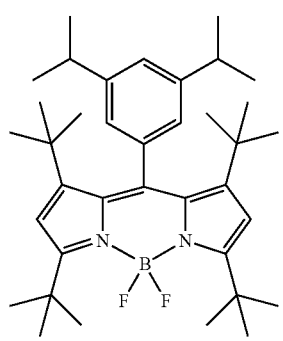
D2-15
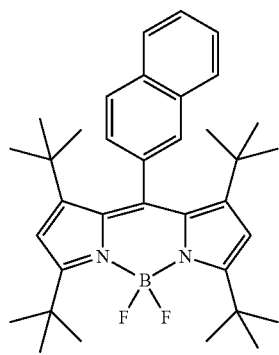
D2-16
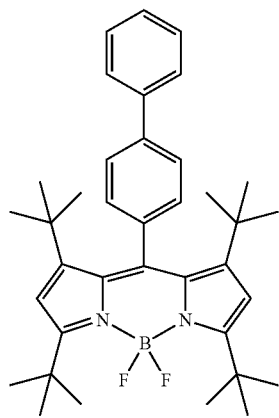
-continued
D2-17
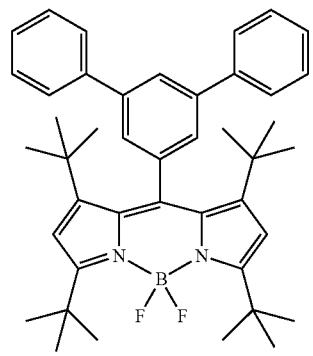
D2-18
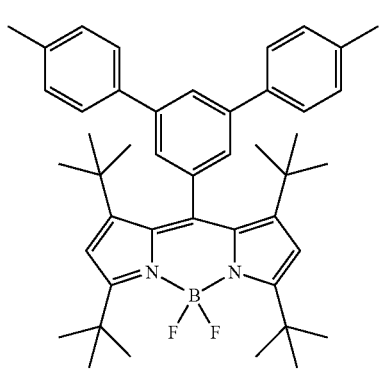
D2-19
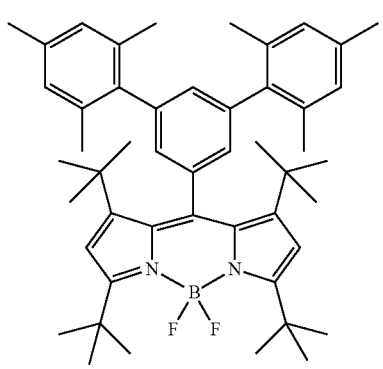
D2-20
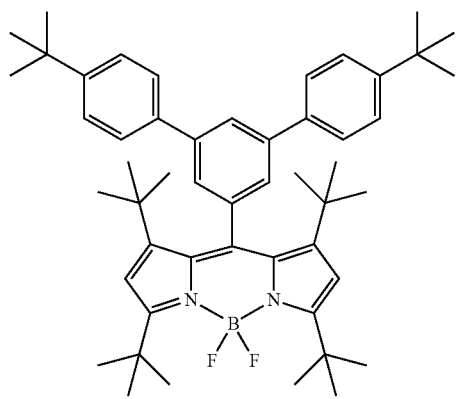

-continued
D2-21
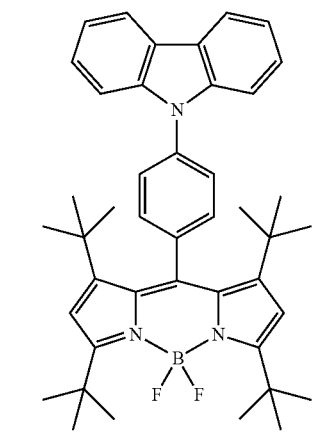
D2-22
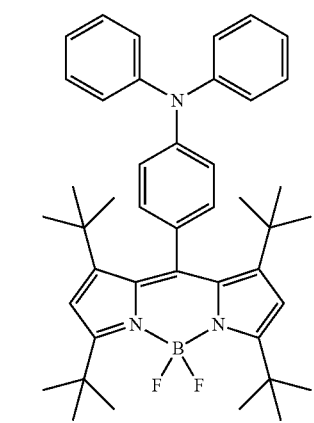
D2-23
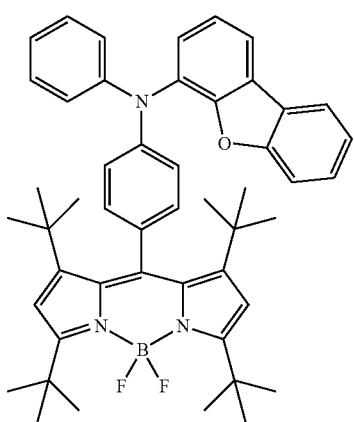
-continued
D2-24
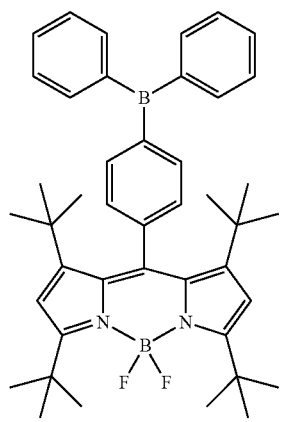
D2-25
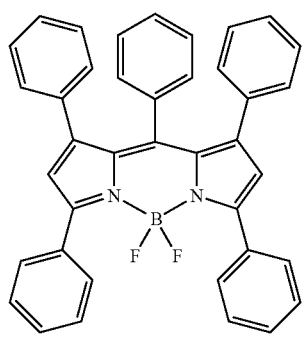
D2-26
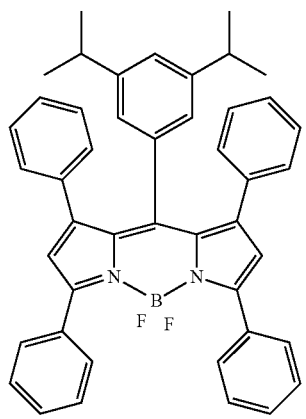
D2-27
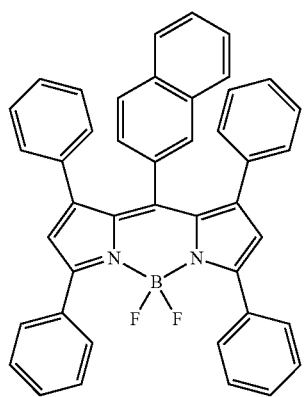

D2-28
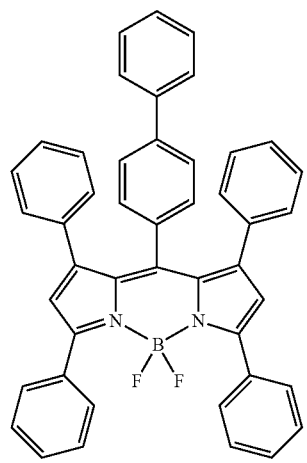
D2-29
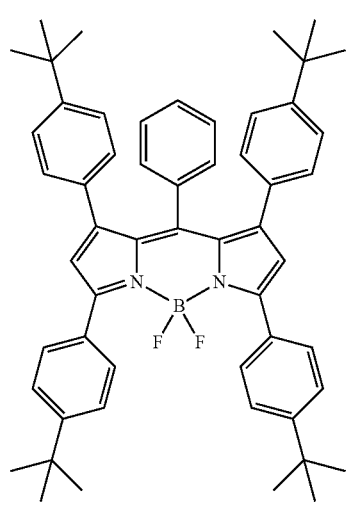
D2-30
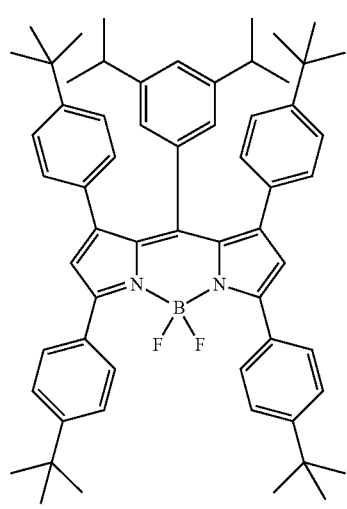
D2-31
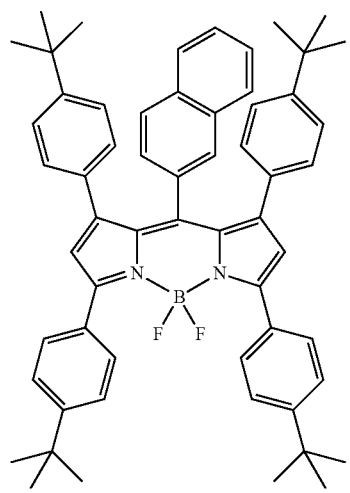
D2-32
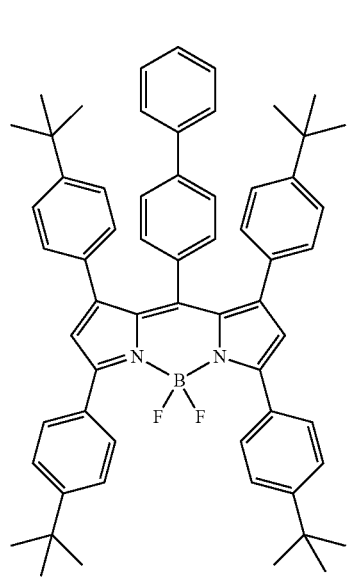
D2-33
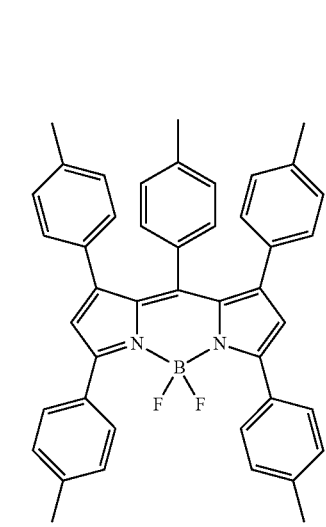

D2-34
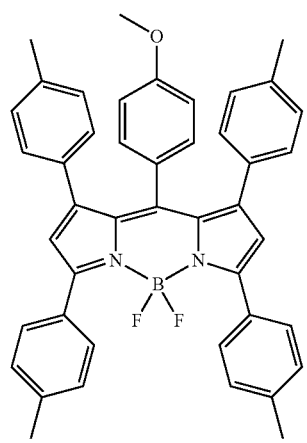
D2-35
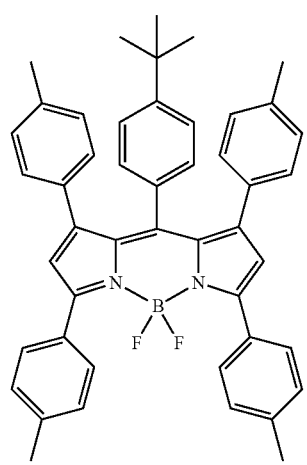
D2-36
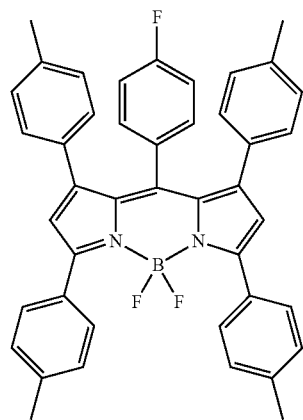
D2-37
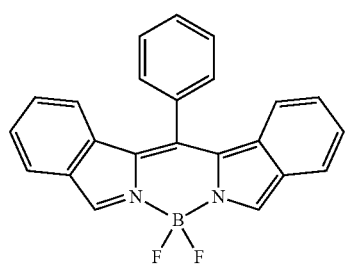
D2-38
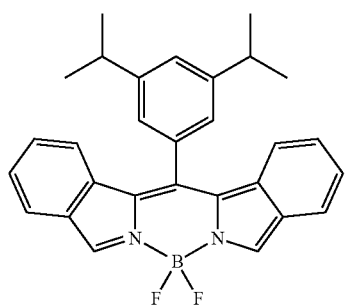
D2-39
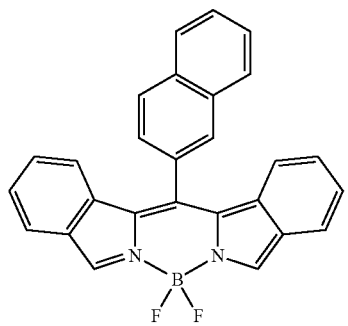
D2-40
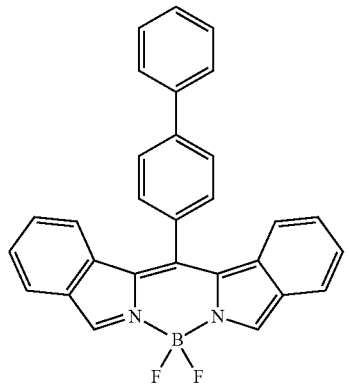
D2-41
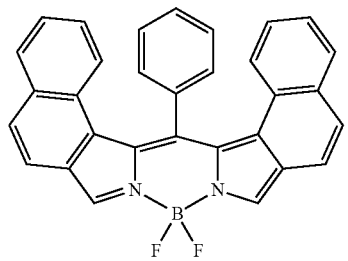
D2-42
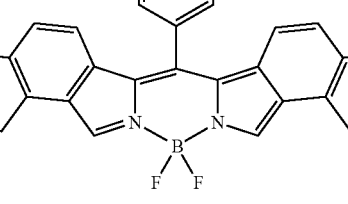

117
-continued

D2-43
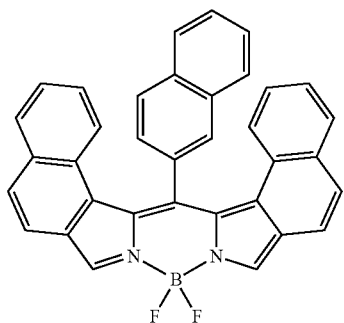

D2-44
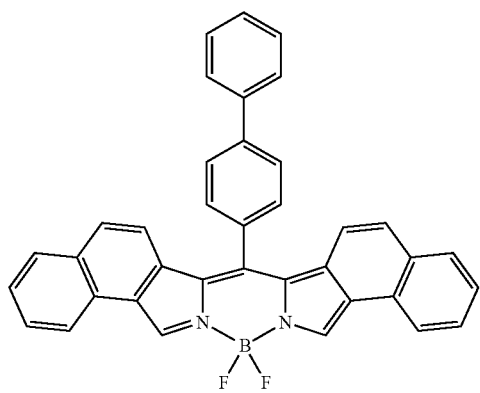

D2-45

D2-46
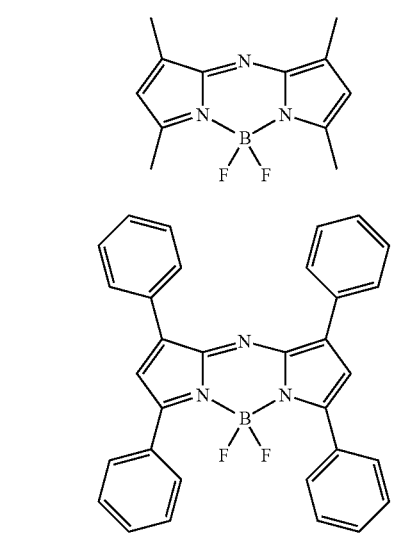

118
-continued

D2-47
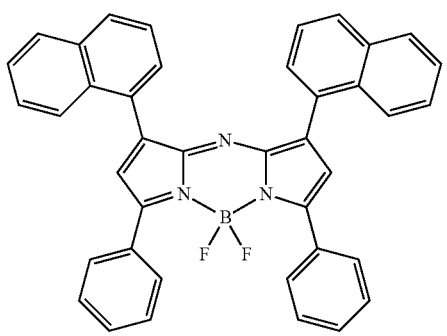

D2-48

2. The organic electroluminescence device of claim 1, wherein a difference between the lowest singlet energy level and the lowest triplet energy level of the first dopant is about 0.3 eV or less.

3. An organic electroluminescence display device, comprising:
a first electrode;
a hole transport region on the first electrode;
an emission layer on the first hole transport region;
an electron transport region on the emission layer; and
a second electrode on the electron transport region,
wherein the emission layer comprises:
a first host comprising at least one selected from compounds represented in the following Compound Group 1;
a second host comprising at least one selected from compounds represented in the following Compound Group 2;
a first dopant comprising at least one selected from compounds represented in the following Compound Group 3, which is a thermally activated delayed fluorescence material having an electron donor and an electron acceptor; and
a second dopant comprising at least one selected from compounds represented in the following Compound Group 4:

Compound Group 1
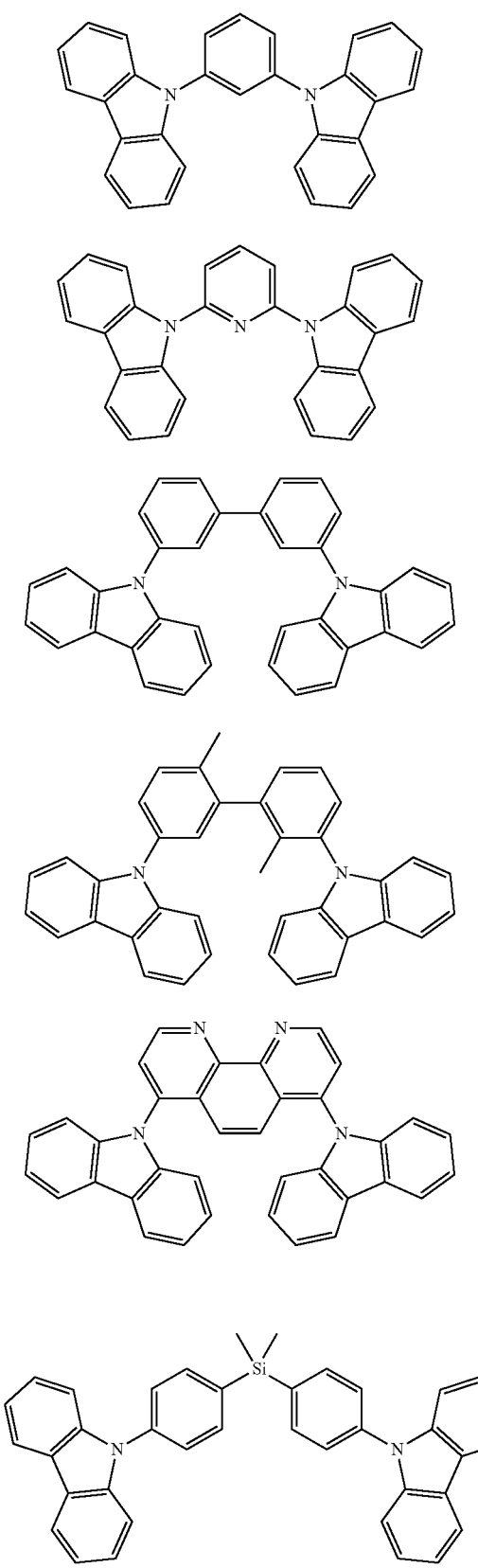
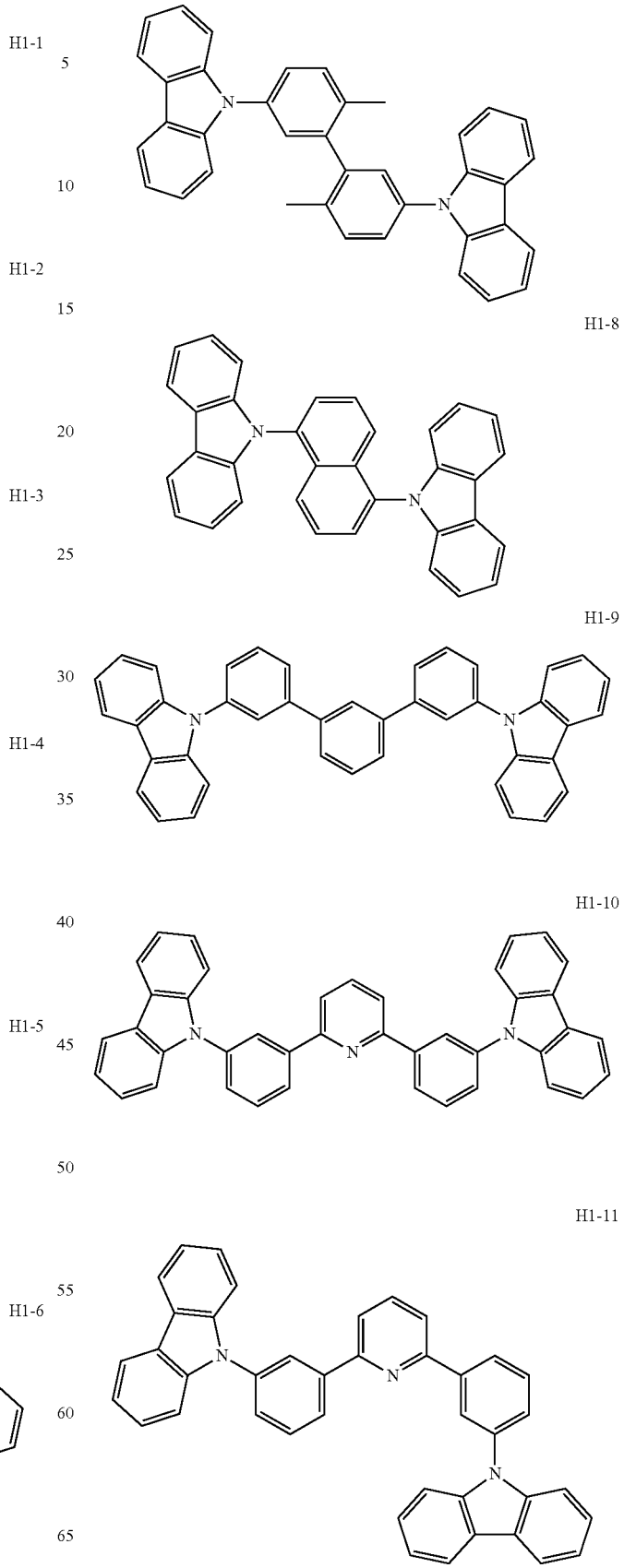

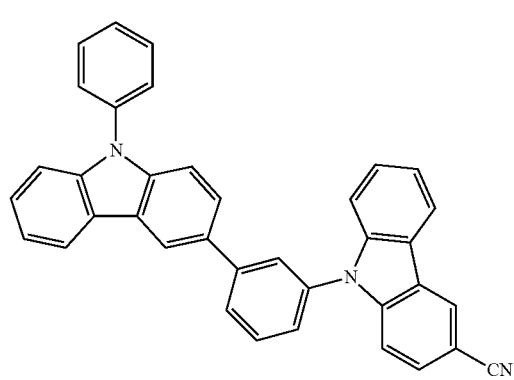
H1-12
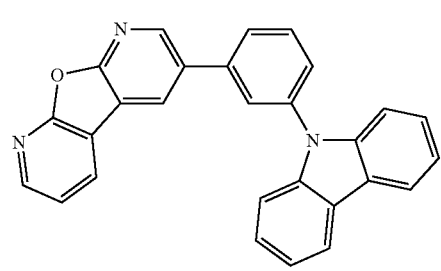
H1-13
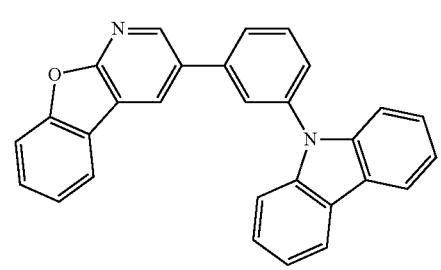
H1-14
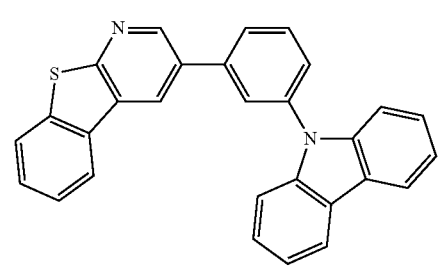
H1-15
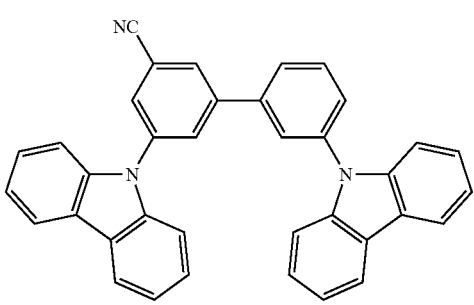
H1-16
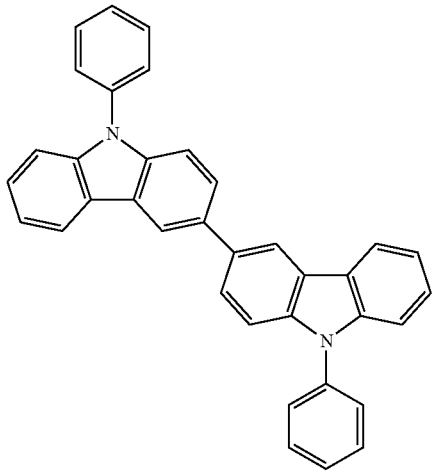
H1-17
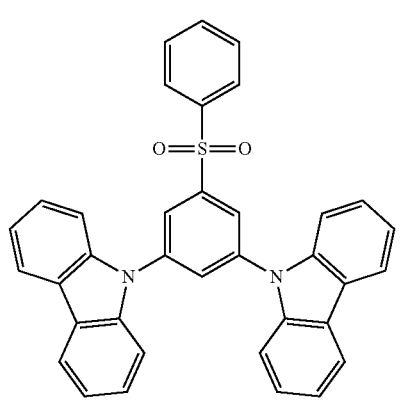
H1-18
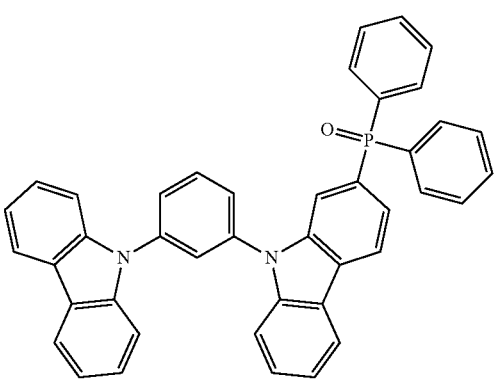
H1-19
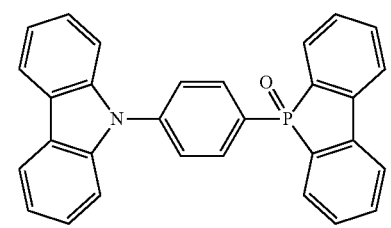
H1-20

H1-21
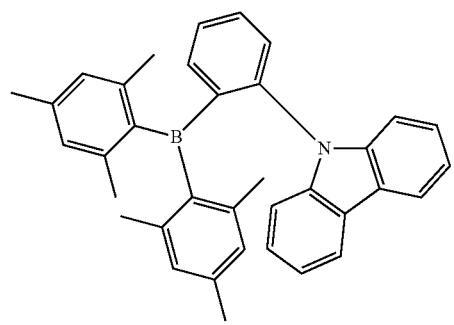
Compound Group 2
H2-1
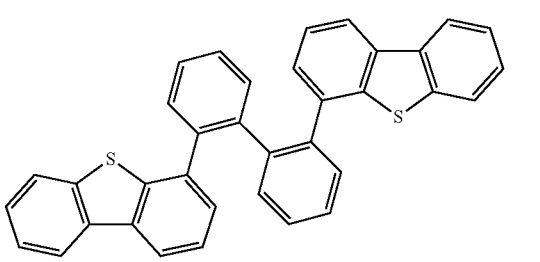
H1-22
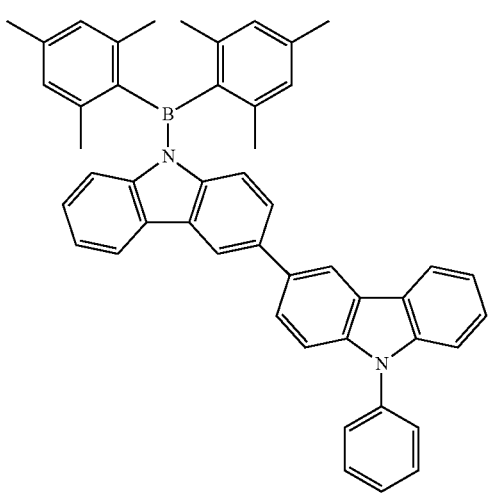
H2-2
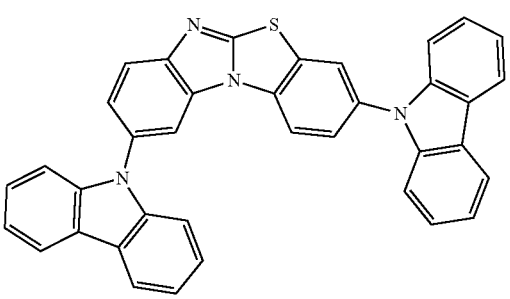
H2-5
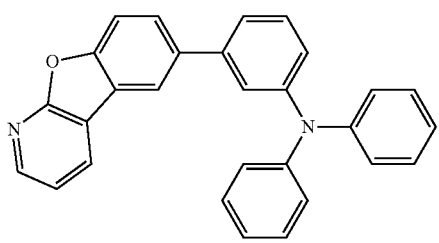
H1-23
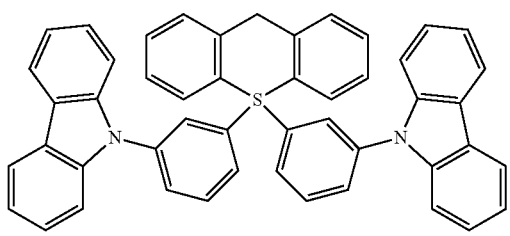
H2-11
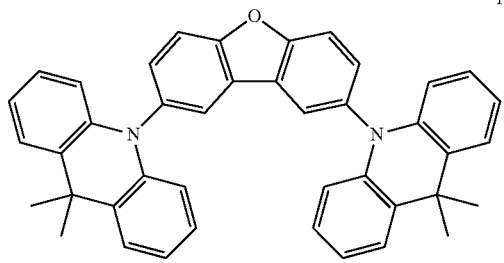
H1-24
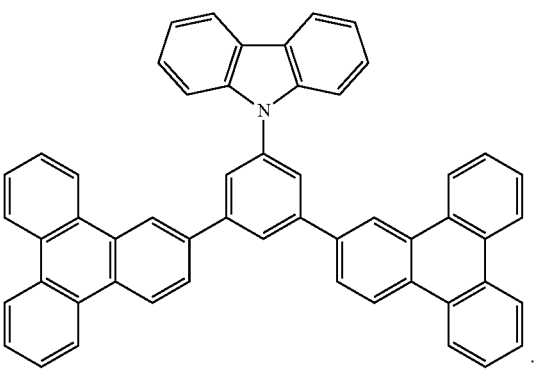
H2-18
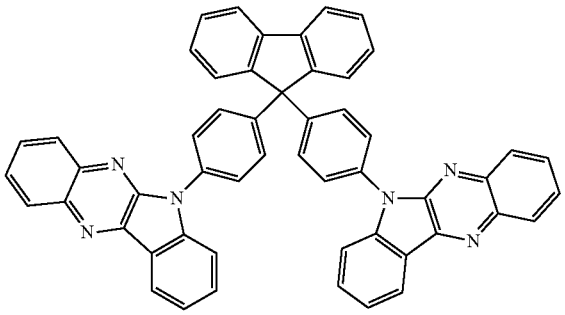

H2-19
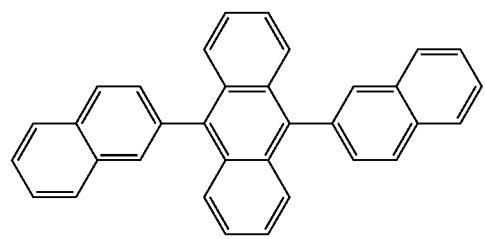
H2-22
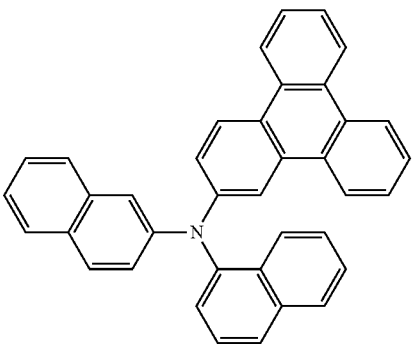
H2-20
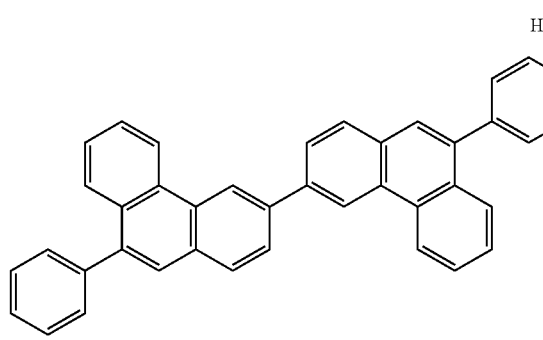
H2-23
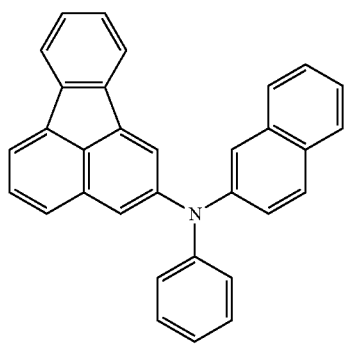
H2-21
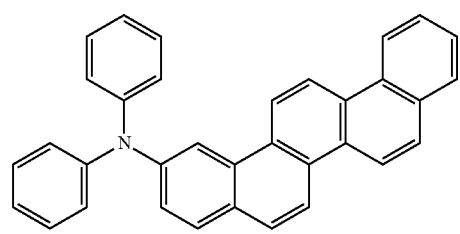
H2-24
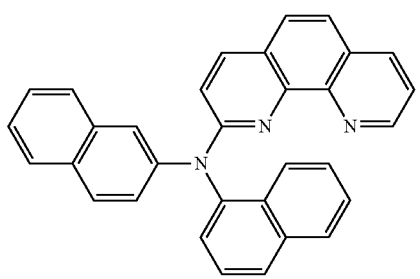
Compound Group 3
D1-1
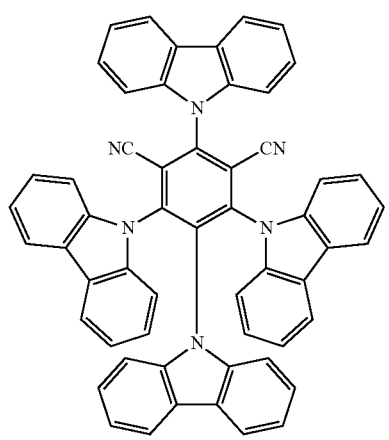
D1-2
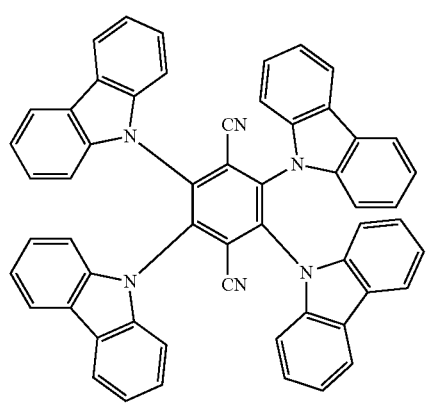

-continued
D1-3
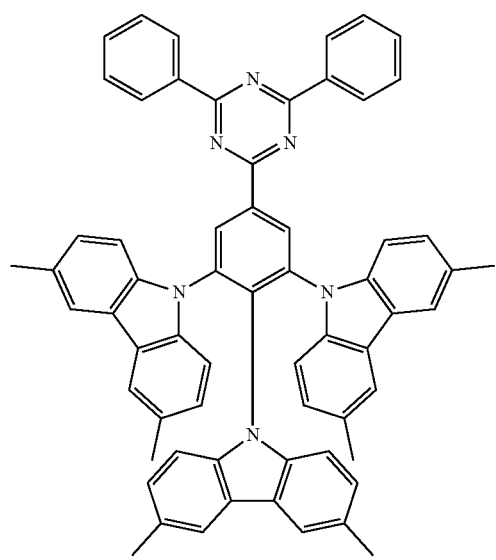
D1-4
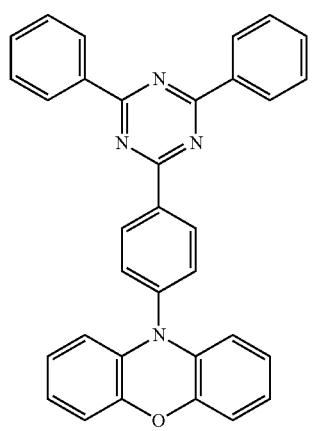
D1-5
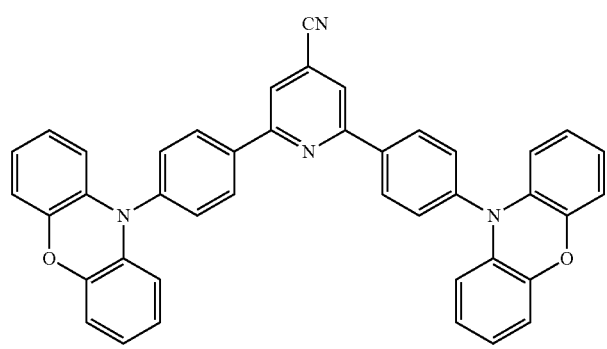
D1-6
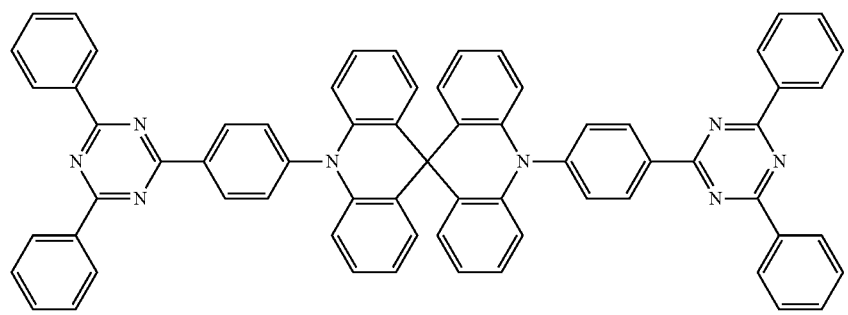
D1-7
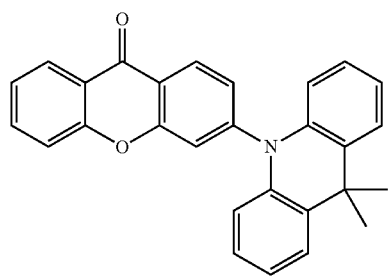

-continued
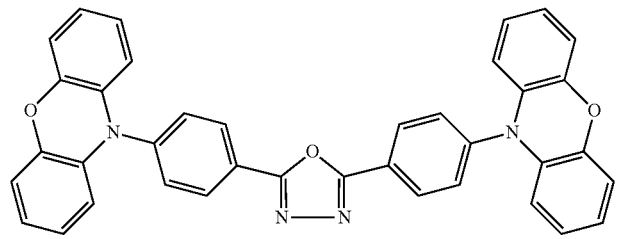
D1-8
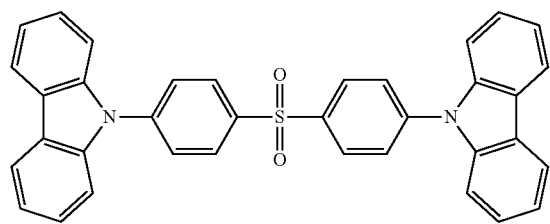
D1-9
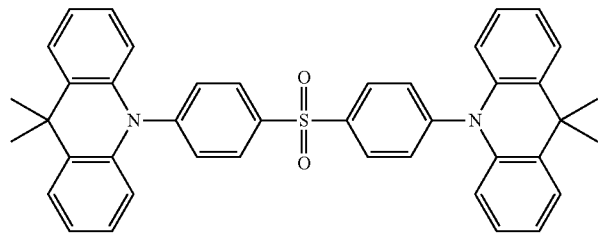
D1-10
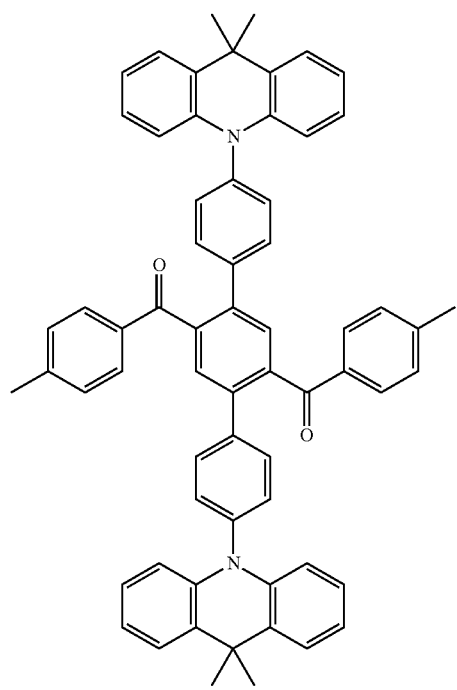
D1-11
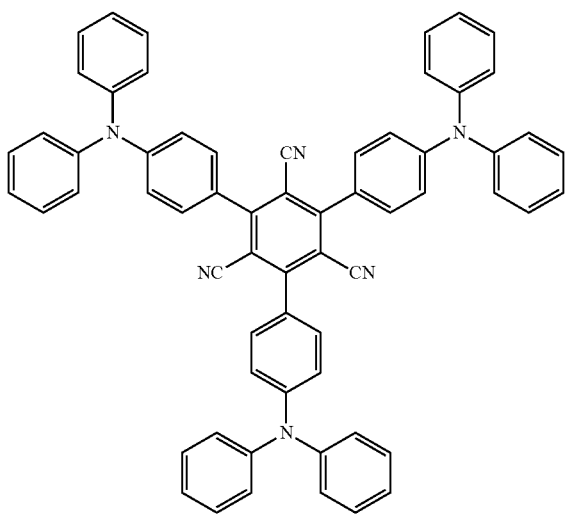
D1-12

D1-13
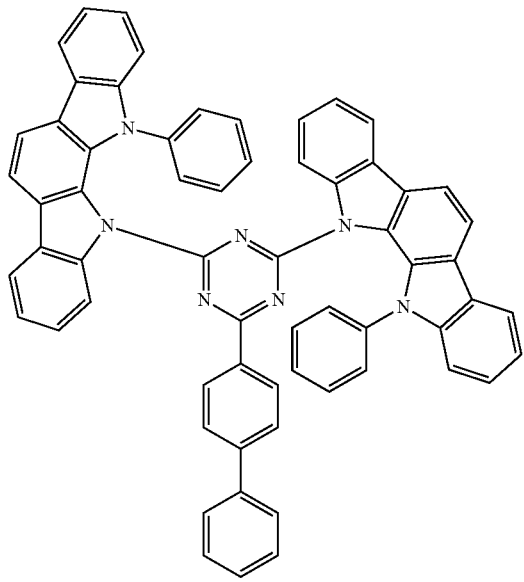
D1-14
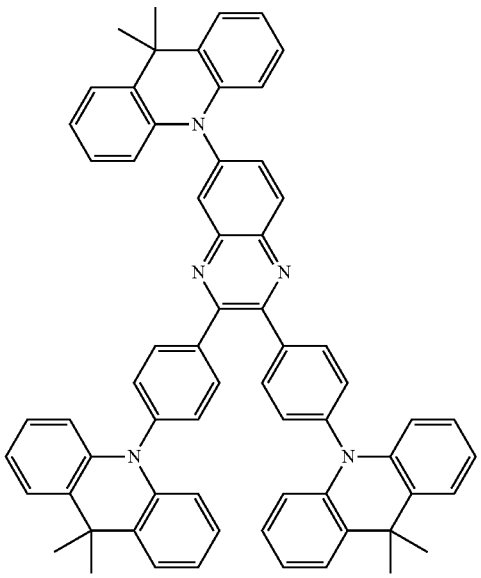
D1-15
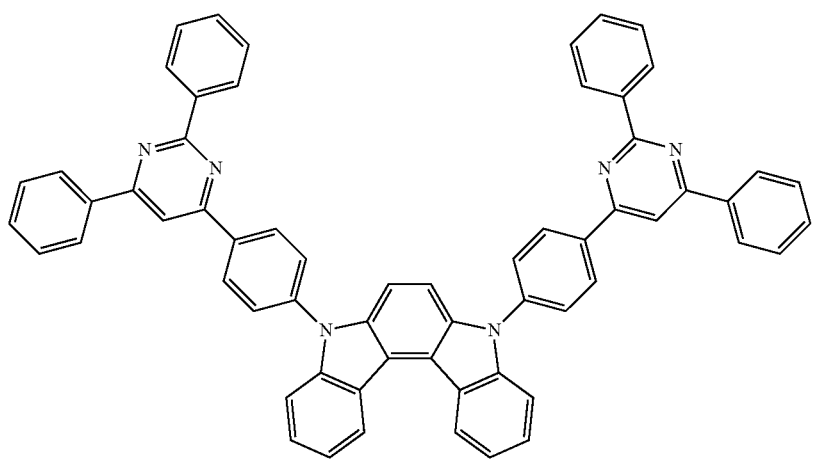
D1-16
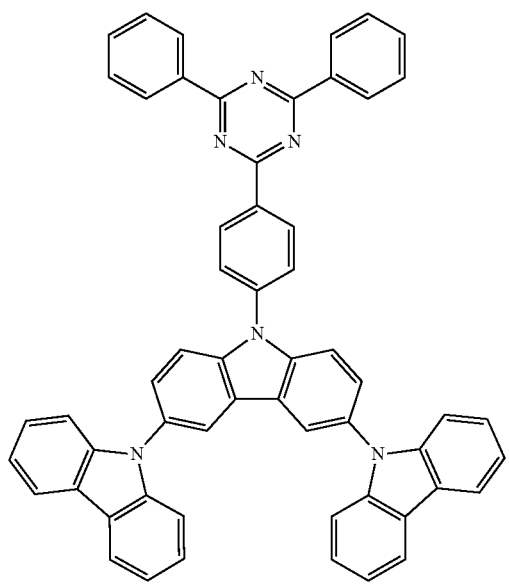
D1-17
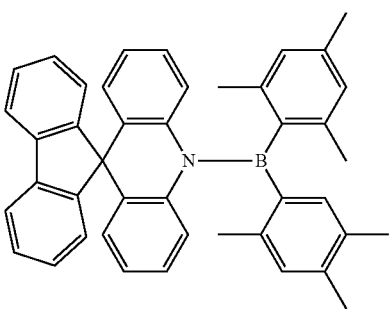

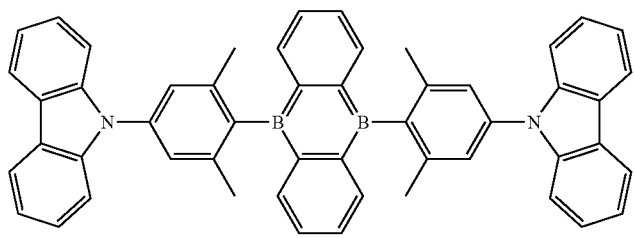
D1-18
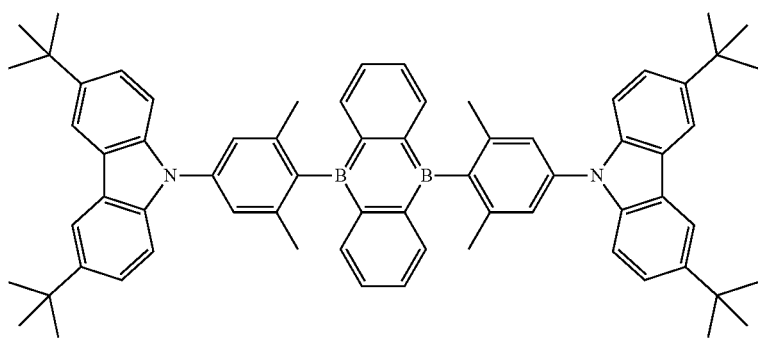
D1-19
Compound Group 4
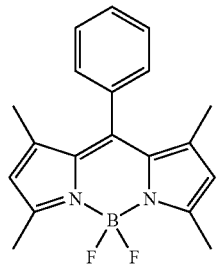
D2-1
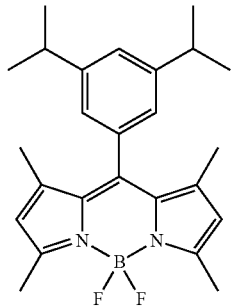
D2-2
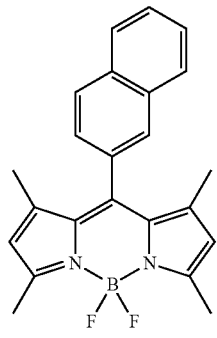
D2-3
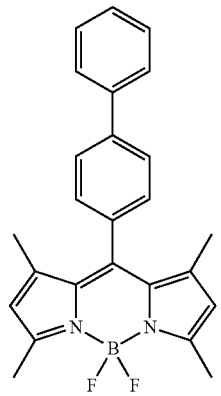
D2-4

-continued
| | |
|---|---|
| D2-5 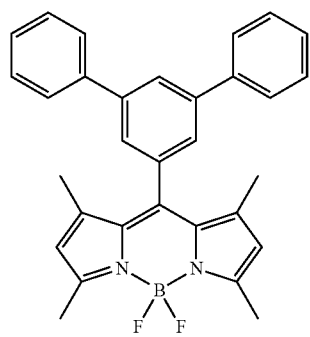 | D2-6 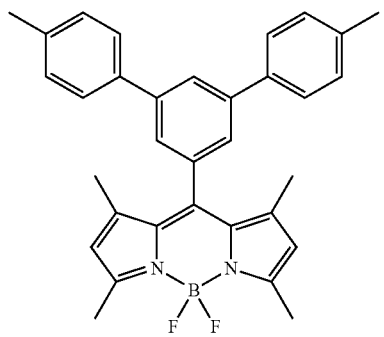 |
| D2-7 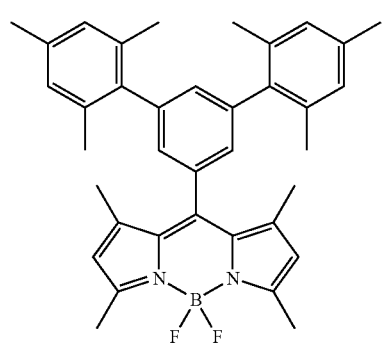 | D2-8 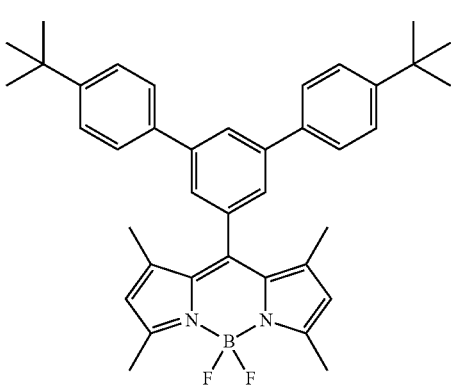 |
| D2-9 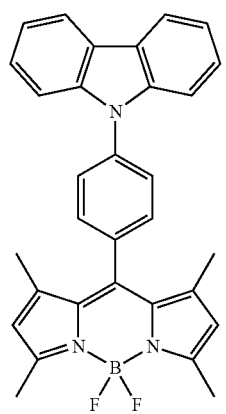 | D2-10 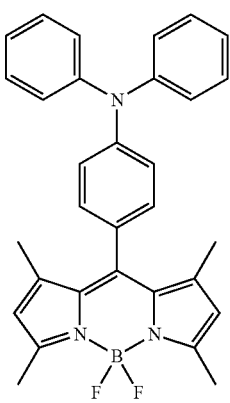 |
| D2-11 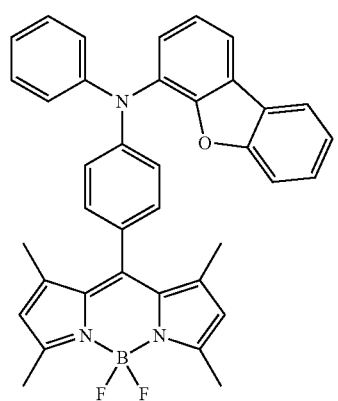 | D2-12 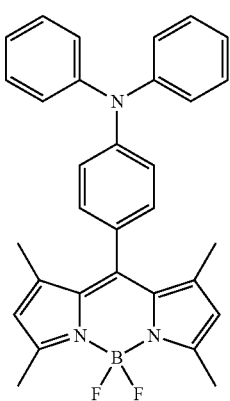 |

-continued
D2-13
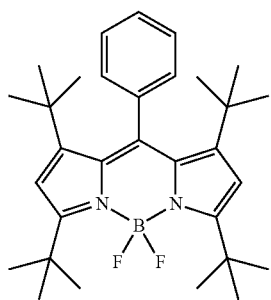
D2-14
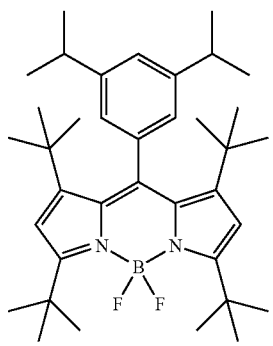
D2-15
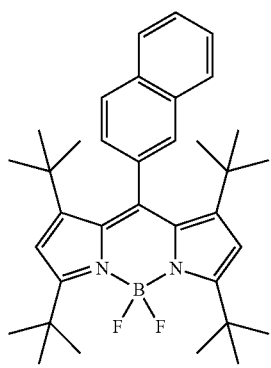
D2-16
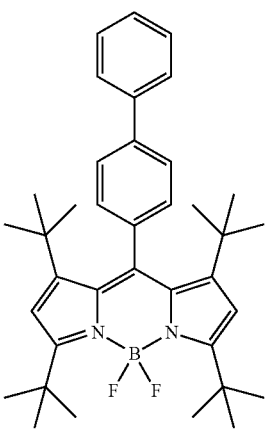
D2-17
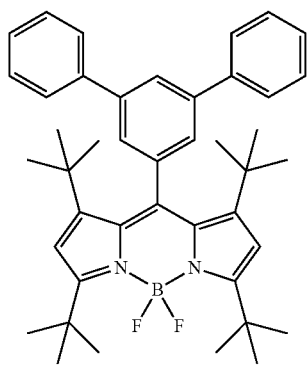
D2-18
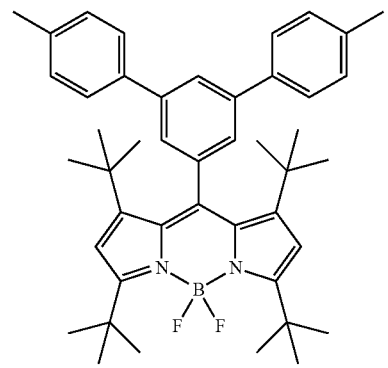
D2-19
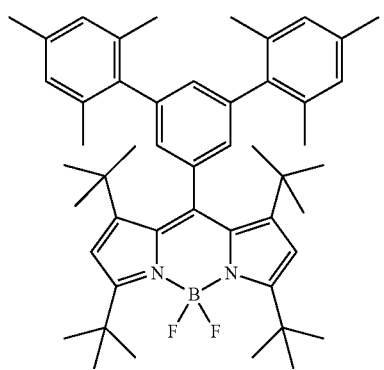
D2-20
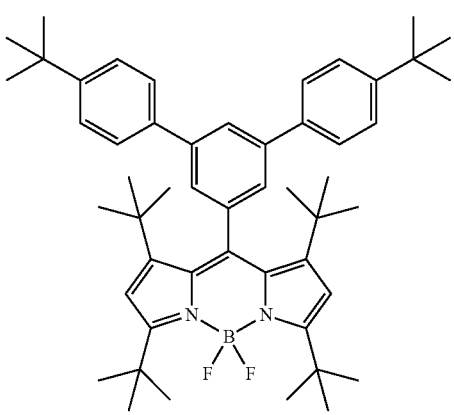

-continued
D2-21
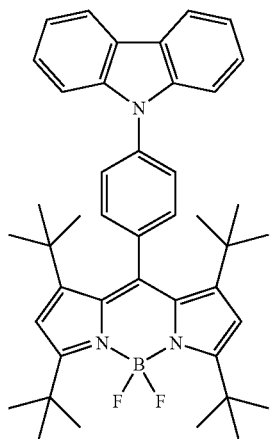
D2-22
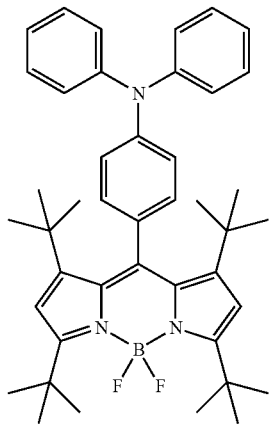
D2-23
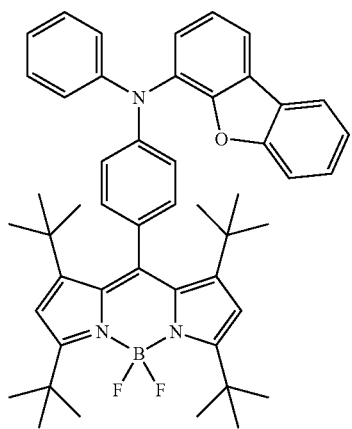
D2-24
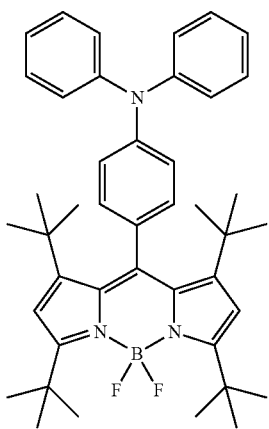
D2-25
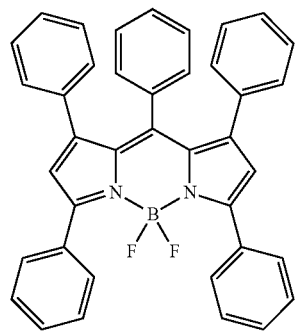
D2-26
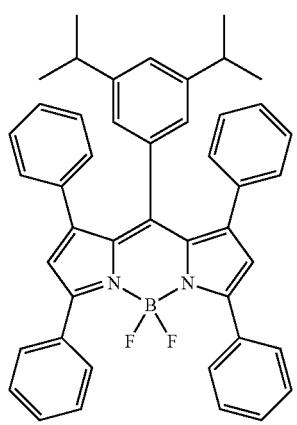

-continued
D2-27
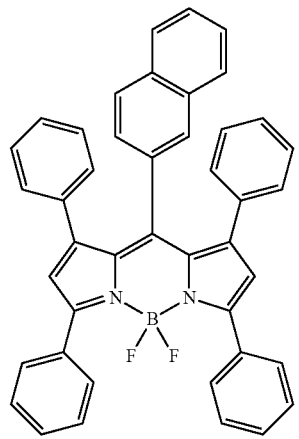
D2-28
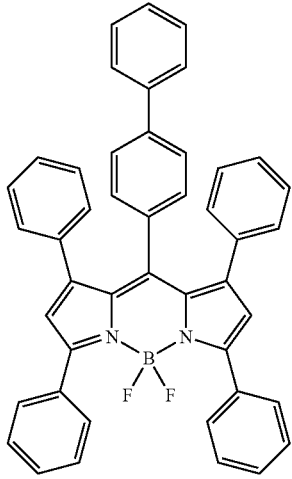
D2-29
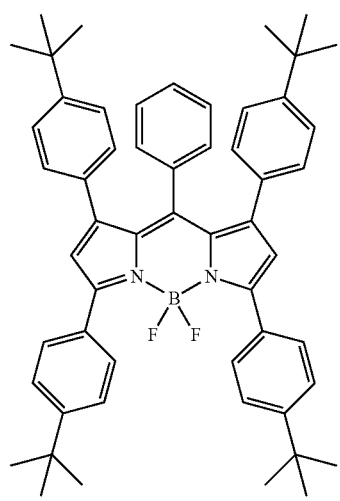
D2-30
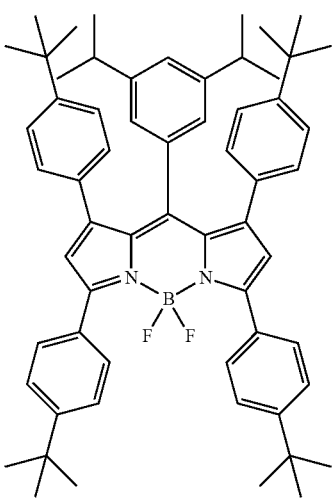
D2-31
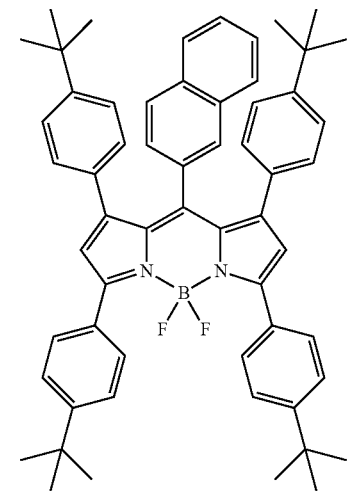
D2-32
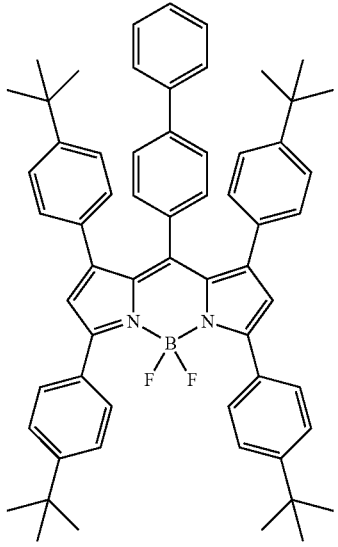

-continued
D2-33
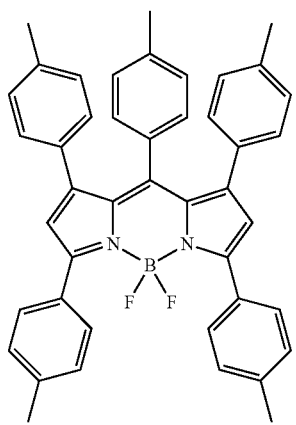
D2-34
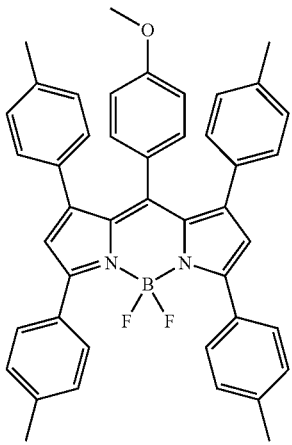
D2-35
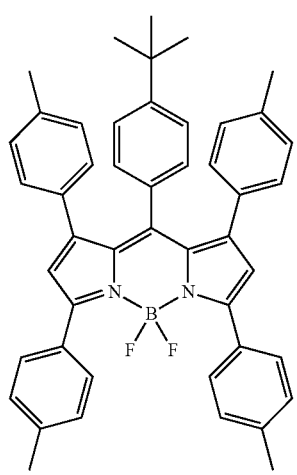
D2-36
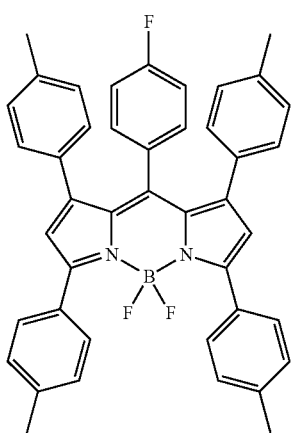
D2-37
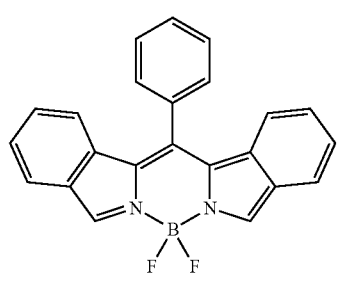
D2-38
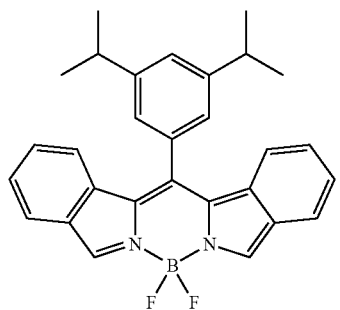
D2-39
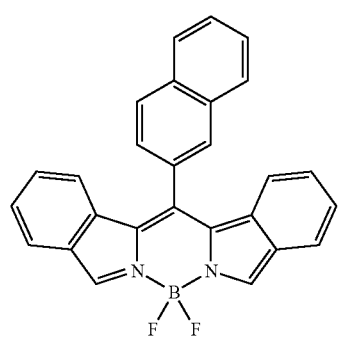
D2-40
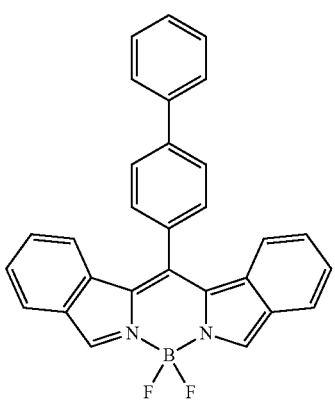

D2-41 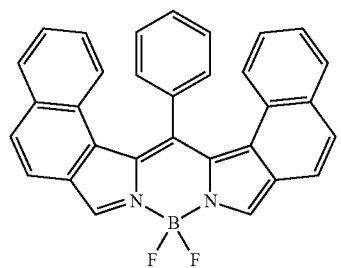
D2-42 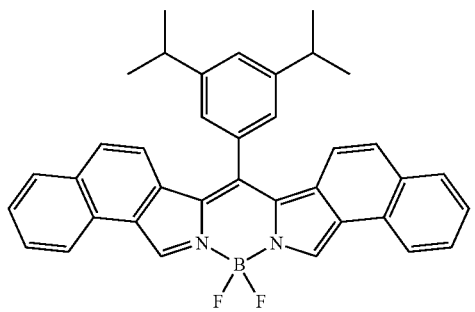
D2-43 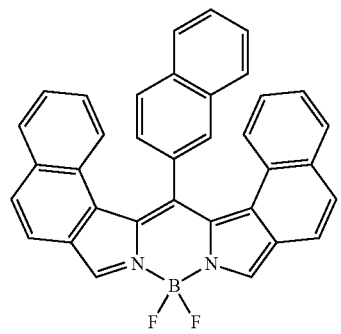
D2-44 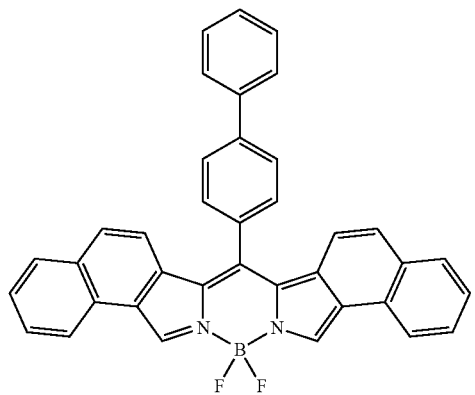
D2-45 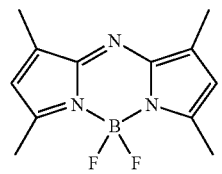
D2-46 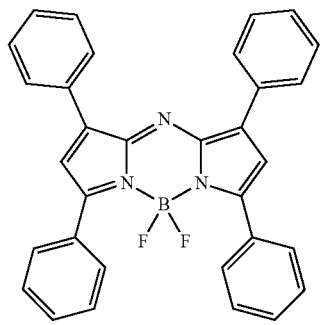
D2-47 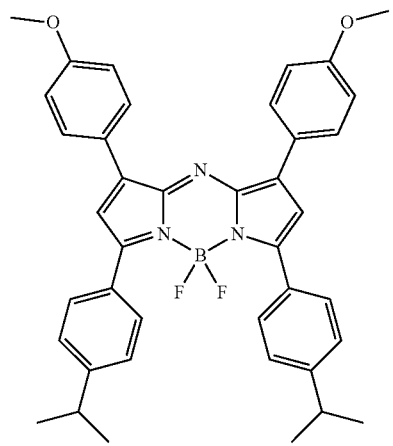
D2-48 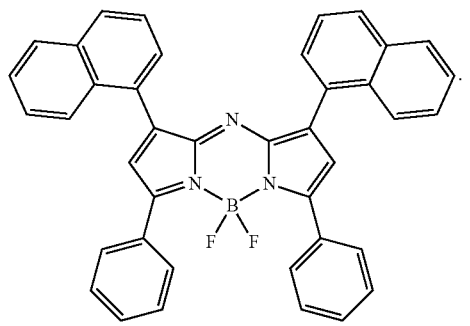

4. An electronic apparatus comprising a plurality of pixels which are separately arranged from each other,
wherein at least one of the pixels comprises:
a first electrode;
a hole transport region on the first electrode;
an emission layer on the first hole transport region;
an electron transport region on the emission layer; and
a second electrode on the electron transport region, and
the emission layer comprises:
a first host comprising at least one selected from compounds represented in the following Compound Group 1;
a second host comprising at least one selected from compounds represented in the following Compound Group 2;
a first dopant comprising at least one selected from compounds represented in the following Compound Group 3, which is a thermally activated delayed fluorescence material having an electron donor and an electron acceptor; and
a second dopant comprising at least one selected from compounds represented in the following Compound Group 4
wherein the electron donor of the first dopant has a negative (−) Hammett substituent constant (σ), and the electron acceptor of the first dopant has a positive (+) Hammett substituent constant (σ):

Compound Group 1

H1-1

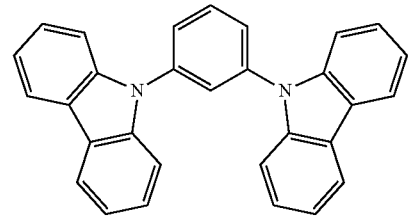

H1-2

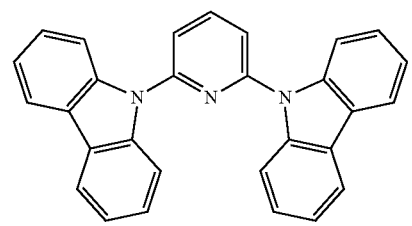

H1-3

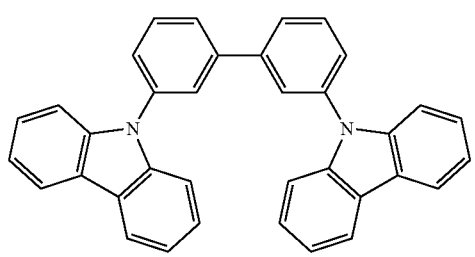

-continued

H1-4

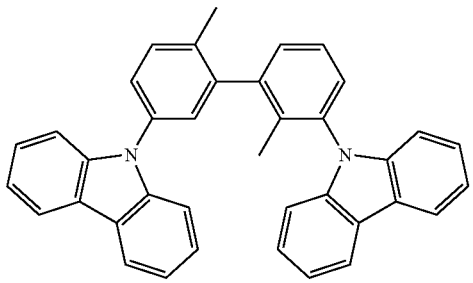

H1-5

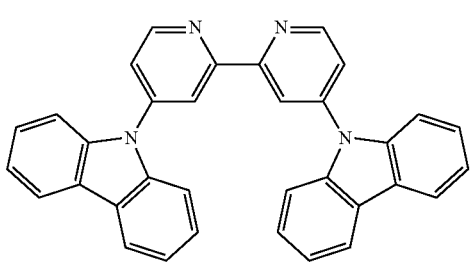

H1-6

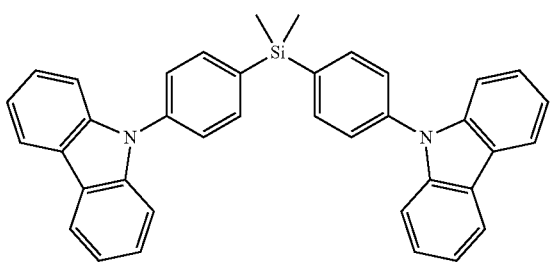

H1-7

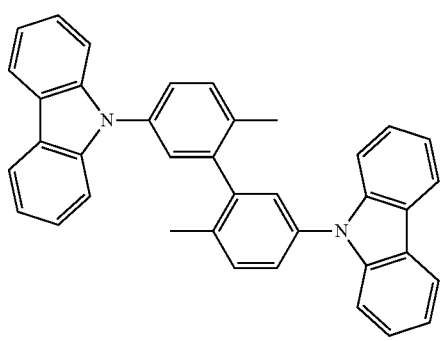

H1-8

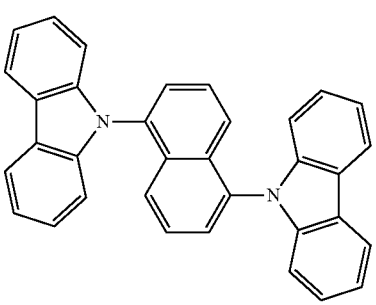

H1-9
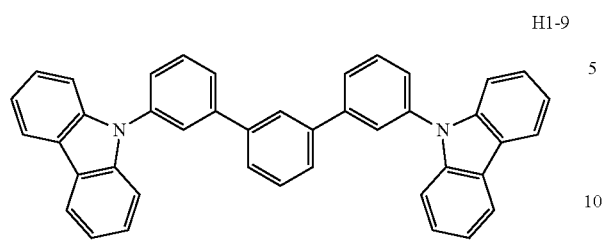
H1-10
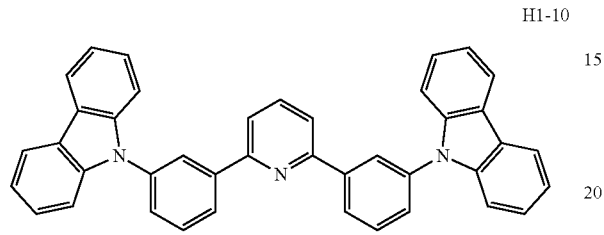
H1-11
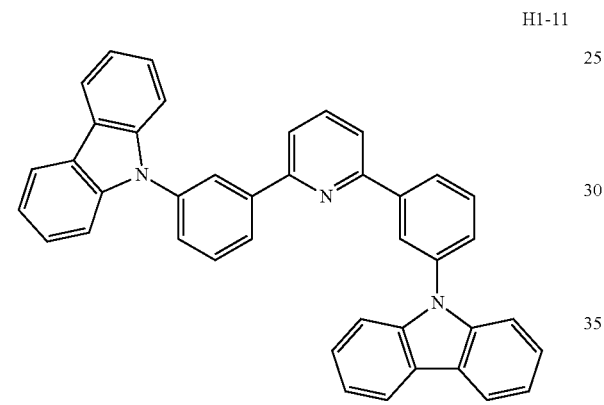
H1-12
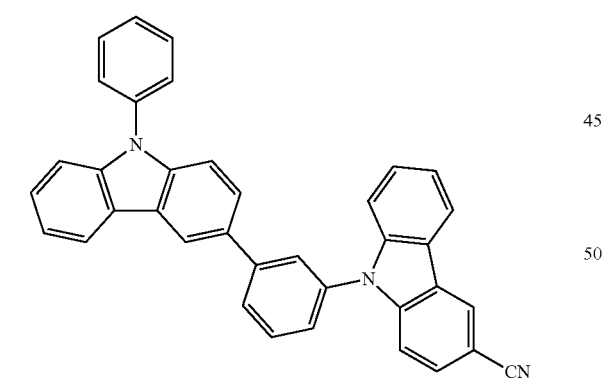
H1-13
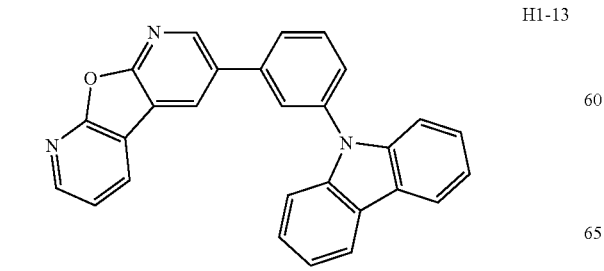
H1-14
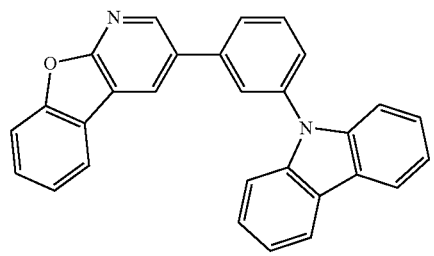
H1-15
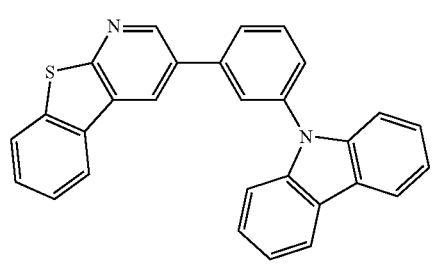
H1-16
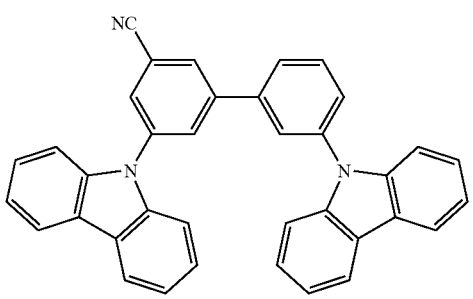
H1-17
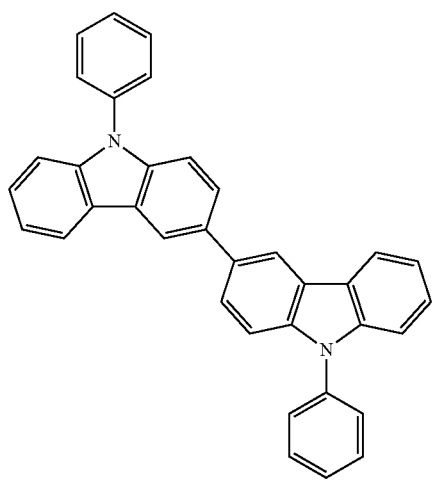

-continued
H1-18
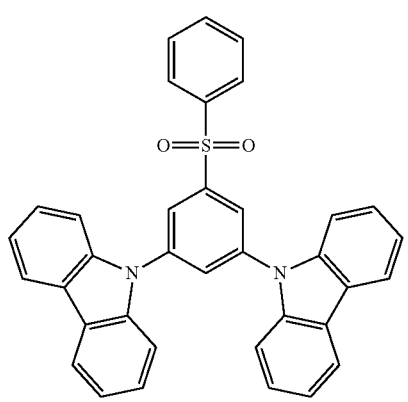
H1-19
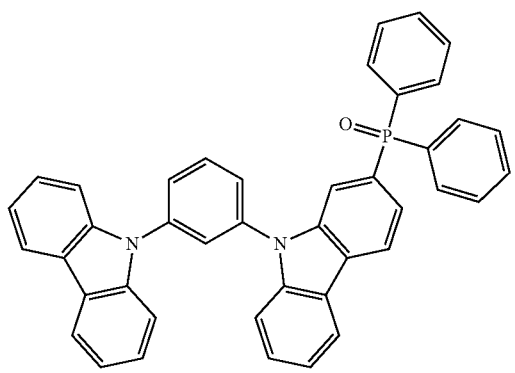
H1-20
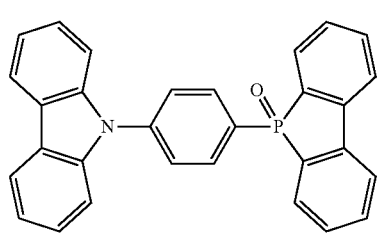
H1-21
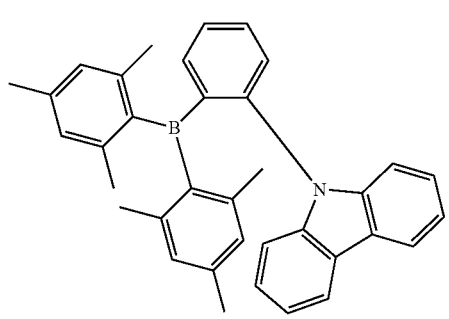
-continued
H1-22
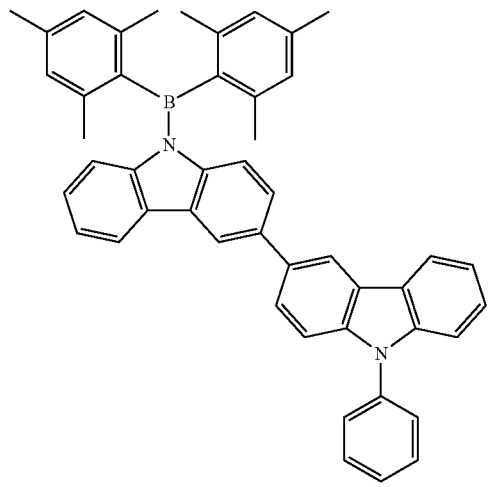
H1-23
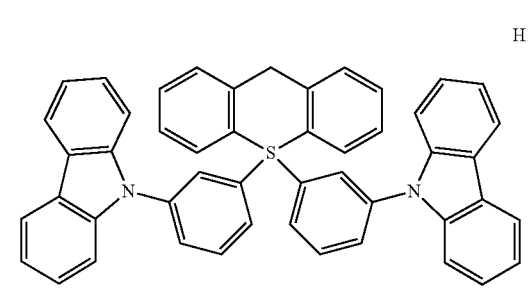
H1-24
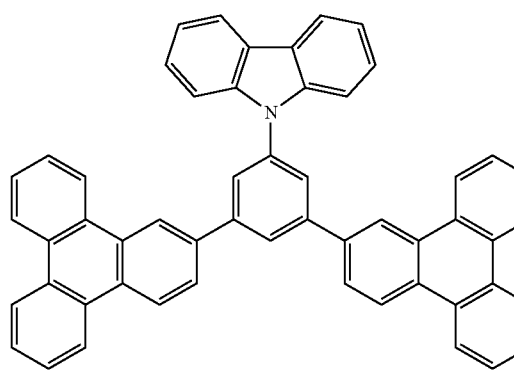
Compound Group 2
H2-1
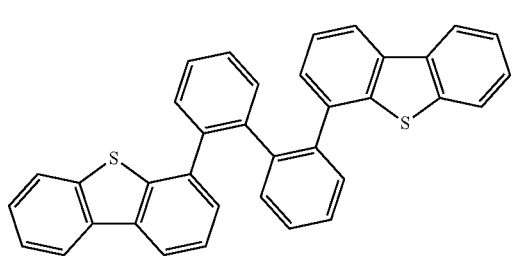

-continued
H2-2
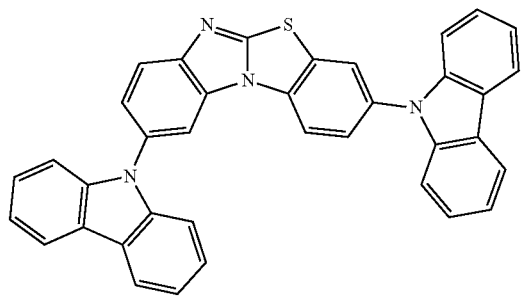
H2-3
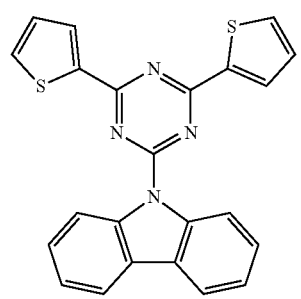
H2-5
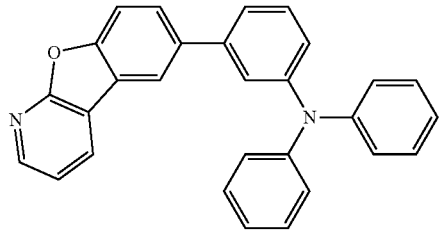
H2-11
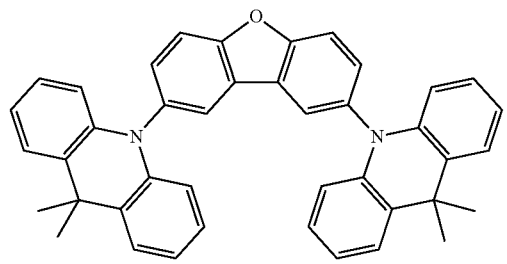
H2-18
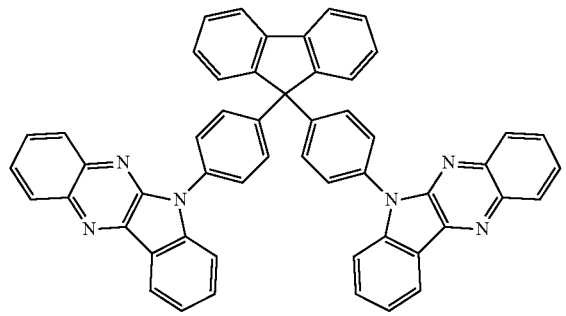
-continued
H2-19
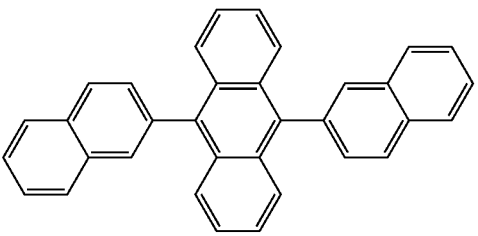
H2-10
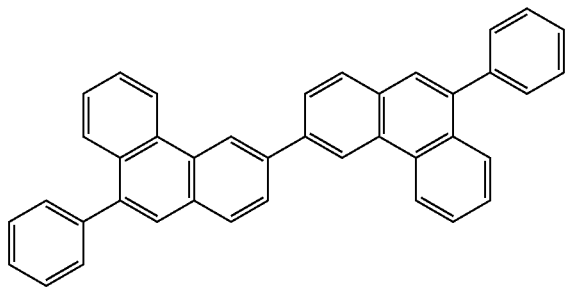
H2-21
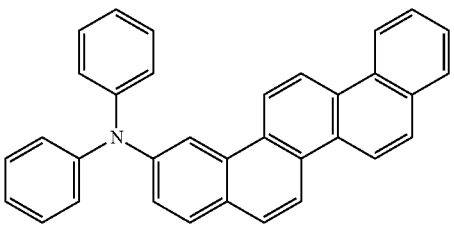
H2-22
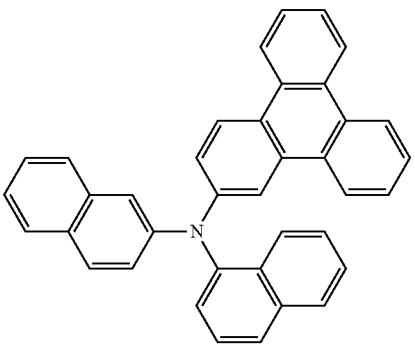
H2-23
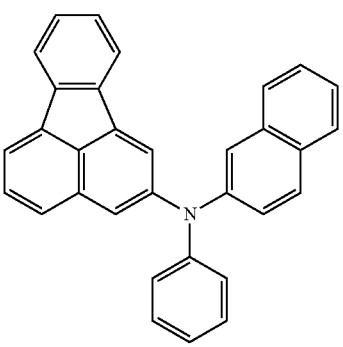

H2-24
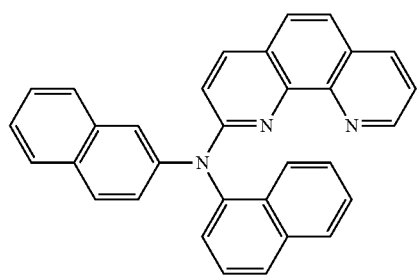
Compound Group 3
D1-1
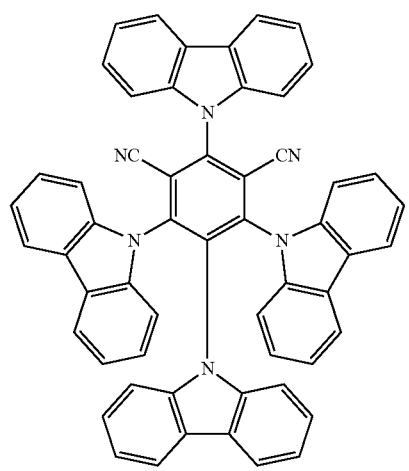
D1-2
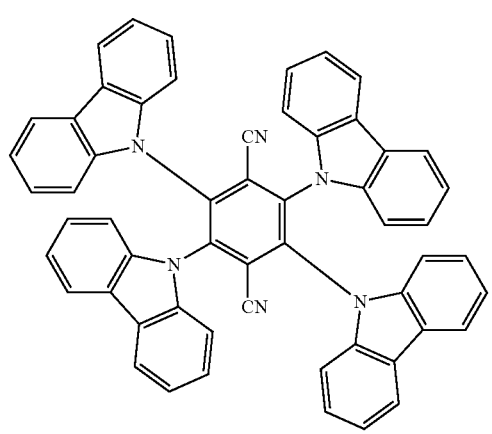
D1-3
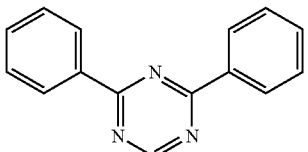
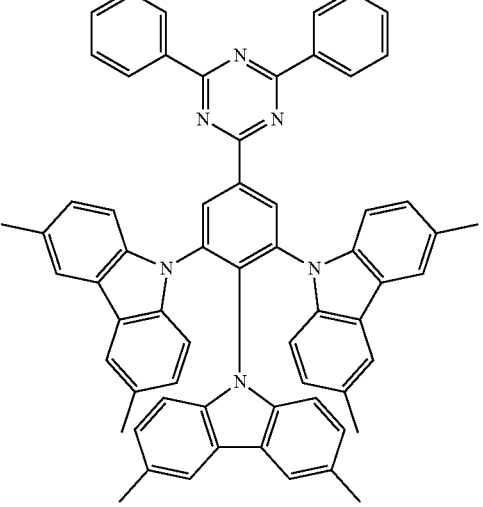
D1-5
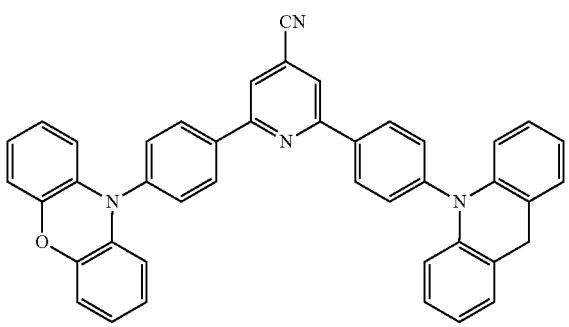
D1-6
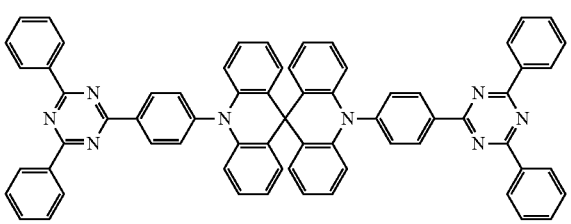
D1-7
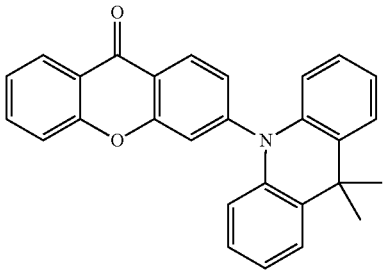
D1-8

D1-9
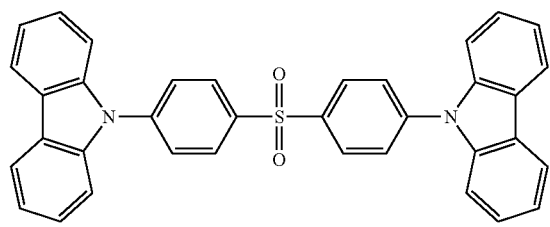
D1-10
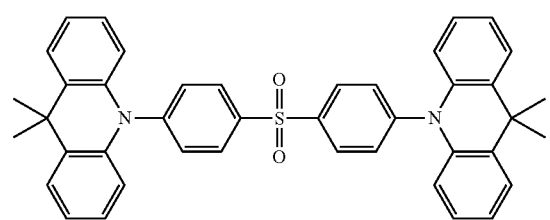
D1-11
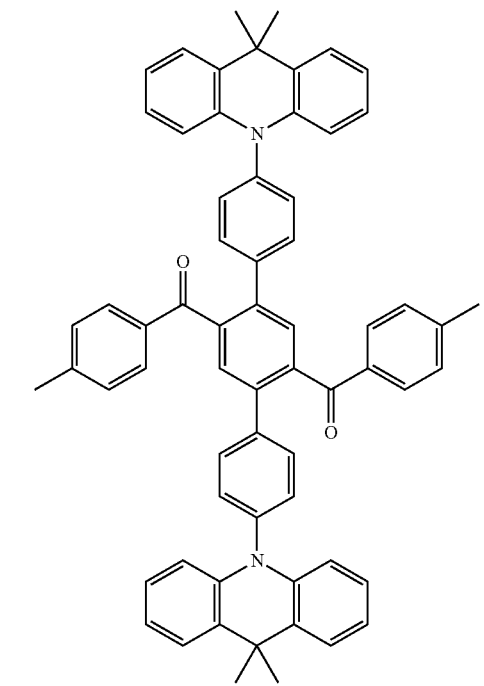
D1-12
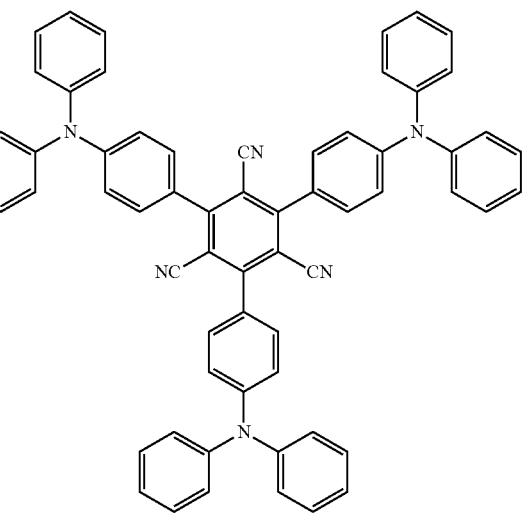
D1-14
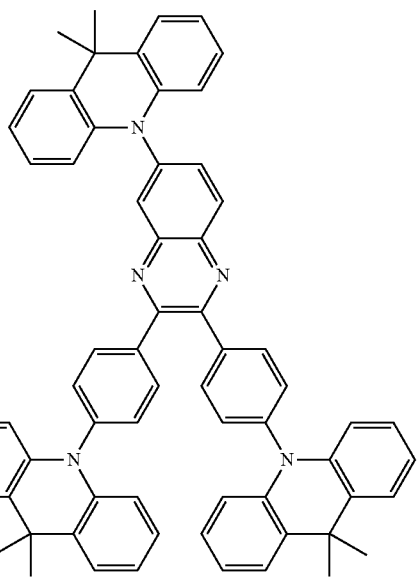
D1-15
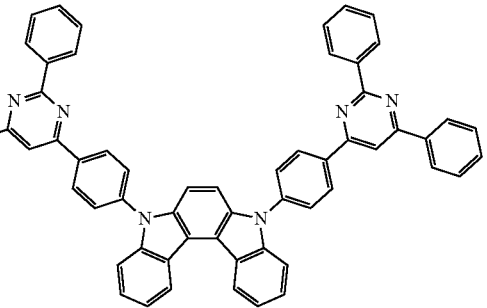

D1-16
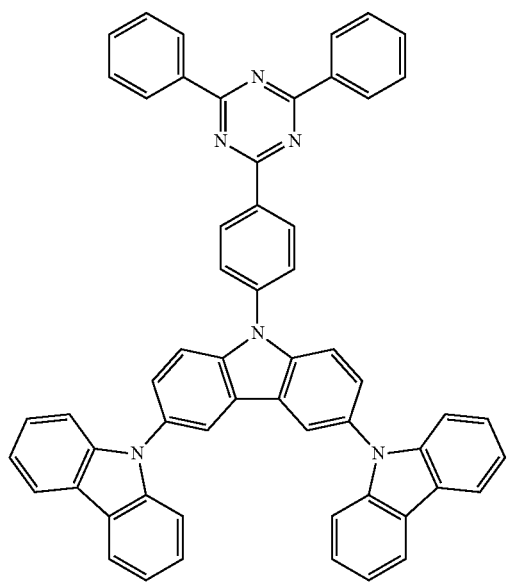
Compound Group 4
D2-1
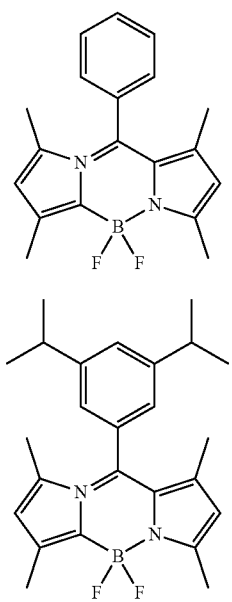
D2-2
D2-3
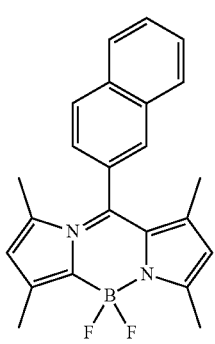
D2-4
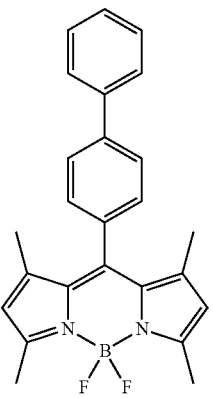
D2-5
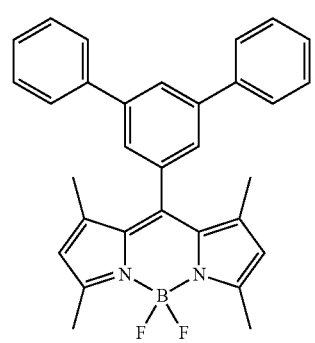
D2-6
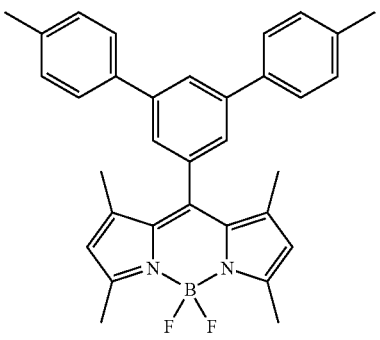
D2-7
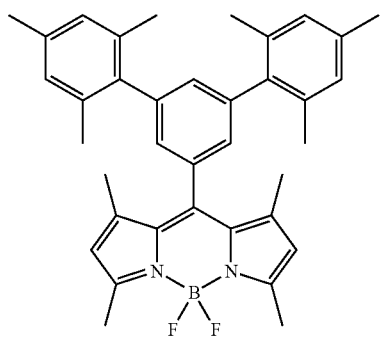

-continued
D2-8
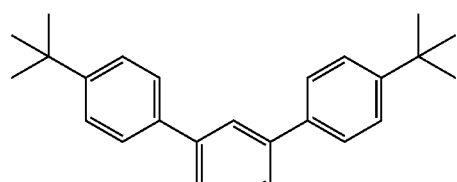
D2-9
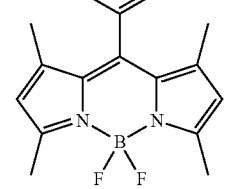
D2-10
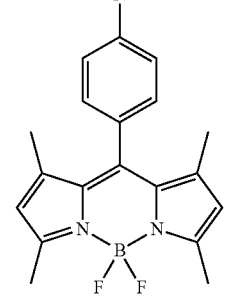
D2-11
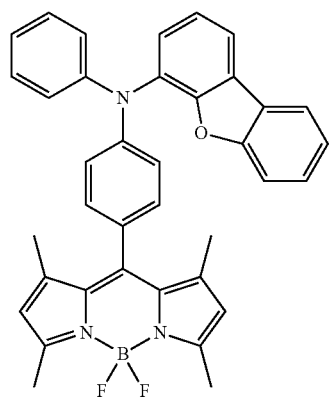
-continued
D2-12
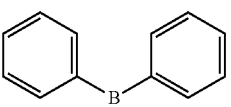
D2-13
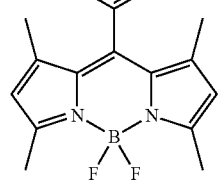
D2-14
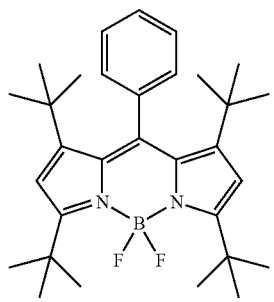
D2-15
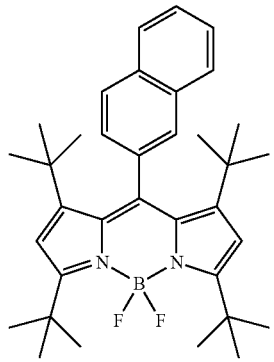

-continued
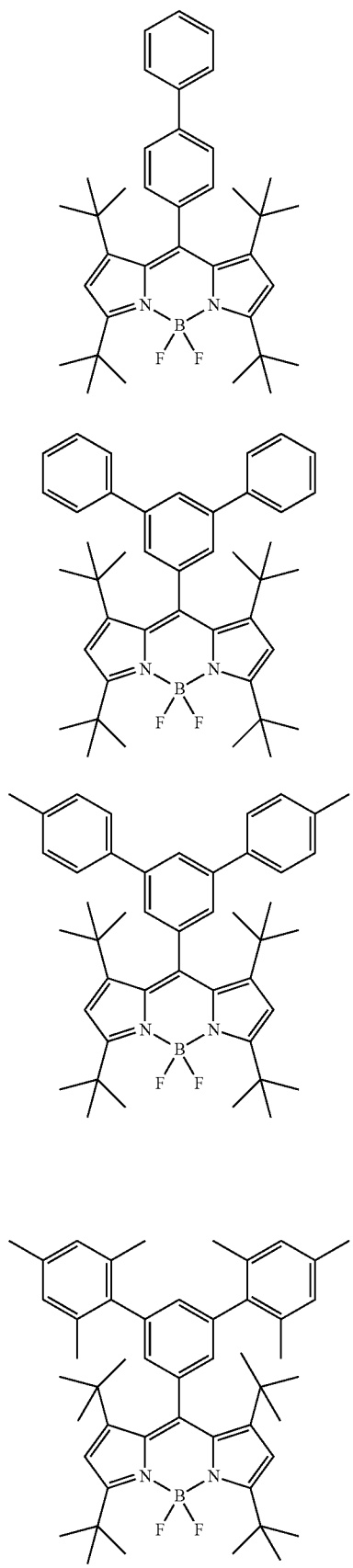
D2-16
D2-17
D2-18
D2-19
-continued
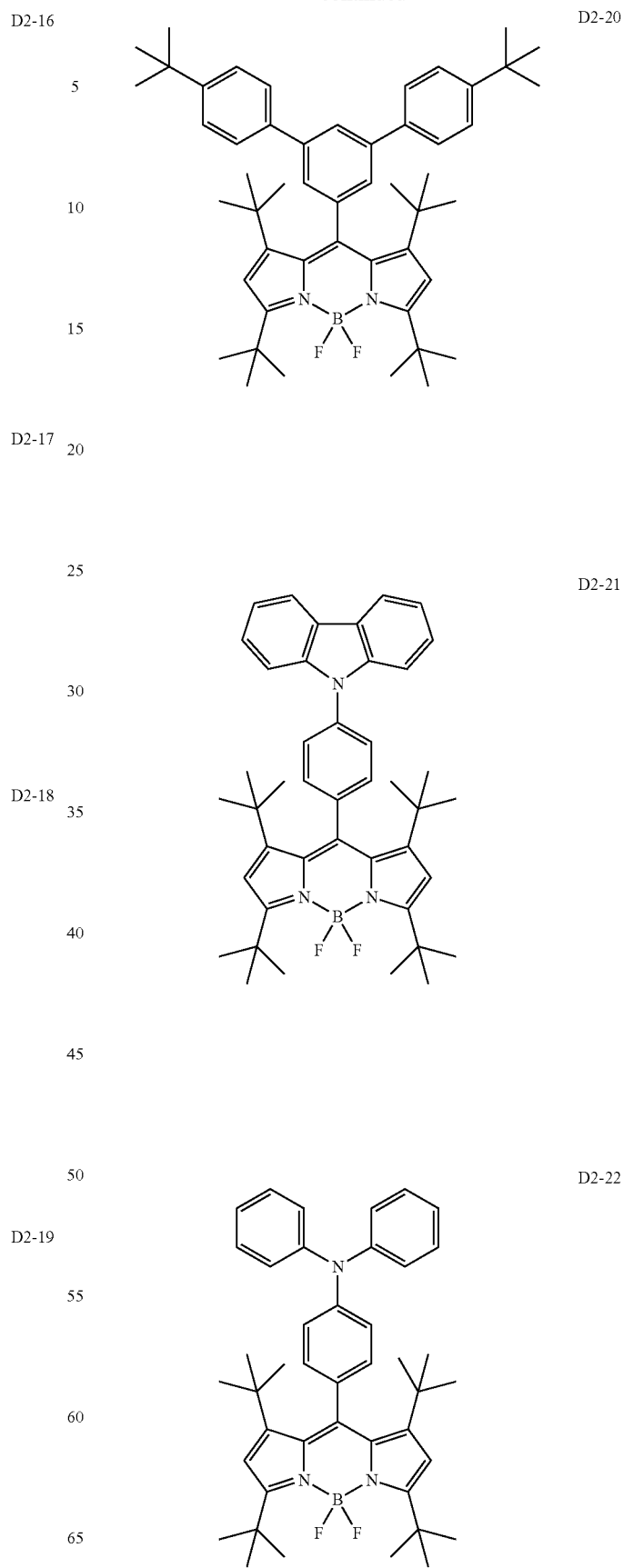
D2-20
D2-21
D2-22

D2-23
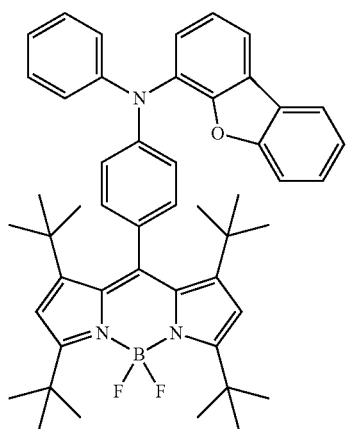
D2-24
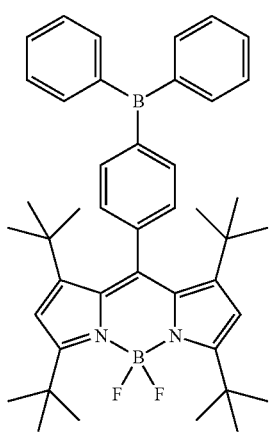
D2-25
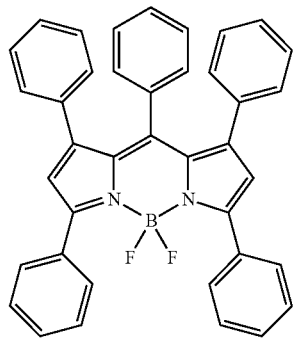
D2-26
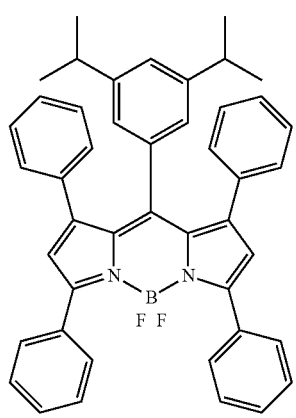
D2-27
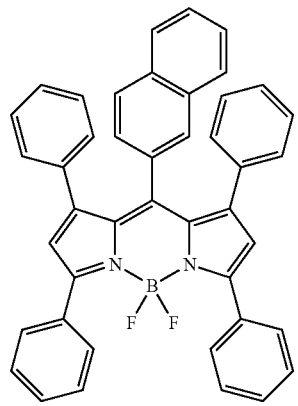
D2-28
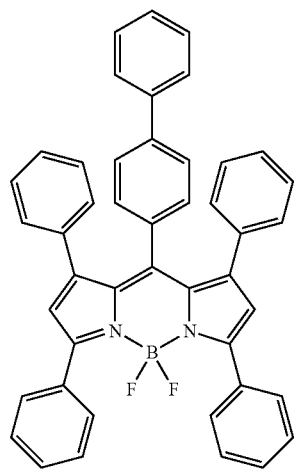
D2-29
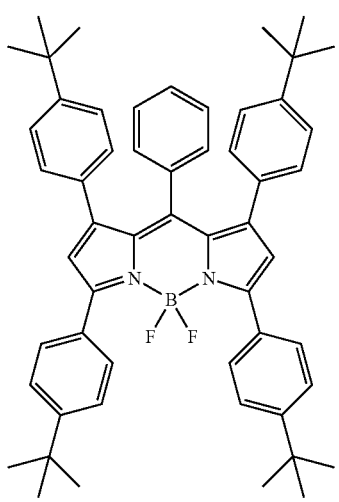

-continued
D2-30
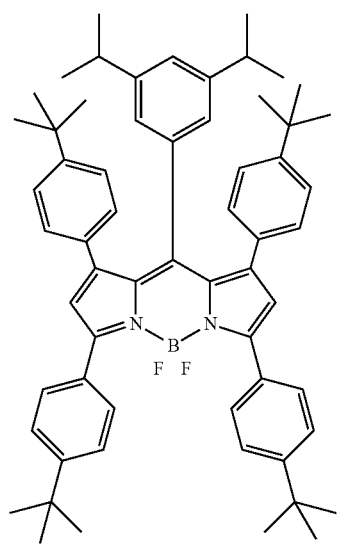
D2-31
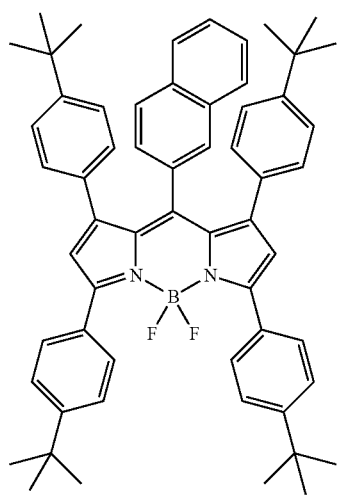
D2-32
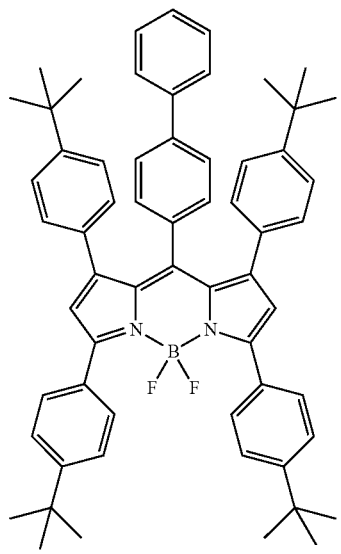
-continued
D2-33
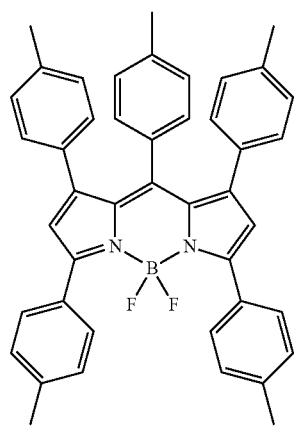
D2-34
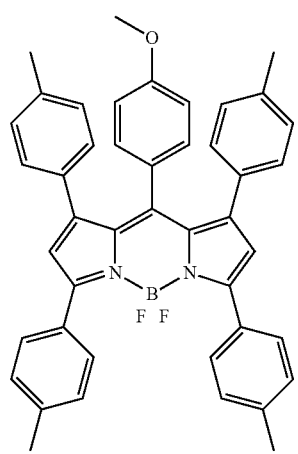
D2-35
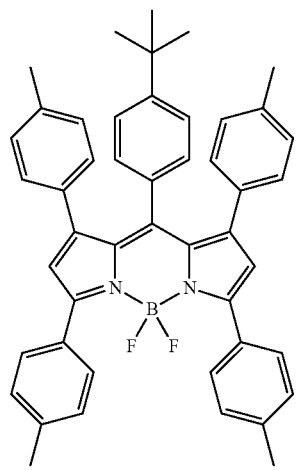

-continued
D2-36
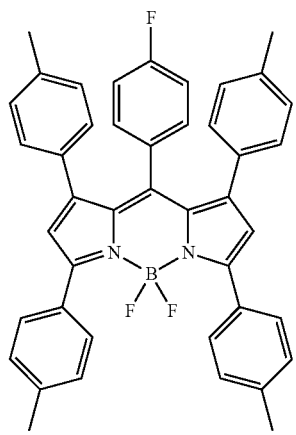
D2-37
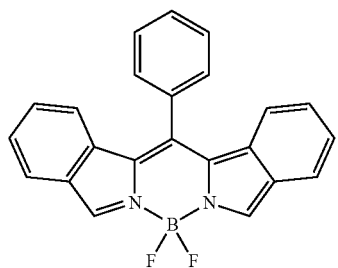
D2-38
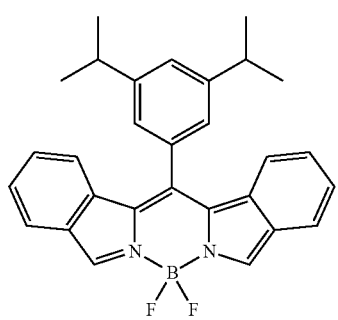
D2-39
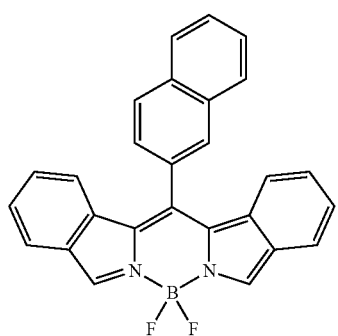
-continued
D2-40
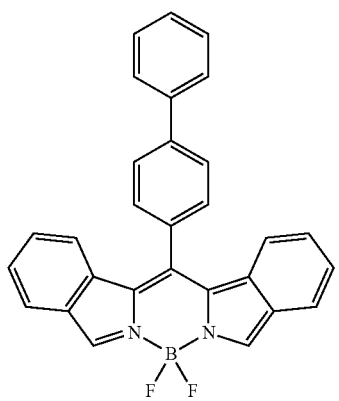
D2-41
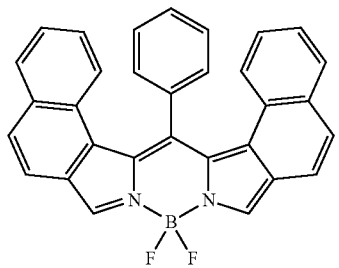
D2-42
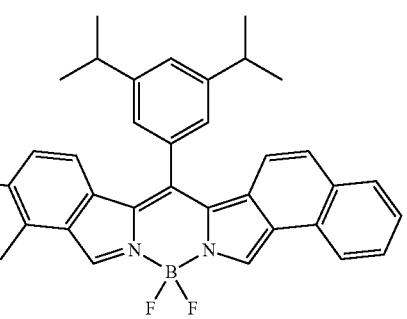
D2-43
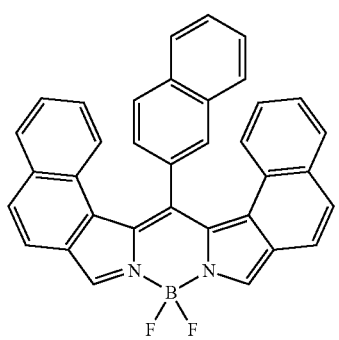

D2-44
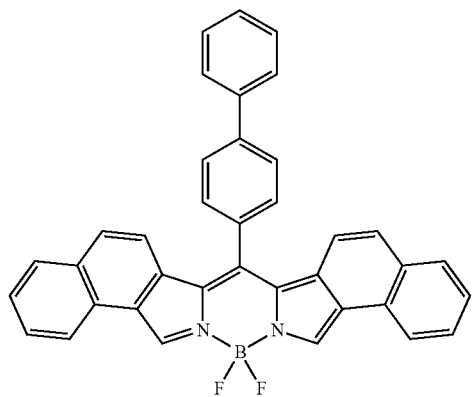
D2-45
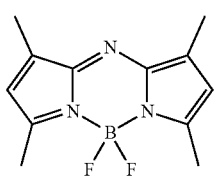
D2-46
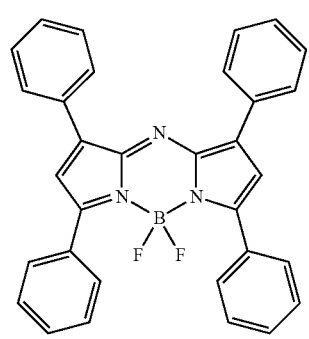
D2-47
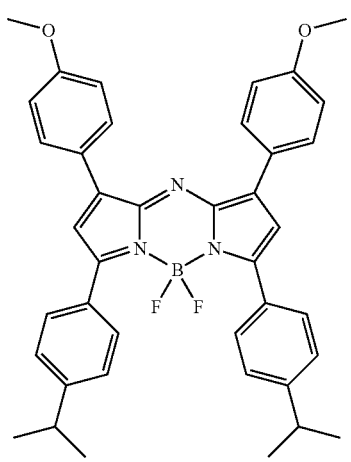
D2-48
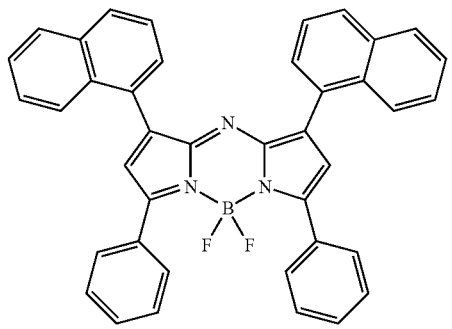
H2-1
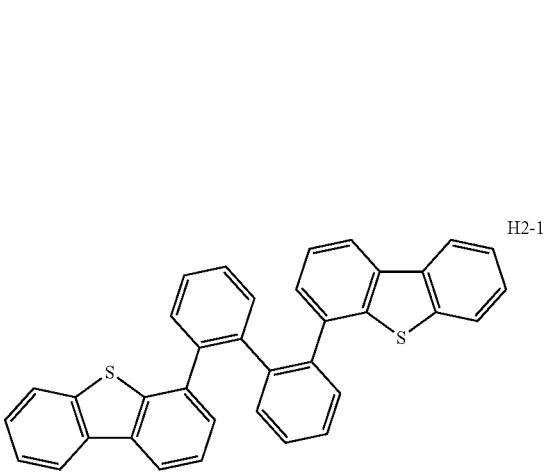
H2-2
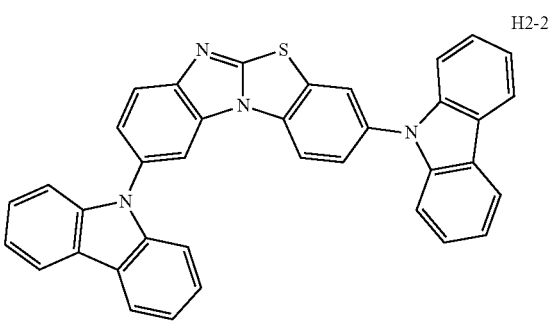
* * * * *